US011018436B2

(12) United States Patent
Mahanfar et al.

(10) Patent No.: US 11,018,436 B2
(45) Date of Patent: May 25, 2021

(54) ANTENNA MODULES FOR PHASED ARRAY ANTENNAS

(71) Applicant: Space Exploration Technologies Corp., Hawthorne, CA (US)

(72) Inventors: Alireza Mahanfar, Redmond, WA (US); Souren Shamsinejad, Redmond, WA (US); Shaya Karimkashi Arani, Redmond, WA (US); Siamak Ebadi, Redmond, WA (US); Ersin Yetisir, Redmond, WA (US); Peter Sung Tri Hoang, Redmond, WA (US); Javier Rodriguez De Luis, Redmond, WA (US); Nil Apaydin, Redmond, WA (US)

(73) Assignee: Space Exploration Technologies Corp., Hawthorne, CA (US)

( * ) Notice: Subject to any disclaimer, the term of this patent is extended or adjusted under 35 U.S.C. 154(b) by 37 days.

(21) Appl. No.: 16/276,401

(22) Filed: Feb. 14, 2019

(65) Prior Publication Data

US 2019/0252796 A1 Aug. 15, 2019

Related U.S. Application Data

(60) Provisional application No. 62/631,708, filed on Feb. 17, 2018, provisional application No. 62/631,195, filed on Feb. 15, 2018.

(51) Int. Cl.
*H01Q 21/00* (2006.01)
*H01Q 3/26* (2006.01)
*H01Q 1/24* (2006.01)
*H05K 1/18* (2006.01)

(52) U.S. Cl.
CPC ............ *H01Q 21/0025* (2013.01); *H01Q 1/24* (2013.01); *H01Q 3/26* (2013.01); *H05K 1/181* (2013.01)

(58) Field of Classification Search
None
See application file for complete search history.

(56) References Cited

U.S. PATENT DOCUMENTS

| 5,122,806 | A | 6/1992 | Julian |
| 7,466,287 | B1 | 12/2008 | Lam et al. |
| 9,379,437 | B1 | 6/2016 | Stutzke et al. |
| 2003/0020173 | A1 | 1/2003 | Huff et al. |
| 2003/0076274 | A1 | 4/2003 | Phelan et al. |
| 2003/0151550 | A1 | 8/2003 | Chen et al. |

(Continued)

OTHER PUBLICATIONS

International Search Report and Written Opinion dated Jun. 7, 2019, issued in corresponding International Application No. PCT/US2019/018064, filed Feb. 14, 2019, 11 pages.

(Continued)

*Primary Examiner* — Jany Richardson
(74) *Attorney, Agent, or Firm* — Polsinelli PC

(57) ABSTRACT

In some embodiments, an antenna module includes an antenna element having a first side and a second side opposite the first side; a spacer structure disposed at the second side of the antenna element and configured to define a cavity, the spacer structure configured to be physically and electrically couplable with a printed circuit board (PCB) of a receiver or a transmitter; and an amplifier located within the cavity. The first side comprises a radiating side of the antenna element.

22 Claims, 44 Drawing Sheets

(56) References Cited

U.S. PATENT DOCUMENTS

| | | |
|---|---|---|
| 2003/0184476 A1 | 10/2003 | Sikina et al. |
| 2008/0291101 A1 | 11/2008 | Braunstein et al. |
| 2008/0297414 A1 | 12/2008 | Krishnaswamy et al. |
| 2015/0381229 A1 | 12/2015 | Tzanidis et al. |
| 2016/0336646 A1* | 11/2016 | Baek ............ H01Q 1/243 |

OTHER PUBLICATIONS

Search Report and Written Opinion, Application No. PCT/US2019/018088, dated Jun. 5, 2019, 19 pages.

* cited by examiner

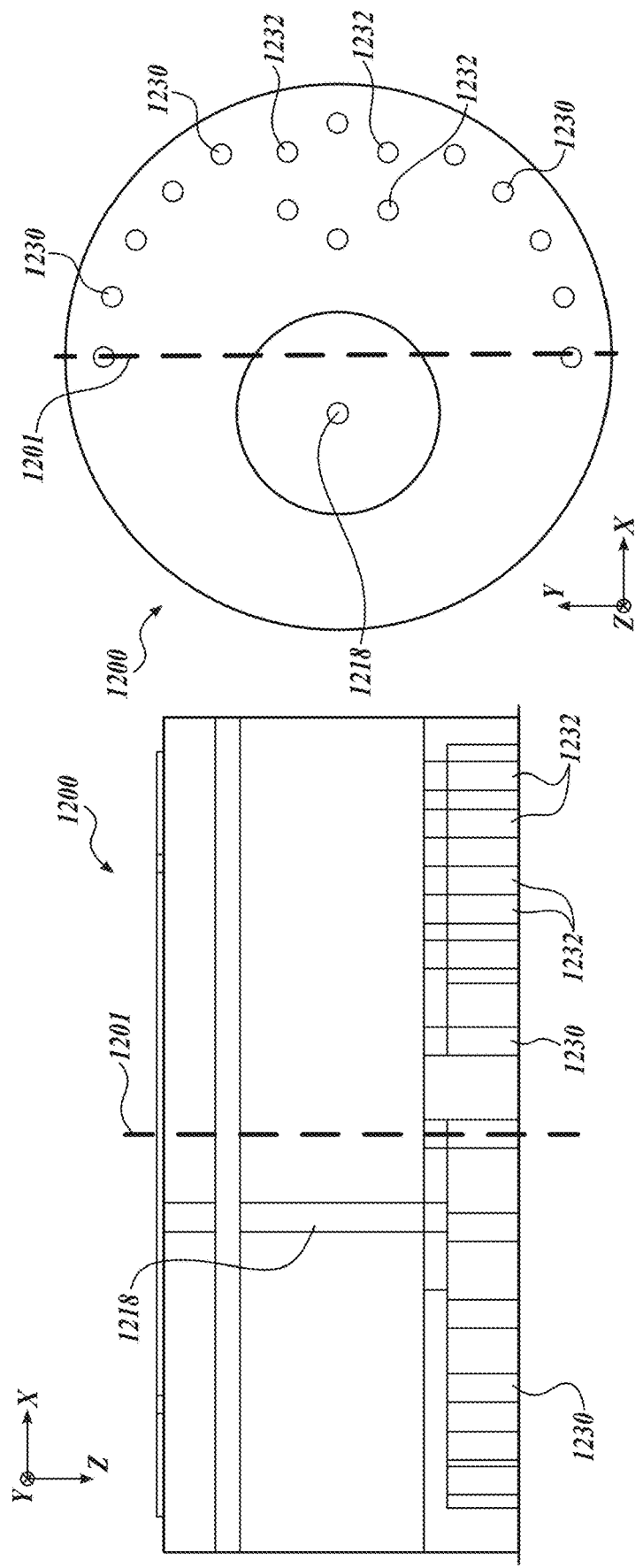

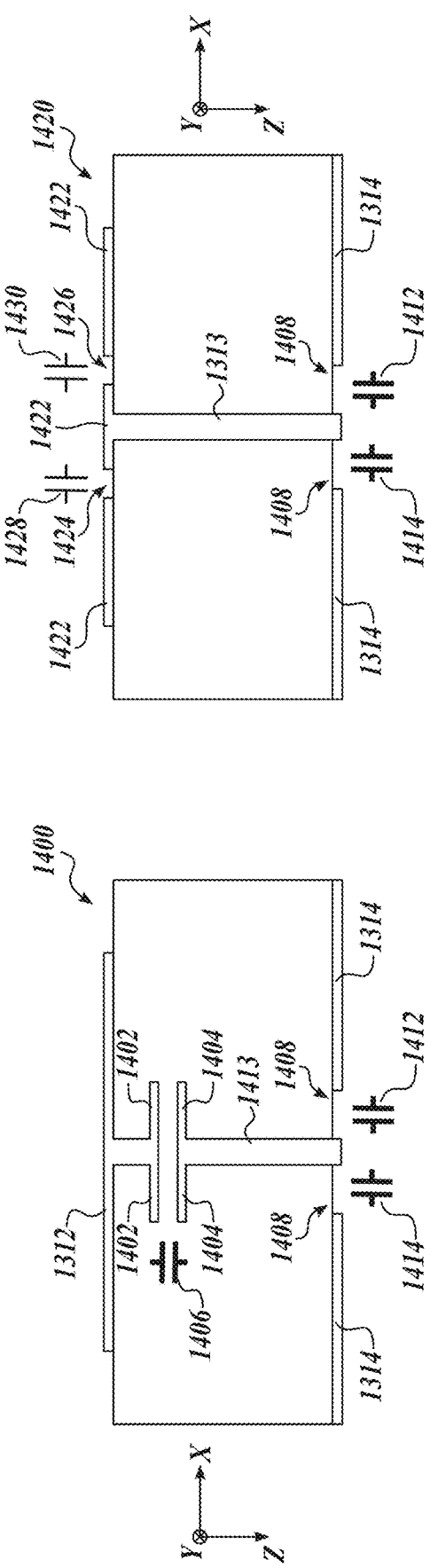
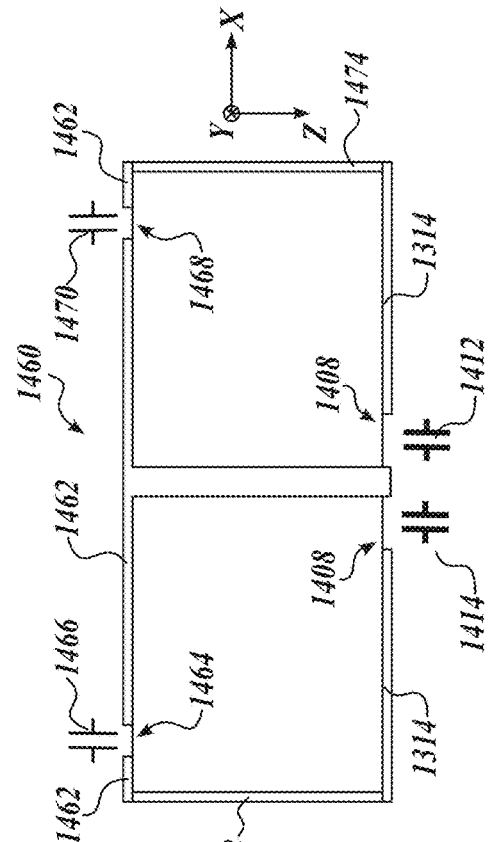
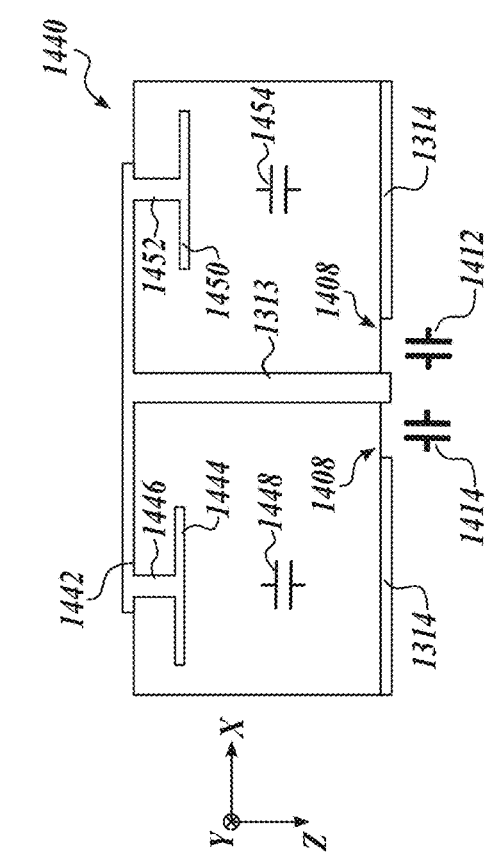
FIG. 14A
FIG. 14B
FIG. 14C
FIG. 14D

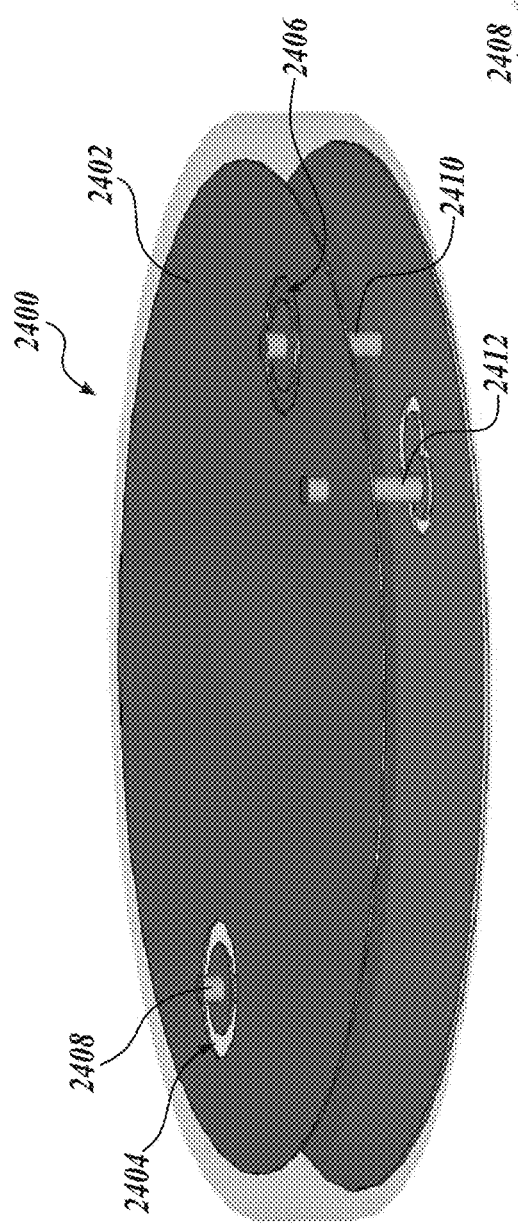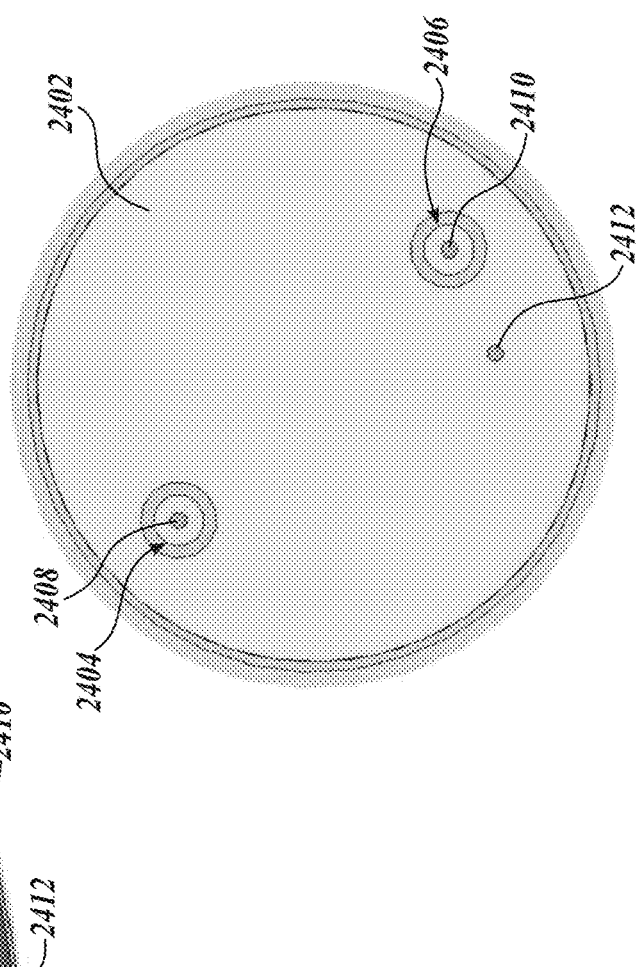
FIG. 24A
FIG. 24B

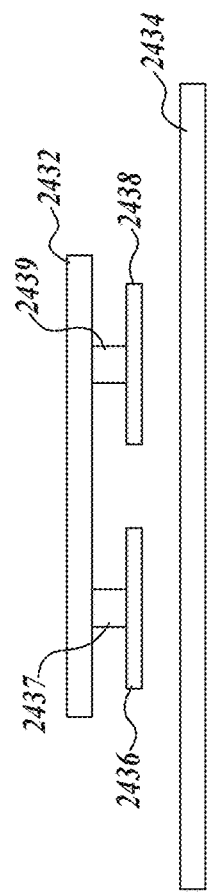
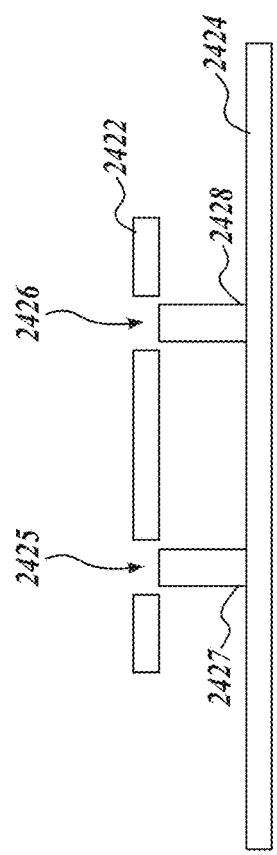
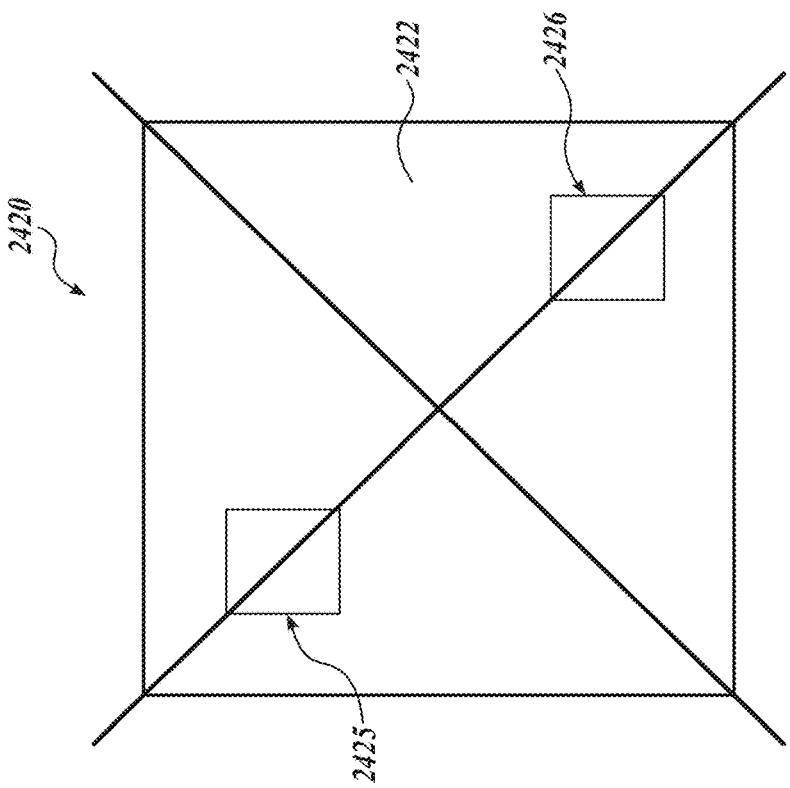

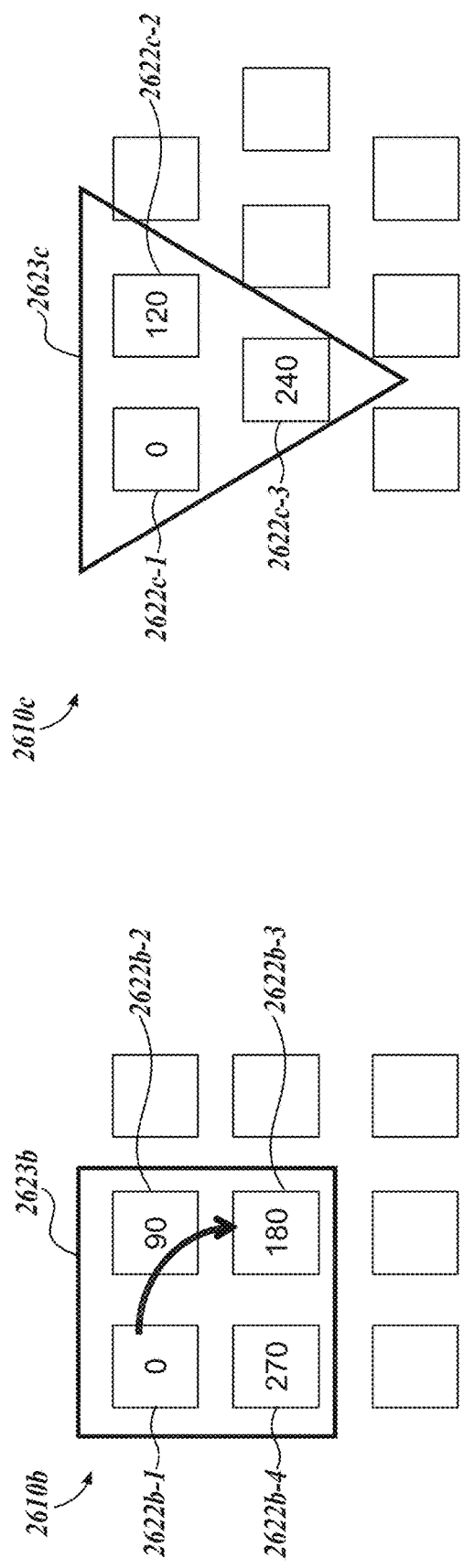
FIG. 26C
FIG. 26B
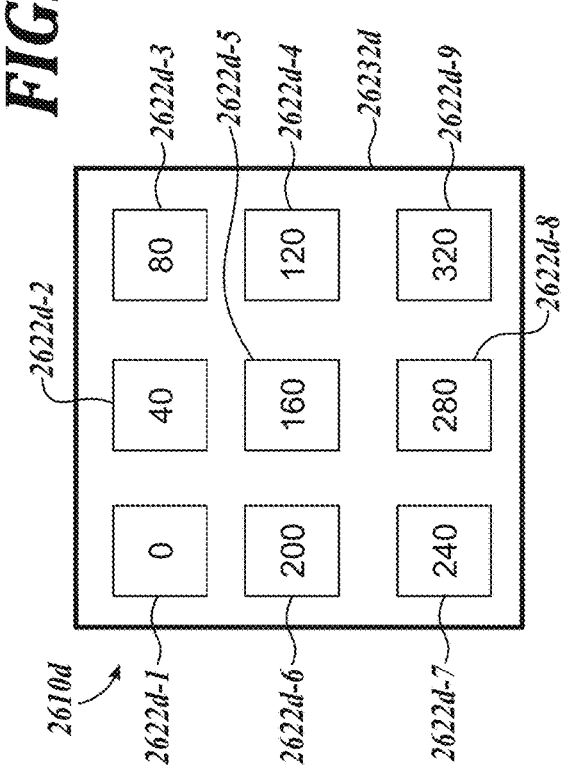
FIG. 26D

ANTENNA MODULES FOR PHASED ARRAY ANTENNAS

CROSS REFERENCE TO RELATED APPLICATIONS

This application claims the benefit of U.S. Provisional Patent Application No. 62/631,708 filed Feb. 17, 2018 and U.S. Provisional Patent Application No. 62/631,195 filed Feb. 15, 2018, both disclosures hereby incorporated by reference in their entirety herein.

BACKGROUND

An antenna (such as a dipole antenna) typically generates radiation in a pattern that has a preferred direction. For example, the generated radiation pattern is stronger in some directions and weaker in other directions. Likewise, when receiving electromagnetic signals, the antenna has the same preferred direction. Signal quality (e.g., signal to noise ratio or SNR), whether in transmitting or receiving scenarios, can be improved by aligning the preferred direction of the antenna with a direction of the target or source of the signal. However, it is often impractical to physically reorient the antenna with respect to the target or source of the signal. Additionally, the exact location of the source/target may not be known. To overcome some of the above shortcomings of the antenna, a phased array antenna can be formed from a set of antenna elements to simulate a large directional antenna. An advantage of a phased array antenna is its ability to transmit and/or receive signals in a preferred direction (e.g., the antenna's beamforming ability) without physical repositioning or reorientating.

It would be advantageous to configure phased array antennas having increased bandwidth while maintaining a high ratio of the main lobe power to the side lobe power. Likewise, it would be advantageous to configure phased array antennas having reduced weight, reduced size, lower manufacturing cost, and/or lower power requirements. Accordingly, embodiments of the present disclosure are directed to these and other improvements in phase array antennas or portions thereof.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In some embodiments, an antenna module includes an antenna element having a first side and a second side opposite the first side, the first side comprising a radiating side of the antenna element; a spacer structure disposed at the second side of the antenna element and configured to define a cavity, the spacer structure configured to be physically and electrically couplable with a printed circuit board (PCB) of a receiver or a transmitter; and an amplifier located within the cavity.

In some embodiments, an apparatus including a support structure having a first side and a second side opposite the first side, wherein the second side of the support structure is configured for being physically and electrically coupled with a printed circuit board (PCB) of a receiver or a transmitter, and wherein the first side of the support structure is configured to be spaced from the PCB by a first distance when the support structure is physically and electrically coupled to the PCB; and an antenna element having a first side and a second side opposite the first side, wherein the first side comprises a radiating side of the antenna element, wherein the second side of the antenna element is disposed closer to the support structure than the first side of the antenna element, and wherein the second side of the antenna element is configured to be spaced from the surface of the PCB by a second distance when the support structure is physically and electrically coupled to the PCB.

In some embodiments, an antenna module including an antenna element having a first side and a second side opposite the first side, the first side comprising a radiating side of the antenna element; an amplifier disposed closer to the second side than the first side of the antenna element; and a spacer structure disposed closer to the second side than the first side of the antenna element, wherein the antenna module is selectively couplable or decouplable from a surface of a printed circuit board (PCB) of a receiver or a transmitter.

In some embodiments, a method including positioning an antenna module on a printed circuit board (PCB) of a receiver or a transmitter, wherein the antenna module includes an antenna element and a support structure configured to locate one or more other components of the receiver or transmitter; and physically and electrically coupling the antenna module with the PCB to form at least a portion of an antenna array of the receiver or transmitter.

In some embodiments, an apparatus including an antenna element having a first side and a second side opposite the first side, the first side configured to emit or receive radiation; and an amplifier electrically coupled to the antenna element. A signal pathway length between the antenna element and the amplifier is 0.5 millimeter (mm) or less.

In some embodiments, an antenna module including an antenna element having a first side and a second side opposite the first side, the first side comprising a radiating side of the antenna element; an amplifier electrically coupled to the antenna element; and a spacer structure disposed at the second side of the antenna element. The spacer structure includes a first portion that is to electrically couple the amplifier with a printed circuit board (PCB) of a receiver or a transmitter and a second portion configured to reduce signal leakage to the antenna element.

In some embodiments, an apparatus including an antenna element having a first side and a second side opposite the first side, the first side configured to emit or receive radiation, wherein the antenna element includes a first conductive plate and a second conductive plate, the first conductive plate disposed closer to the first side than the second conductive plate, and the first conductive plate different from the second conductive plate in one or both of shape or size; an amplifier disposed at the second side of the antenna element; and a support structure disposed at the second side of the antenna element, wherein the support structure is to couple to a printed circuit board (PCB) of a receiver or a transmitter.

In some embodiments, a phased array antenna including a plurality of antenna modules arranged in an antenna lattice configuration to form the phased array antenna, wherein at least some antenna modules of the plurality of antenna modules are physically rotated relative to other antenna modules of the plurality of antenna modules, and wherein an antenna module of the plurality of antenna modules includes an antenna element packaged together with an amplifier.

In some embodiments, a method for arranging a plurality of antenna modules comprising a phased array antenna includes distributing the plurality of antenna modules in an antenna lattice configuration, an antenna module of the plurality of antenna modules including an antenna element, an amplifier, and a support structure; orienting at least some antenna modules of the plurality of antenna modules distributed in the antenna lattice configuration to have a different physical angular orientation relative to other antenna modules of the plurality of antenna modules; and connecting the plurality of antenna modules to a carrier.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 12A-12B depict a partial cut away side view and a partial cut away bottom view, respectively, of an AIP module in accordance with some embodiments of the present disclosure.

FIGS. 14A-14D depict cross-sectional side views of antennas configured with one or more additional capacitive loadings according to some embodiments of the present disclosure.

FIGS. 24A-24E depict a fourth implementation technique for an AIP module to achieve circular polarization according to some embodiments of the present disclosure.

FIGS. 26A-26D are schematic layouts of an antenna lattice including antenna rotation schemes for polarization purity in accordance with embodiments of the present disclosure;

DETAILED DESCRIPTION

Figure 1A:
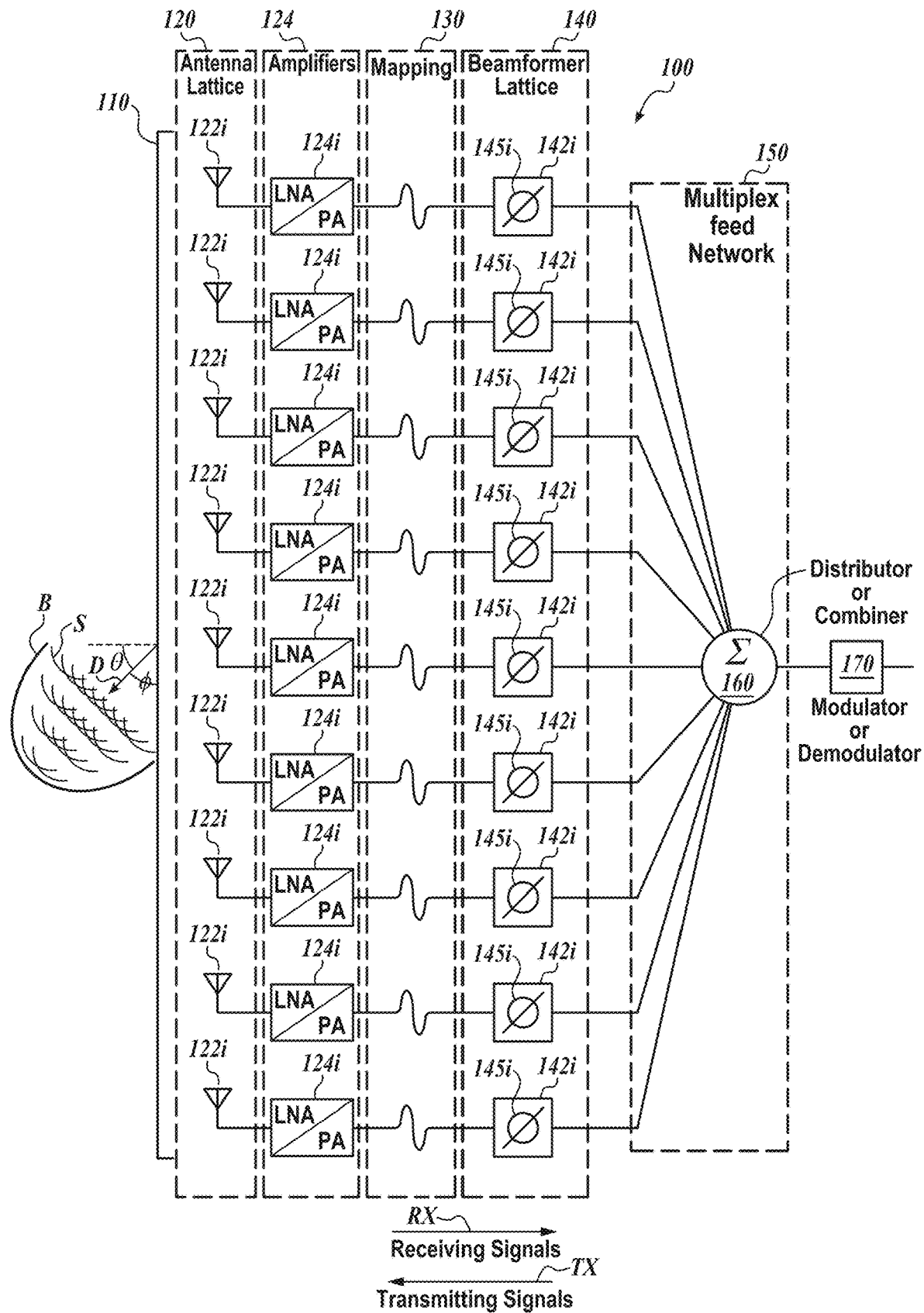
FIG. 1A illustrates a schematic of an electrical configuration for a phased array antenna system in accordance with one embodiment of the present disclosure including an antenna lattice defining an antenna aperture, mapping, a beamformer lattice, a multiplex feed network, a distributor or combiner, and a modulator or demodulator.

Embodiments of apparatuses and methods relate to antenna modules included in phased array antenna systems. In some embodiments, an apparatus includes an antenna element having a first side and a second side opposite the first side, an amplifier, and a spacer structure having a third side and a fourth side opposite the third side. The first side comprises a radiating side of the antenna element. The amplifier and spacer structure are disposed at the second side of the antenna element. The third side of the spacer structure is proximate to the second side of the antenna and the fourth side of the spacer structure is to physically and electrically couple with a printed circuit board (PCB) of a receiver or transmitter. The spacer structure is configured to form a space between the antenna element and the PCB to locate the amplifier. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

Language such as "top surface", "bottom surface", "vertical", "horizontal", and "lateral" in the present disclosure is meant to provide orientation for the reader with reference to the drawings and is not intended to be the required orientation of the components or to impart orientation limitations into the claims.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

Many embodiments of the technology described herein may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, controller or data processor that is specifically programmed, configured or constructed to perform one or more of the computer-executable instructions described above. Accordingly, the terms "computer" and "controller" as generally used herein refer to any data processor and can include Internet appliances and hand-held devices (including palm-top computers, wearable computers, cellular or mobile phones, multi-processor systems, processor-based or programmable consumer electronics, network computers, mini computers and the like). Information handled by these computers can be presented at any suitable display medium, including a cathode ray tube (CRT) display or liquid crystal display (LCD).

FIG. 1A is a schematic illustration of a phased array antenna system 100 in accordance with embodiments of the present disclosure. The phased array antenna system 100 is designed and configured to transmit or receive a combined beam B composed of signals S (also referred to as electromagnetic signals, wavefronts, or the like) in a preferred direction D from or to an antenna aperture 110. (Also see the combined beam B and antenna aperture 110 in FIG. 1B). The direction D of the beam B may be normal to the antenna aperture 110 or at an angle θ from normal.

Referring to FIG. 1A, the illustrated phased array antenna system 100 includes an antenna lattice 120, a mapping system 130, a beamformer lattice 140, a multiplex feed network 150 (or a hierarchical network or an H-network), a combiner or distributor 160 (a combiner for receiving signals or a distributor for transmitting signals), and a modulator or demodulator 170. The antenna lattice 120 is configured to transmit or receive a combined beam B of radio frequency signals S having a radiation pattern from or to the antenna aperture 110.

In accordance with embodiments of the present disclosure, the phased array antenna system 100 may be a multi-beam phased array antenna system, in which each beam of the multiple beams may be configured to be at different angles, different frequency, and/or different polarization.

In the illustrated embodiment, the antenna lattice 120 includes a plurality of antenna elements 122i. A corresponding plurality of amplifiers 124i are coupled to the plurality of antenna elements 122i. The amplifiers 124i may be low noise amplifiers (LNAs) in the receiving direction RX or power amplifiers (PAs) in the transmitting direction TX. The plurality of amplifiers 124i may be combined with the plurality of antenna elements 122i in for example, an antenna module or antenna package. In some embodiments, the plurality of amplifiers 124i may be located in another lattice separate from the antenna lattice 120.

Figure 1B:
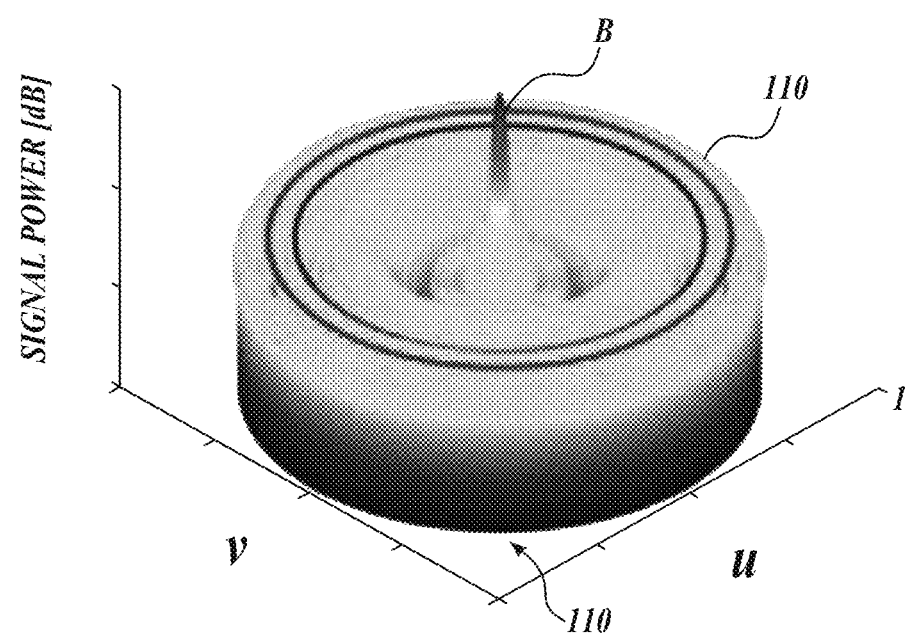
FIG. 1B illustrates a signal radiation pattern achieved by a phased array antenna aperture in accordance with one embodiment of the present disclosure.

Multiple antenna elements 122i in the antenna lattice 120 are configured for transmitting signals (see the direction of arrow TX in FIG. 1A for transmitting signals) or for receiving signals (see the direction of arrow RX in FIG. 1A for receiving signals). Referring to FIG. 1B, the antenna aperture 110 of the phased array antenna system 100 is the area through which the power is radiated or received. In accordance with one embodiment of the present disclosure, an exemplary phased array antenna radiation pattern from a phased array antenna system 100 in the u/v plane is provided in FIG. 1B. The antenna aperture has desired pointing angle D and an optimized beam B, for example, reduced side lobes Ls to optimize the power budget available to the main lobe Lm or to meet regulatory criteria for interference, as per regulations issued from organizations such as the Federal Communications Commission (FCC) or the International Telecommunication Union (ITU). (See FIG. 1F for a description of side lobes Ls and the main lobe Lm.)

Figure 1C:
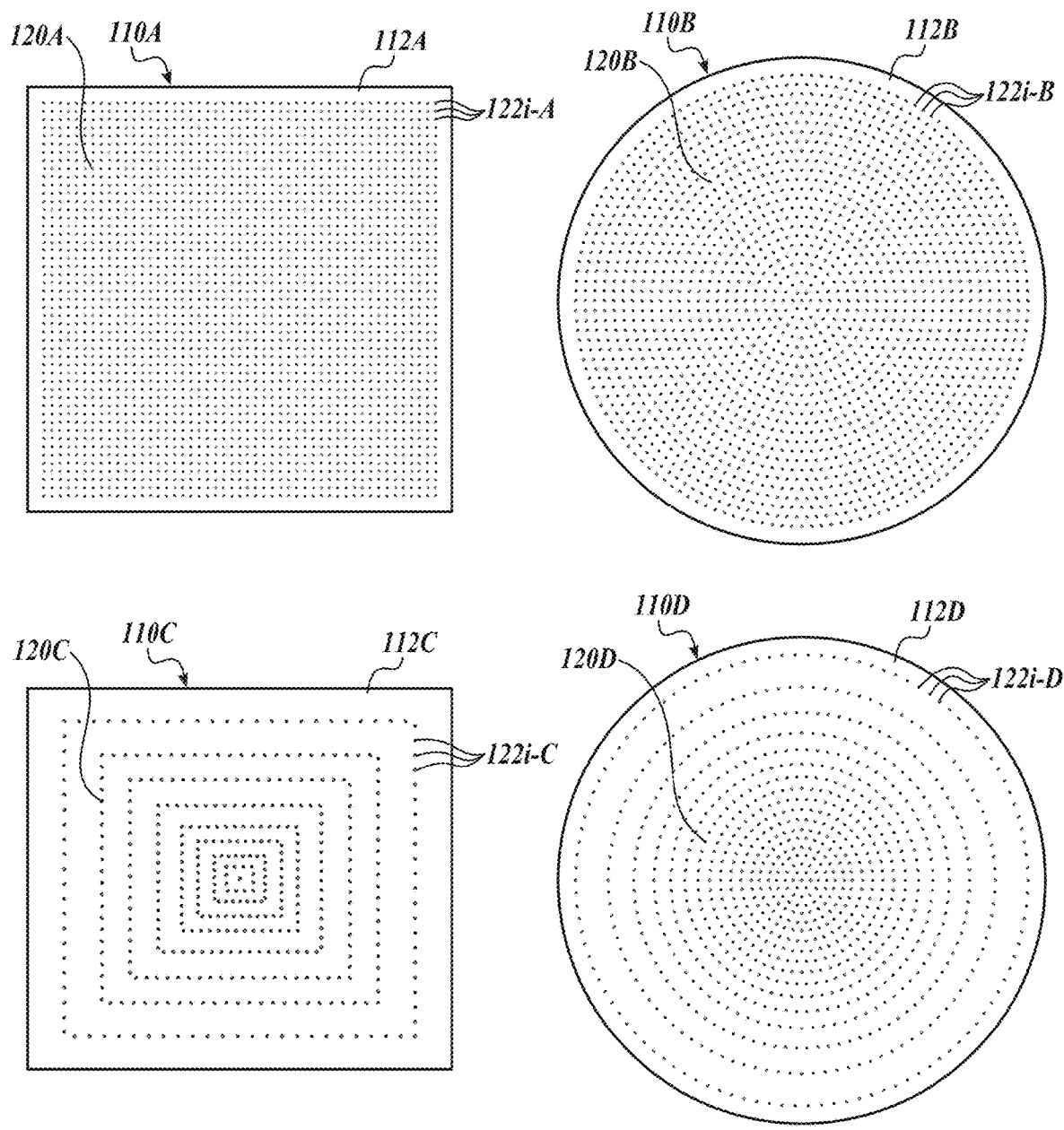
FIG. 1C illustrates schematic layouts of individual antenna elements of phased array antennas to define various antenna apertures in accordance with embodiments of the present disclosure (e.g., rectangular, circular, space tapered).

Referring to FIG. 1C, in some embodiments (see embodiments 120A, 120B, 120C, 120D), the antenna lattice 120 defining the antenna aperture 110 may include the plurality of antenna elements 122$i$ arranged in a particular configuration on a printed circuit board (PCB), ceramic, plastic, glass, or other suitable substrate, base, carrier, panel, or the like (described herein as a carrier 112). The plurality of antenna elements 122$i$, for example, may be arranged in concentric circles, in a circular arrangement, in columns and rows in a rectilinear arrangement, in a radial arrangement, in equal or uniform spacing between each other, in non-uniform spacing between each other, or in any other arrangement. Various example arrangements of the plurality of antenna elements 122$i$ in antenna lattices 120 defining antenna apertures (110A, 110B, 110C, and 110D) are shown, without limitation, on respective carriers 112A, 112B, 112C, and 112D in FIG. 1C.

The beamformer lattice 140 includes a plurality of beamformers 142$i$ including a plurality of phase shifters 145$i$. In the receiving direction RX, the beamformer function is to delay the signals arriving from each antenna element so the signals all arrive to the combining network at the same time. In the transmitting direction TX, the beamformer function is to delay the signal sent to each antenna element such that all signals arrive at the target location at the same time. This delay can be accomplished by using "true time delay" or a phase shift at a specific frequency.

Following the transmitting direction of arrow TX in the schematic illustration of FIG. 1A, in a transmitting phased array antenna system 100, the outgoing radio frequency (RF) signals are routed from the modulator 170 via the distributor 160 to a plurality of individual phase shifters 145$i$ in the beamformer lattice 140. The RF signals are phase-offset by the phase shifters 145$i$ by different phases, which vary by a predetermined amount from one phase shifter to another. Each frequency needs to be phased by a specific amount in order to maintain the beam performance. If the phase shift applied to different frequencies follows a linear behavior, the phase shift is referred to as "true time delay". Common phase shifters, however, apply a constant phase offset for all frequencies.

For example, the phases of the common RF signal can be shifted by 0° at the bottom phase shifter 145$i$ in FIG. 1A, by $\Delta\alpha$ at the next phase shifter 145$i$ in the column, by $2\Delta\alpha$ at the next phase shifter, and so on. As a result, the RF signals that arrive at amplifiers 124$i$ (when transmitting, the amplifiers are power amplifiers "PAs") are respectively phase-offset from each other. The PAs 124$i$ amplify these phase-offset RF signals, and antenna elements 122$i$ emit the RF signals S as electromagnetic waves.

Because of the phase offsets, the RF signals from individual antenna elements 122$i$ are combined into outgoing wave fronts that are inclined at angle $\phi$ from the antenna aperture 110 formed by the lattice of antenna elements 122$i$. The angle $\phi$ is called an angle of arrival (AoA) or a beamforming angle. Therefore, the choice of the phase offset $\Delta\alpha$ determines the radiation pattern of the combined signals S defining the wave front. In FIG. 1B, an exemplary phased array antenna radiation pattern of signals S from an antenna aperture 110 in accordance with one embodiment of the present disclosure is provided.

Following the receiving direction of arrow RX in the schematic illustration of FIG. 1A, in a receiving phased array antenna system 100, the signals S defining the wave front are detected by individual antenna elements 122$i$, and amplified by amplifiers 124$i$ (when receiving signals the amplifiers are low noise amplifiers "LNAs"). For any non-zero AoA, signals S comprising the same wave front reach the different antenna elements 122$i$ at different times. Therefore, the received signal will generally include phase offsets from one antenna element of the receiving (RX) antenna element to another. Analogously to the emitting phased array antenna case, these phase offsets can be adjusted by phase shifters 145$i$ in the beamformer lattice 140. For example, each phase shifter 145$i$ (e.g., a phase shifter chip) can be programmed to adjust the phase of the signal to the same reference, such that the phase offset among the individual antenna elements 122$i$ is canceled in order to combine the RF signals corresponding to the same wave front. As a result of this constructive combining of signals, a higher signal to noise ratio (SNR) can be attained on the received signal, which results in increased channel capacity.

Still referring to FIG. 1A, a mapping system 130 may be disposed between the antenna lattice 120 and the beamformer lattice 140 to provide length matching for equidistant electrical connections between each antenna element 122$i$ of the antenna lattice 120 and the phase shifters 145$i$ in the beamformer lattice 140, as will be described in greater detail below. A multiplex feed or hierarchical network 150 may be disposed between the beamformer lattice 140 and the distributor/combiner 160 to distribute a common RF signal to the phase shifters 145$i$ of the beamformer lattice 140 for respective appropriate phase shifting and to be provided to the antenna elements 122$i$ for transmission, and to combine RF signals received by the antenna elements 122$i$, after appropriate phase adjustment by the beamformers 142$i$.

In accordance with some embodiments of the present disclosure, the antenna elements 122$i$ and other components of the phased array antenna system 100 may be contained in an antenna module to be carried by the carrier 112. (See, for example, antenna modules 226$a$ and 226$b$ in FIG. 2B). In the illustrated embodiment of FIG. 2B, there is one antenna element 122$i$ per antenna module 226$a$. However, in other embodiments of the present disclosure, antenna modules 226$a$ may incorporate more than one antenna element 122$i$.

Figure 1D:
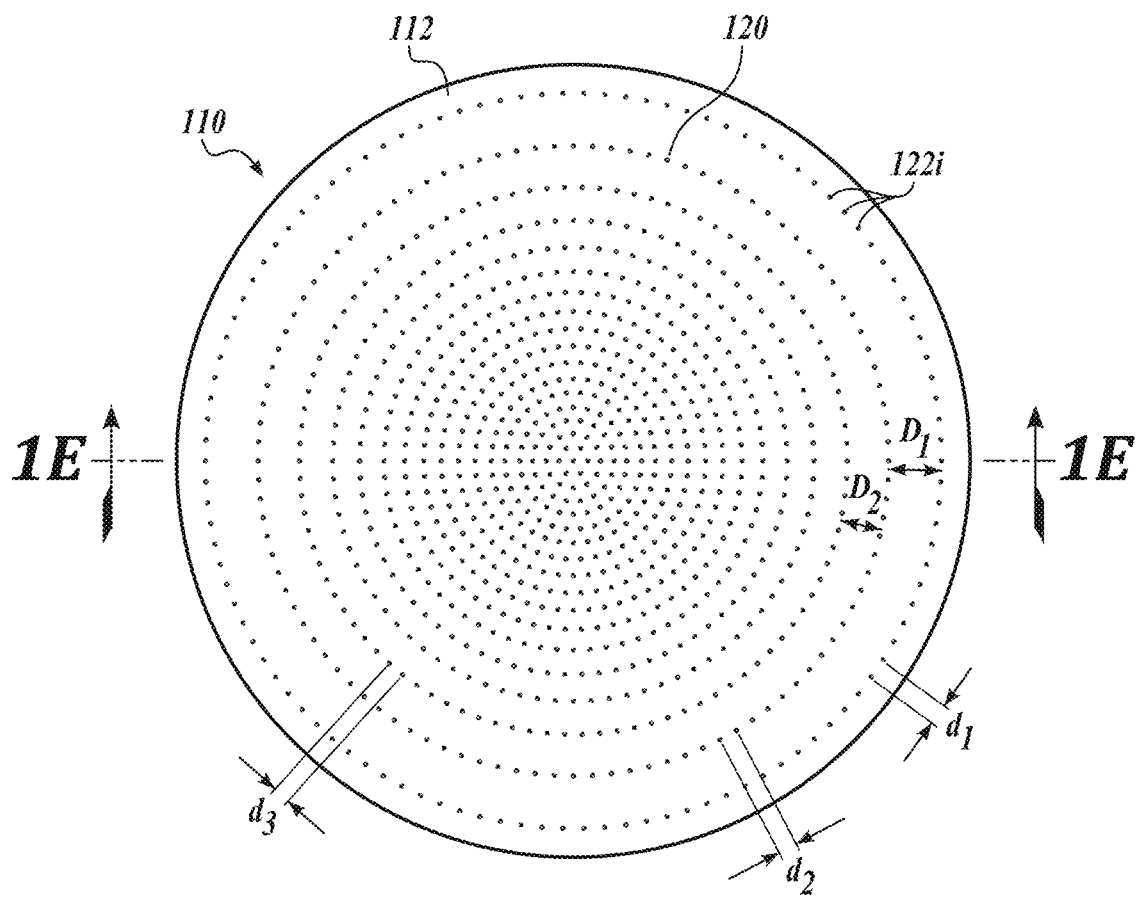
FIG. 1D illustrates individual antenna elements in a space tapered configuration to define an antenna aperture in accordance with embodiments of the present disclosure.
Figure 1E:
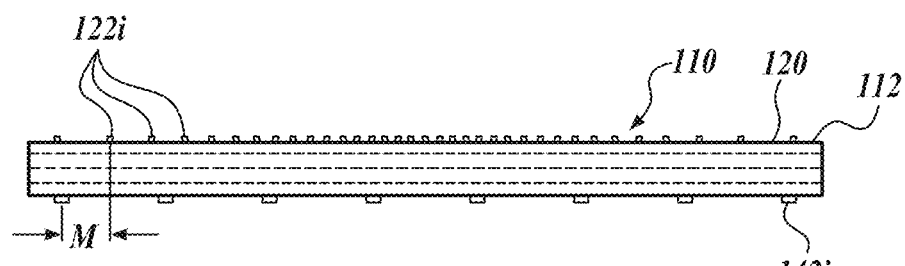
FIG. 1E is a cross-sectional view of a panel defining the antenna aperture in FIG. 1D.

Referring to FIGS. 1D and 1E, an exemplary configuration for an antenna aperture 120 in accordance with one embodiment of the present disclosure is provided. In the illustrated embodiment of FIGS. 1D and 1E, the plurality of antenna elements 122$i$ in the antenna lattice 120 are distributed with a space taper configuration on the carrier 112. In accordance with a space taper configuration, the number of antenna elements 122$i$ changes in their distribution from a center point of the carrier 112 to a peripheral point of the carrier 112. For example, compare spacing between adjacent antenna elements 122$i$, D1 to D2, and compare spacing between adjacent antenna elements 122$i$, d1, d2, and d3. Although shown as being distributed with a space taper configuration, other configurations for the antenna lattice are also within the scope of the present disclosure.

The system 100 includes a first portion carrying the antenna lattice 120 and a second portion carrying a beamformer lattice 140 including a plurality of beamformer elements. As seen in the cross-sectional view of FIG. 1E, multiple layers of the carrier 112 carry electrical and electromagnetic connections between elements of the phased array antenna system 100. In the illustrated embodiment, the antenna elements 122i are located the top surface of the top layer and the beamformer elements 142i are located on the bottom surface of the bottom layer. While the antenna elements 122i may be configured in a first arrangement, such as a space taper arrangement, the beamformer elements 142i may be arranged in a second arrangement different from the antenna element arrangement. For example, the number of antenna elements 122i may be greater than the number of beamformer elements 142i, such that multiple antenna elements 122i correspond to one beamformer element 142i. As another example, the beamformer elements 142i may be laterally displaced from the antenna elements 122i on the carrier 112, as indicated by distance M in FIG. 1E. In one embodiment of the present disclosure, the beamformer elements 142i may be arranged in an evenly spaced or organized arrangement, for example, corresponding to an H-network, or a cluster network, or an unevenly spaced network such as a space tapered network different from the antenna lattice 120. In some embodiments, one or more additional layers may be disposed between the top and bottom layers of the carrier 112. Each of the layers may comprise one or more PCB layers.

Figure 1F:
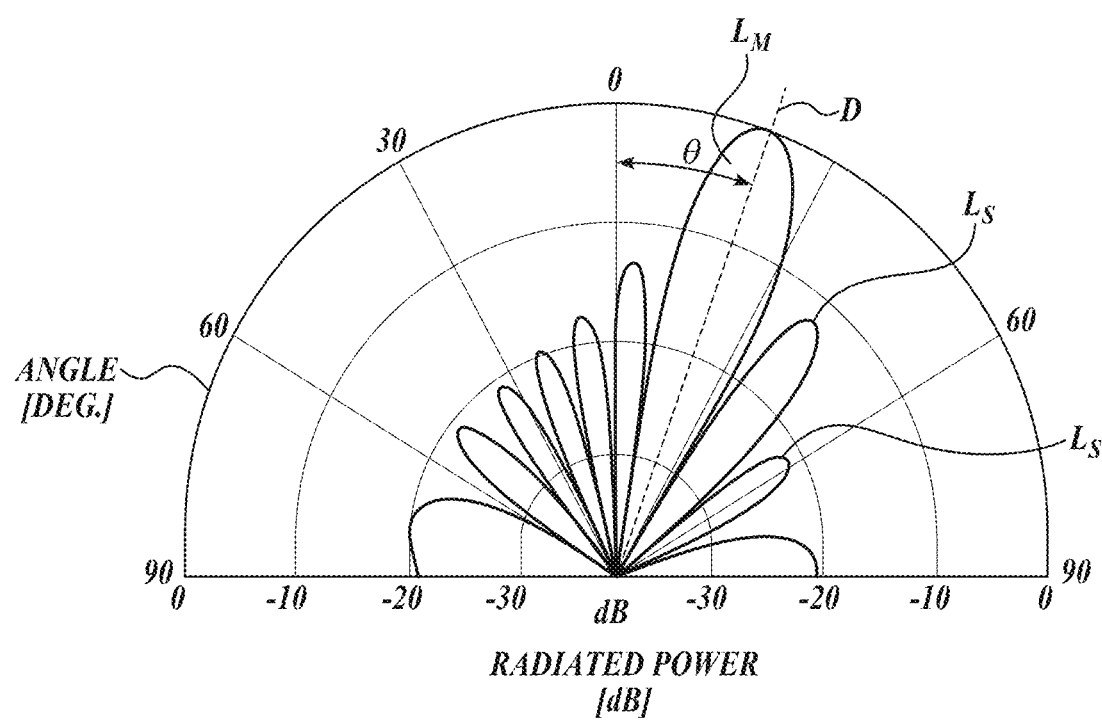
FIG. 1F is a graph of a main lobe and undesirable side lobes of an antenna signal.

Referring to FIG. 1F, a graph of a main lobe Lm and side lobes Ls of an antenna signal in accordance with embodiments of the present disclosure is provided. The horizontal (also the radial) axis shows radiated power in dB. The angular axis shows the angle of the RF field in degrees. The main lobe Lm represents the strongest RF field that is generated in a preferred direction by a phased array antenna system 100. In the illustrated case, a desired pointing angle D of the main lobe Lm corresponds to about 20°. Typically, the main lobe Lm is accompanied by a number of side lobes Ls. However, side lobes Ls are generally undesirable because they derive their power from the same power budget thereby reducing the available power for the main lobe Lm. Furthermore, in some instances the side lobes Ls may reduce the SNR of the antenna aperture 110. Also, side lobe reduction is important for regulation compliance.

One approach for reducing side lobes Ls is arranging elements 122i in the antenna lattice 120 with the antenna elements 122i being phase offset such that the phased array antenna system 100 emits a waveform in a preferred direction D with reduced side lobes. Another approach for reducing side lobes Ls is power tapering. However, power tapering is generally undesirable because by reducing the power of the side lobe Ls, the system has increased design complexity of requiring of "tunable and/or lower output" power amplifiers.

In addition, a tunable amplifier 124i for output power has reduced efficiency compared to a non-tunable amplifier. Alternatively, designing different amplifiers having different gains increases the overall design complexity and cost of the system.

Yet another approach for reducing side lobes Ls in accordance with embodiments of the present disclosure is a space tapered configuration for the antenna elements 122i of the antenna lattice 120. (See the antenna element 122i configuration in FIGS. 1C and 1D.) Space tapering may be used to reduce the need for distributing power among antenna elements 122i to reduce undesirable side lobes Ls. However, in some embodiments of the present disclosure, space taper distributed antenna elements 122i may further include power or phase distribution for improved performance.

In addition to undesirable side lobe reduction, space tapering may also be used in accordance with embodiments of the present disclosure to reduce the number of antenna elements 122i in a phased array antenna system 100 while still achieving an acceptable beam B from the phased array antenna system 100 depending on the application of the system 100. (For example, compare in FIG. 1C the number of space-tapered antenna elements 122i on carrier 112D with the number of non-space tapered antenna elements 122i carried by carrier 112B.)

Figure 1G:
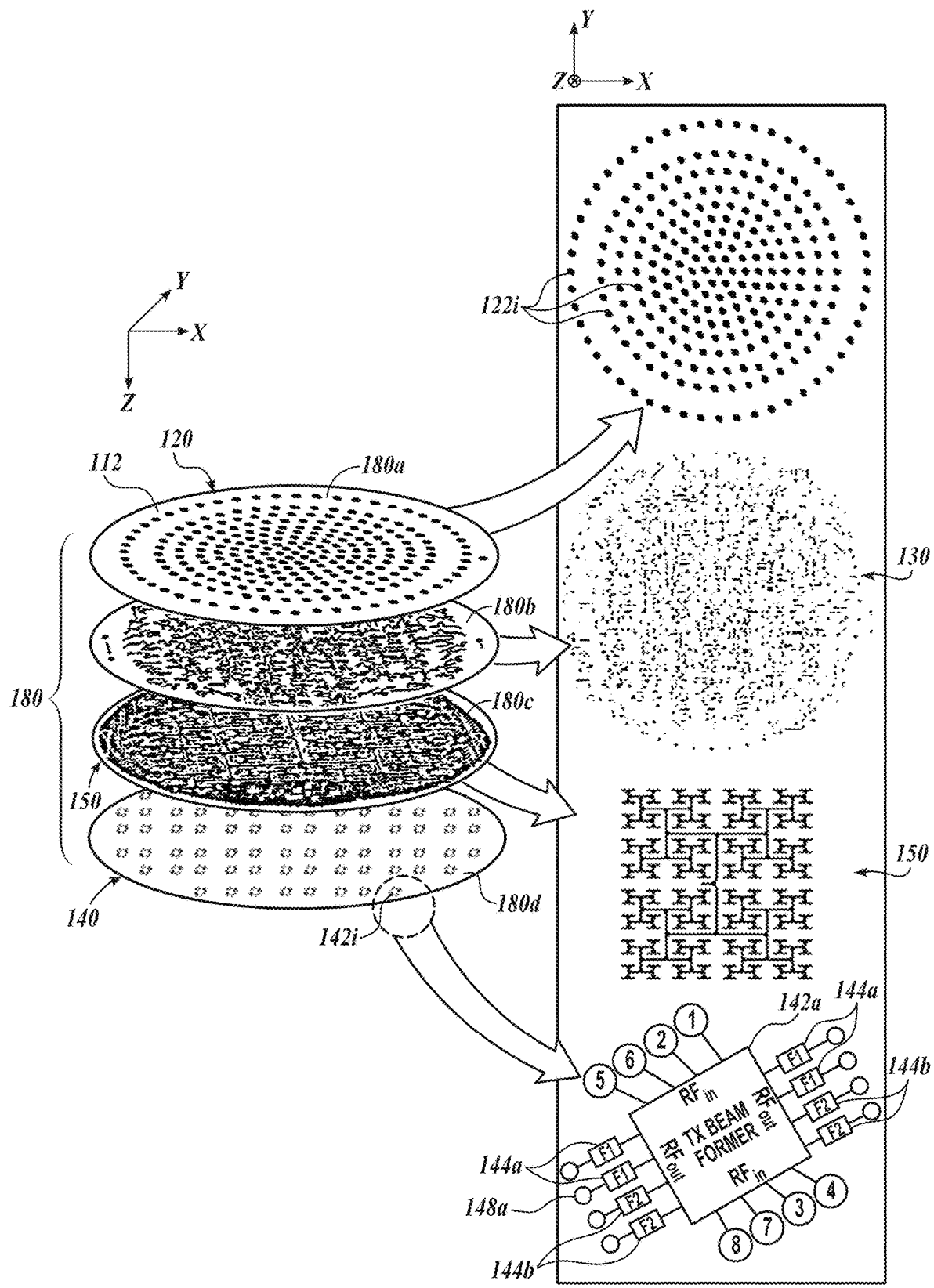
FIG. 1G illustrates an isometric view of a plurality of stack-up layers which make up a phased array antenna system in accordance with one embodiment of the present disclosure.

FIG. 1G depicts an exemplary configuration of the phased array antenna system 100 implemented as a plurality of PCB layers in lay-up 180 in accordance with embodiments of the present disclosure. The plurality of PCB layers in lay-up 180 may comprise a PCB layer stack including an antenna layer 180a, a mapping layer 180b, a multiplex feed network layer 180c, and a beamformer layer 180d. In the illustrated embodiment, mapping layer 180b is disposed between the antenna layer 180a and multiplex feed network layer 180c, and the multiplex feed network layer 180c is disposed between the mapping layer 180b and the beamformer layer 180d.

Although not shown, one or more additional layers may be disposed between layers 180a and 180b, between layers 180b and 180c, between layers 180c and 180d, above layer 180a, and/or below layer 180d. Each of the layers 180a, 180b, 180c, and 180d may comprise one or more PCB sub-layers. In other embodiments, the order of the layers 180a, 180b, 180c, and 180d relative to each other may differ from the arrangement shown in FIG. 1G. For instance, in other embodiments, beamformer layer 180d may be disposed between the mapping layer 180b and multiplex feed network layer 180c.

Layers 180a, 180b, 180c, and 180d may include electrically conductive traces (such as metal traces that are mutually separated by electrically isolating polymer or ceramic), electrical components, mechanical components, optical components, wireless components, electrical coupling structures, electrical grounding structures, and/or other structures configured to facilitate functionalities associated with the phase array antenna system 100. Structures located on a particular layer, such as layer 180a, may be electrically interconnected with vertical vias (e.g., vias extending along the z-direction of a Cartesian coordinate system) to establish electrical connection with particular structures located on another layer, such as layer 180d.

Antenna layer 180a may include, without limitation, the plurality of antenna elements 122i arranged in a particular arrangement (e.g., a space taper arrangement) as an antenna lattice 120 on the carrier 112. Antenna layer 180a may also include one or more other components, such as corresponding amplifiers 124i. Alternatively, corresponding amplifiers 124i may be configured on a separate layer. Mapping layer 180b may include, without limitation, the mapping system 130 and associated carrier and electrical coupling structures. Multiplex feed network layer 180c may include, without limitation, the multiplex feed network 150 and associated carrier and electrical coupling structures. Beamformer layer 180d may include, without limitation, the plurality of phase shifters 145i, other components of the beamformer lattice 140, and associated carrier and electrical coupling structures. Beamformer layer 180d may also include, in some embodiments, modulator/demodulator 170 and/or coupler structures. In the illustrated embodiment of FIG. 1G, the beamformers 142i are shown in phantom lines because they extend from the underside of the beamformer layer 180d.

Although not shown, one or more of layers 180a, 180b, 180c, or 180d may itself comprise more than one layer. For example, mapping layer 180b may comprise two or more layers, which in combination may be configured to provide the routing functionality discussed above. As another example, multiplex feed network layer 180c may comprise two or more layers, depending upon the total number of multiplex feed networks included in the multiplex feed network 150.

Figure 2A:
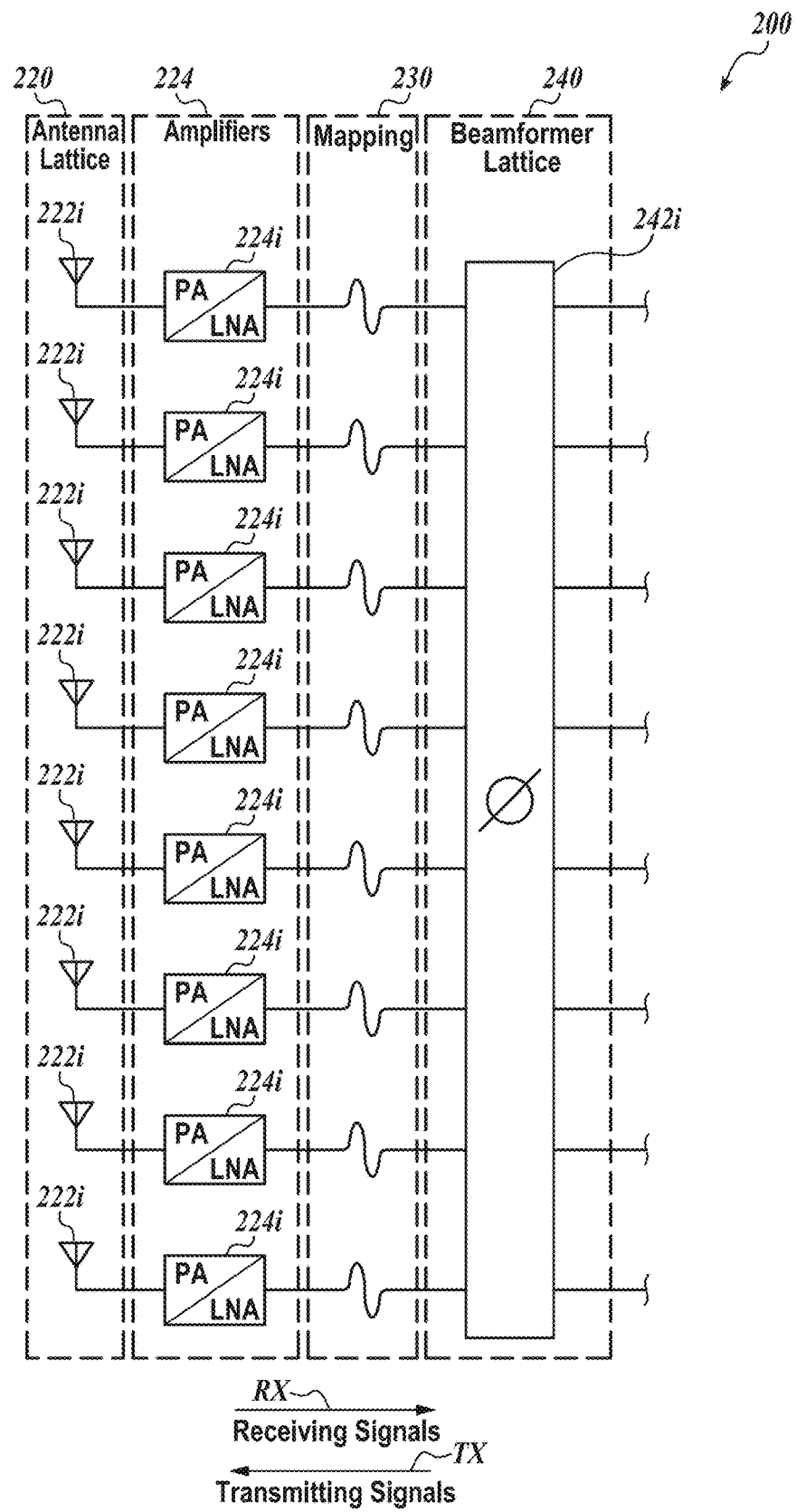
FIG. 2A illustrates a schematic of an electrical configuration for multiple antenna elements in an antenna lattice coupled to a single beamformer in a beamformer lattice in accordance with one embodiment of the present disclosure.

In accordance with embodiments of the present disclosure, the phased array antenna system 100 may be a multi-beam phased array antenna system. In a multi-beam phased array antenna configuration, each beamformer 142i may be electrically coupled to more than one antenna element 122i. The total number of beamformer 142i may be smaller than the total number of antenna elements 122i. For example, each beamformer 142i may be electrically coupled to four antenna elements 122i or to eight antenna elements 122i. FIG. 2A illustrates an exemplary multi-beam phased array antenna system in accordance with one embodiment of the present disclosure in which eight antenna elements 222i are electrically coupled to one beamformer 242i. In other embodiments, each beamformer 142i may be electrically coupled to more than eight antenna elements 122i.

Figure 2B:
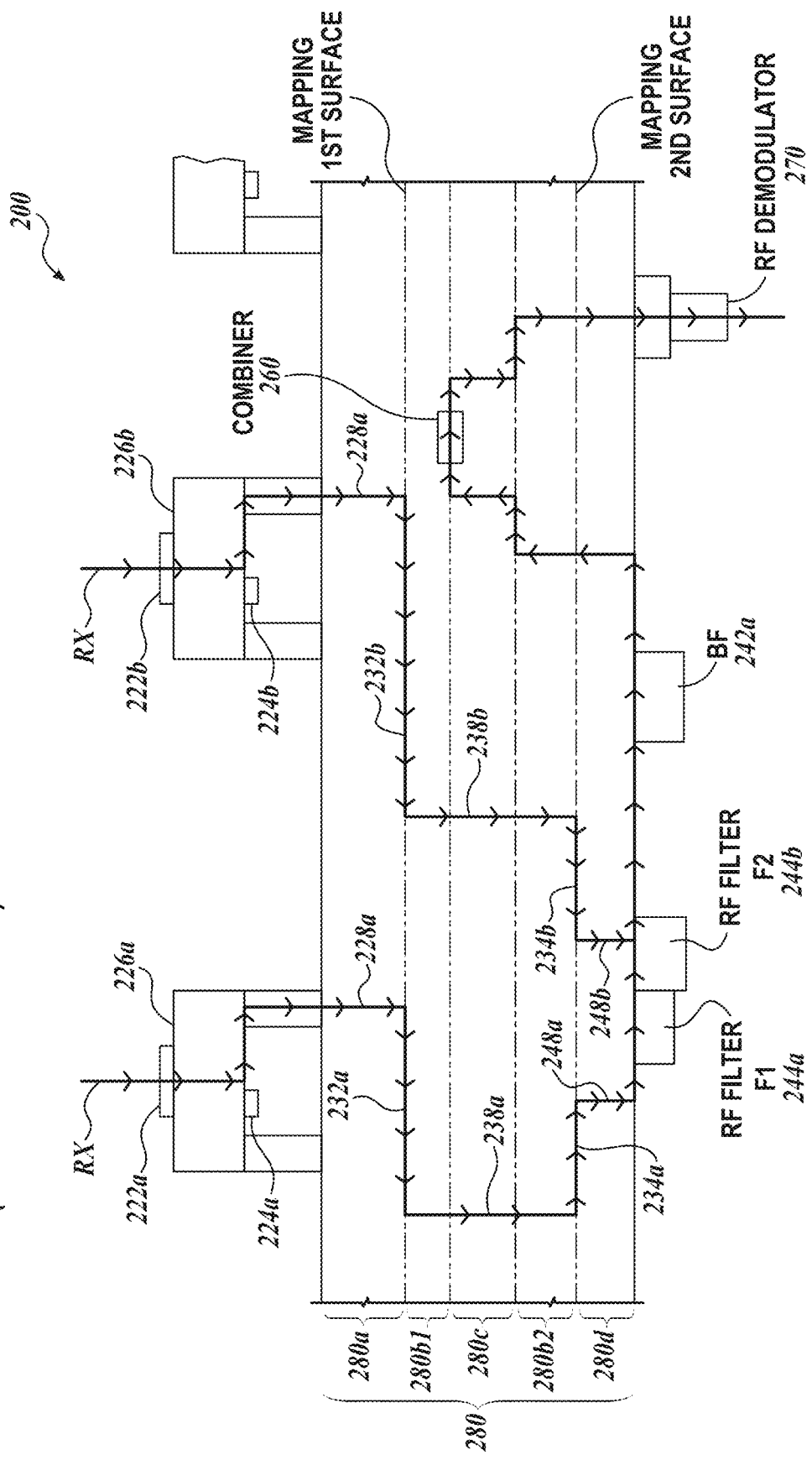
FIG. 2B illustrates a schematic cross section of a plurality of stack-up layers which make up a phased array antenna system in an exemplary receiving system in accordance with the electrical configuration of FIG. 2A.

FIG. 2B depicts a partial, close-up, cross-sectional view of an exemplary configuration of the phased array antenna system 200 of FIG. 2A implemented as a plurality of PCB layers 280 in accordance with embodiments of the present disclosure Like part numbers are used in FIG. 2B as used in FIG. 1G with similar numerals, but in the 200 series.

In the illustrated embodiment of FIG. 2B, the phased array antenna system 200 is in a receiving configuration (as indicated by the arrows RX). Although illustrated as in a receiving configuration, the structure of the embodiment of FIG. 2B may be modified to be also be suitable for use in a transmitting configuration.

Signals are detected by the individual antenna elements 222a and 222b, shown in the illustrated embodiment as being carried by antenna modules 226a and 226b on the top surface of the antenna lattice layer 280a. After being received by the antenna elements 222a and 222b, the signals are amplified by the corresponding low noise amplifiers (LNAs) 224a and 224b, which are also shown in the illustrated embodiment as being carried by antenna modules 226a and 226b on a top surface of the antenna lattice layer 280a.

In the illustrated embodiment of FIG. 2B, a plurality of antenna elements 222a and 222b in the antenna lattice 220 are coupled to a single beamformer 242a in the beamformer lattice 240 (as described with reference to FIG. 2A). However, a phased array antenna system implemented as a plurality of PCB layers having a one-to-one ratio of antenna elements to beamformer elements or having a greater than one-to-one ratio are also within the scope of the present disclosure. In the illustrated embodiment of FIG. 2B, the beamformers 242i are coupled to the bottom surface of the beamformer layer 280d.

In the illustrated embodiment, the antenna elements 222i and the beamformer elements 242i are configured to be on opposite surfaces of the lay-up of PCB layers 280. In other embodiments, beamformer elements may be co-located with antenna elements on the same surface of the lay-up. In other embodiments, beamformers may be located within an antenna module or antenna package.

As previously described, electrical connections coupling the antenna elements 222a and 222b of the antenna lattice 220 on the antenna layer 280a to the beamformer elements 242a of the beamformer lattice 240 on the beamformer layer 280d are routed on surfaces of one or more mapping layers 280b1 and 280b2 using electrically conductive traces. Exemplary mapping trace configurations for a mapping layer are provided in layer 130 of FIG. 1G.

In the illustrated embodiment, the mapping is shown on top surfaces of two mapping layers 280b1 and 280b2. However, any number of mapping layers may be used in accordance with embodiments of the present disclosure, including a single mapping layer. Mapping traces on a single mapping layer cannot cross other mapping traces. Therefore, the use of more than one mapping layer can be advantageous in reducing the lengths of the electrically conductive mapping traces by allowing mapping traces in horizontal planes to cross an imaginary line extending through the lay-up 280 normal to the mapping layers and in selecting the placement of the intermediate vias between the mapping traces.

In addition to mapping traces on the surfaces of layers 280b1 and 280b2, mapping from the antenna lattice 220 to the beamformer lattice 240 further includes one or more electrically conductive vias extending vertically through one or more of the plurality of PCB layers 280.

In the illustrated embodiment of FIG. 2B, a first mapping trace 232a between first antenna element 222a and beamformer element 242a is formed on the first mapping layer 280b1 of the lay-up of PCB layers 280. A second mapping trace 234a between the first antenna element 222a and beamformer element 242a is formed on the second mapping layer 280b2 of the lay-up of PCB layers 280. An electrically conductive via 238a connects the first mapping trace 232a to the second mapping trace 234a. Likewise, an electrically conductive via 228a connects the antenna element 222a (shown as connecting the antenna module 226a including the antenna element 222a and the amplifier 224a) to the first mapping trace 232a. Further, an electrically conductive via 248a connects the second mapping trace 234a to RF filter 244a and then to the beamformer element 242a, which then connects to combiner 260 and RF demodulator 270.

Of note, via 248a corresponds to via 148a and filter 244a corresponds to filter 144a, both shown on the surface of the beamformer layer 180d in the previous embodiment of FIG. 1G. In some embodiments of the present disclosure, filters may be omitted depending on the design of the system.

Similar mapping connects the second antenna element 222b to RF filter 244b and then to the beamformer element 242a. The second antenna element 222b may operate at the same or at a different value of a parameter than the first antenna element 222a (for example at different frequencies). If the first and second antenna elements 222a and 222b operate at the same value of a parameter, the RF filters 244a and 244b may be the same. If the first and second antenna elements 222a and 222b operate at different values, the RF filters 244a and 244b may be different.

Mapping traces and vias may be formed in accordance with any suitable methods. In one embodiment of the present disclosure, the lay-up of PCB layers 280 is formed after the multiple individual layers 280a, 280b, 280c, and 280d have been formed. For example, during the manufacture of layer 280a, electrically conductive via 228a may be formed through layer 280a. Likewise, during the manufacture of layer 280d, electrically conductive via 248a may be formed through layer 280d. When the multiple individual layers 280a, 280b, 280c, and 280d are assembled and laminated together, the electrically conductive via 228a through layer 280a electrically couples with the trace 232a on the surface of layer 280b1, and the electrically conductive via 248a through layer 280d electrically couples with the trace 234a on the surface of layer 280b2.

Other electrically conductive vias, such as via 238a coupling trace 232a on the surface of layer 280b1 and trace 234a on the surface of layer 280b2 can be formed after the multiple individual layers 280a, 280b, 280c, and 280d are assembled and laminated together. In this construction method, a hole may be drilled through the entire lay-up 280 to form the via, metal is deposited in the entirety of the hole forming an electrically connection between the traces 232a and 234a. In some embodiments of the present disclosure, excess metal in the via not needed in forming the electrical connection between traces 232a and 234a can be removed by back-drilling the metal at the top and/or bottom portions of the via. In some embodiments, back-drilling of the metal is not performed completely, leaving a via "stub".

Tuning may be performed for a lay-up design with a remaining via "stub". In other embodiments, a different manufacturing process may produce a via that does not span more than the needed vertical direction.

As compared to the use of one mapping layer, the use of two mapping layers 280b1 and 280b2 separated by intermediate vias 238a and 238b as seen in the illustrated embodiment of FIG. 2B allows for selective placement of the intermediate vias 238a and 238b. If these vias are drilled though all the layers of the lay-up 280, they can be selectively positioned to be spaced from other components on the top or bottom surfaces of the lay-up 280.

Figure 3A:
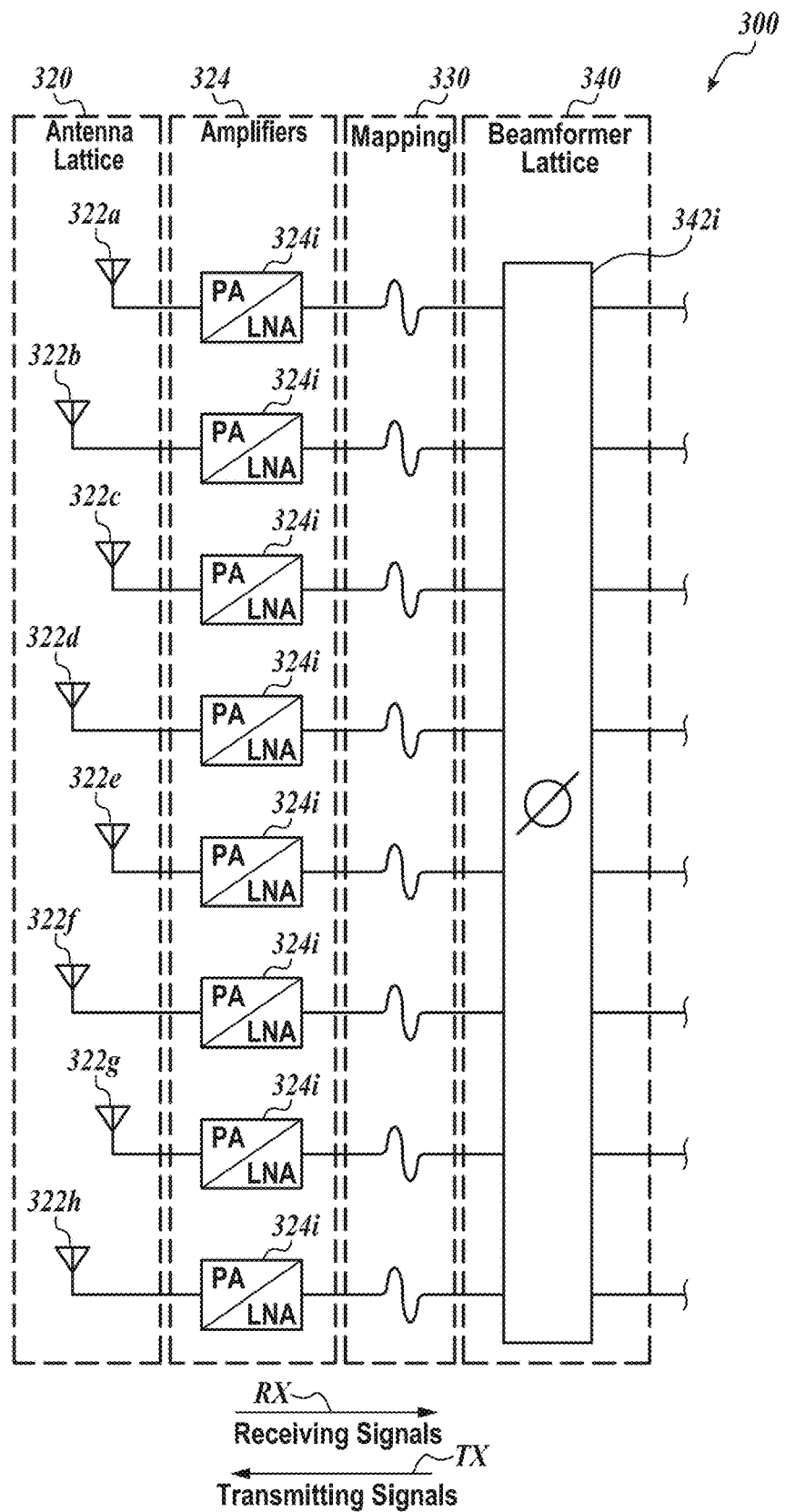
FIG. 3A illustrates a schematic of an electrical configuration for multiple interspersed antenna elements in an antenna lattice coupled to a single beamformer in a beamformer lattice in accordance with one embodiment of the present disclosure.
Figure 3B:
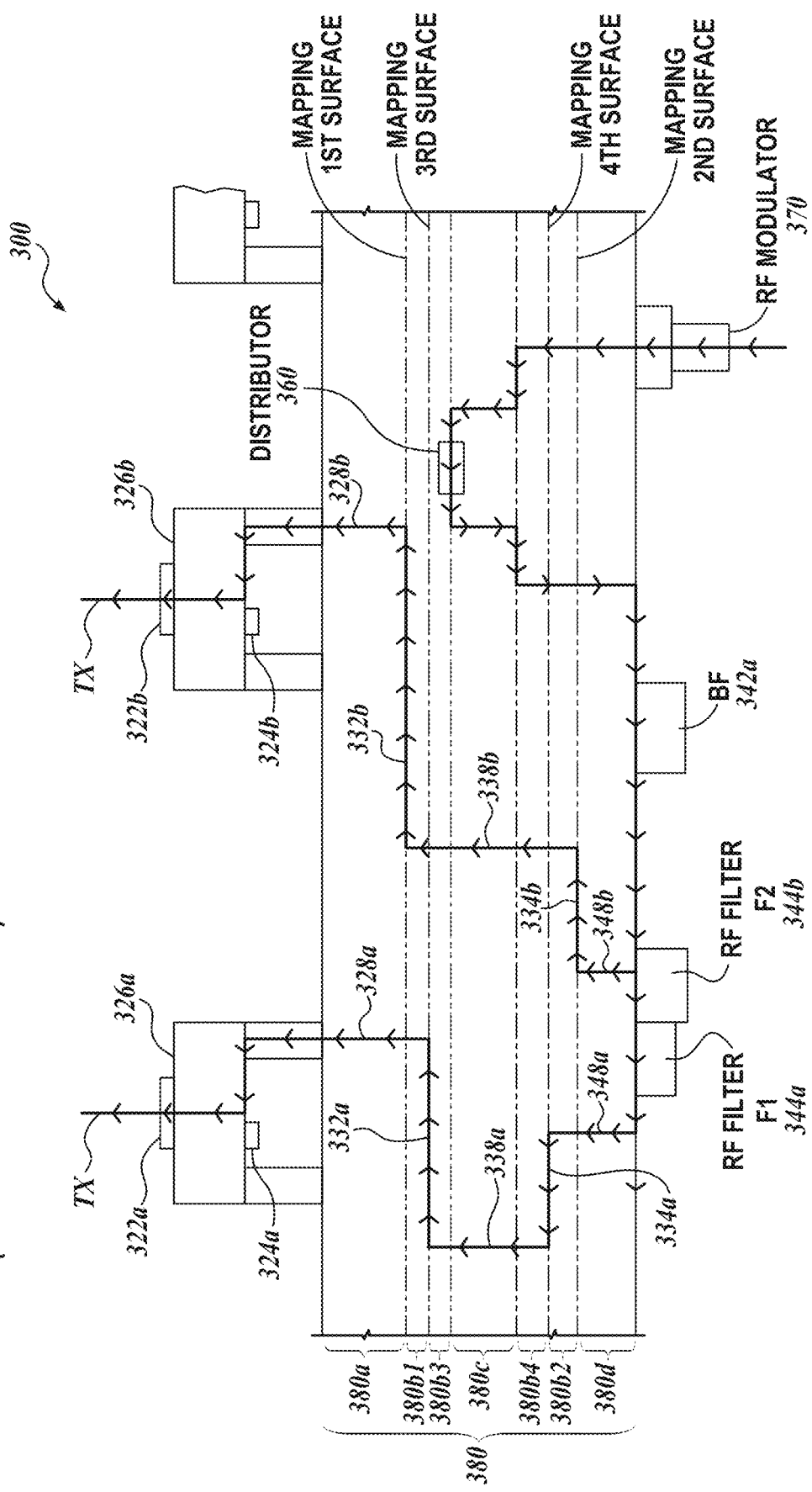
FIG. 3B illustrates a schematic cross section of a plurality of stack-up layers which make up a phased array antenna system in an exemplary transmitting and interspersed system in accordance with the electrical configuration of FIG. 3A.

FIGS. 3A and 3B are directed to another embodiment of the present disclosure. FIG. 3A illustrates an exemplary multi-beam phased array antenna system in accordance with one embodiment of the present disclosure in which eight antenna elements 322i are electrically coupled to one beamformer 342i, with the eight antenna elements 322i being into two different groups of interspersed antenna elements 322a and 322b.

FIG. 3B depicts a partial, close-up, cross-sectional view of an exemplary configuration of the phased array antenna system 300 implemented as a stack-up of a plurality of PCB layers 380 in accordance with embodiments of the present disclosure. The embodiment of FIG. 3B is similar to the embodiment of FIG. 2B, except for differences regarding interspersed antenna elements, the number of mapping layers, and the direction of signals, as will be described in greater detail below Like part numbers are used in FIG. 3B as used in FIG. 3A with similar numerals, but in the 300 series.

In the illustrated embodiment of FIG. 3B, the phased array antenna system 300 is in a transmitting configuration (as indicated by the arrows TX). Although illustrated as in a transmitting configuration, the structure of the embodiment of FIG. 3B may be modified to also be suitable for use in a receiving configuration.

In some embodiments of the present disclosure, the individual antenna elements 322a and 322b may be configured to receive and/or transmit data at different values of one or more parameters (e.g., frequency, polarization, beam orientation, data streams, receive (RX)/transmit (TX) functions, time multiplexing segments, etc.). These different values may be associated with different groups of the antenna elements. For example, a first plurality of antenna elements carried by the carrier is configured to transmit and/or receive signals at a first value of a parameter. A second plurality of antenna elements carried by the carrier are configured to transmit and/or receive signals at a second value of the parameter different from the first value of the parameter, and the individual antenna elements of the first plurality of antenna elements are interspersed with individual antenna elements of the second plurality of antenna elements.

As a non-limiting example, a first group of antenna elements may receive data at frequency f1, while a second group of antenna elements may receive data at frequency f2.

The placement on the same carrier of the antenna elements operating at one value of the parameter (e.g., first frequency or wavelength) together with the antenna elements operating at another value of the parameter (e.g., second frequency or wavelength) is referred to herein as "interspersing". In some embodiments, the groups of antenna elements operating at different values of parameter or parameters may be placed over separate areas of the carrier in a phased array antenna. In some embodiments, at least some of the antenna elements of the groups of antenna elements operating at different values of at least one parameter are adjacent or neighboring one another. In other embodiments, most or all of the antenna elements of the groups of antenna elements operating at different values of at least one parameter are adjacent or neighboring one another.

In the illustrated embodiment of FIG. 3A, antenna elements 322a and 322b are interspersed antenna elements with first antenna element 322a communicating at a first value of a parameter and second antenna element 322a communicating at a second value of a parameter.

Although shown in FIG. 3A as two groups of interspersed antenna elements 322a and 322b in communication with a single beamformer 342a, the phased array antenna system 300 may be also configured such that one group of interspersed antenna elements communicate with one beamformer and another group of interspersed antenna elements communicate with another beamformer.

In the illustrated embodiment of FIG. 3B, the lay-up 380 includes four mapping layers 380b1, 380b2, 380b3, and 380b4, compared to the use of two mapping layers 280b1 and 280b2 in FIG. 2B. Mapping layers 380b1 and 380b2 are connected by intermediate via 338a. Mapping layers 380b3 and 380b4 are connected by intermediate via 338b. Like the embodiment of FIG. 2B, the lay-up 380 of the embodiment of FIG. 3B can allow for selective placement of the intermediate vias 338a and 338b, for example, to be spaced from other components on the top or bottom surfaces of the lay-up 380.

The mapping layers and vias can be arranged in many other configurations and on other sub-layers of the lay-up 180 than the configurations shown in FIGS. 2B and 3B. The use of two or more mapping layers can be advantageous in reducing the lengths of the electrically conductive mapping traces by allowing mapping traces in horizontal planes to cross an imaginary line extending through the lay-up normal to the mapping layers and in selecting the placement of the intermediate vias between the mapping traces. Likewise, the mapping layers can be configured to correlate to a group of antenna elements in an interspersed configuration. By maintaining consistent via lengths for each grouping by using the same mapping layers for each grouping, trace length is the only variable in length matching for each antenna to beamformer mapping for each grouping.

Antenna in Package (AIP) Module

In some embodiments, each antenna element (e.g., antenna element 122i, 222i, or 322i), associated amplifier (e.g., amplifier 124i, 224i, or 324i), and associated circuitry included in the antenna lattice (e.g., antenna lattice 120, 220, or 320) may be configured together as an antenna in package (AIP) module. A plurality of such AIP modules may be located in a particular arrangement on a substrate, board, PCB, baseboard, carrier, panel, layer, or the like to define a particular antenna aperture, such as examples of particular arrangements illustrated in FIGS. 1C and 1D.

Figure 4A:
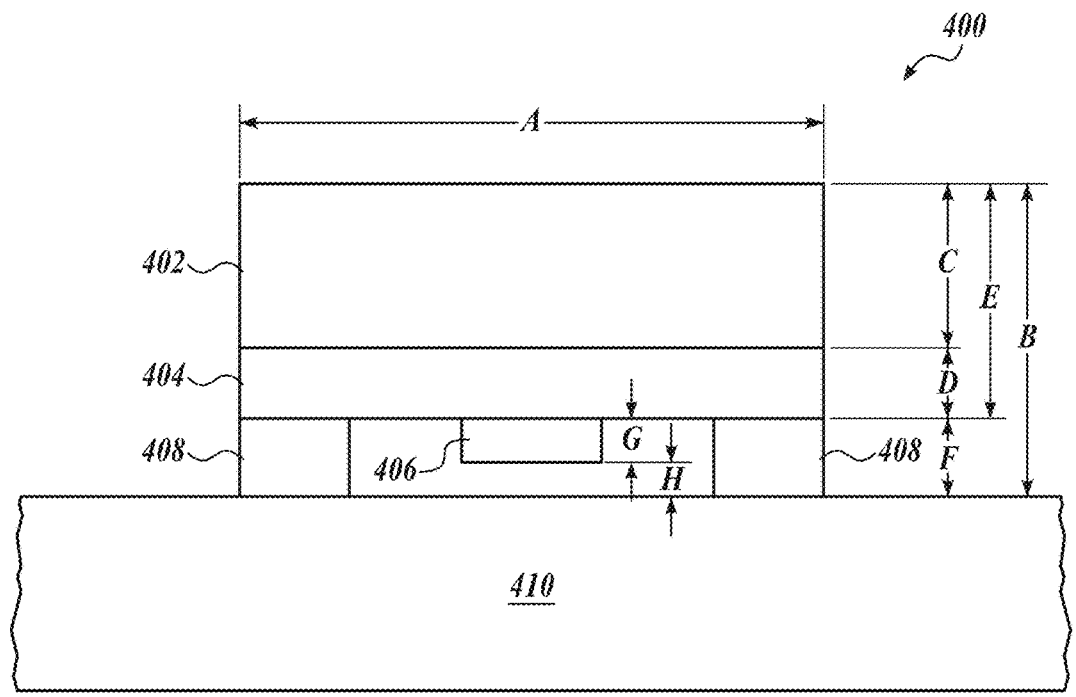
FIG. 4A depicts a block diagram of a cross-sectional side view of an example antenna in package (AIP) module in accordance with some embodiments of the present disclosure.

FIG. 4A depicts a block diagram of a cross-sectional side view of an example AIP module 400 in accordance with some embodiments of the present disclosure. AIP module 400 may include, without limitation, an antenna 402, circuitry 404, amplifier 406, and a frame 408. Circuitry 404 may be disposed between the antenna 402 and frame 408. Amplifier 406 may be disposed at a side of the circuitry 404 furthest from the antenna 402. As will be described in detail below, antenna 402, circuitry 404, amplifier 406, and frame 408 may be physically and/or electrically coupled to each other.

Antenna 402 may comprise an antenna element such as the antenna element 122$i$, 222$i$, or 322$i$, a dipole antenna, a patch antenna, a slot antenna, a micro-strip antenna, a uni-directional antenna, or the like. Circuitry 402 may comprise one or more layers including one or more electronic components, RF circuitry, electronic circuitry, passive electrical elements (e.g., inductors, capacitors, resistors, ferrite beads, etc.), electrical conductive traces, and/or the like configured to facilitate signal propagation between and among antenna 402, amplifier 406, and/or PCB 410 without undue signal degradation or distortion. For example, circuitry 402 may be configured to provide impedance matching. Circuitry 402 may also be referred to as RF circuitry, antenna associated circuitry, passive circuitry, or the like.

Amplifier 406 may comprise a PA (when AIP module 400 is implemented in a transmitter panel) or a LNA (when AIP module 400 is implemented in a receiver panel). Examples of amplifier 406 include, without limitation, amplifier 124$i$, 224$i$, or 324$i$. Amplifier 406 may comprise an application specific integrated circuit (ASIC) and which may be packaged as an integrated circuit (IC) chip. Amplifier 406 may comprise the active circuitry or component within the AIP module 400. Although circuitry 402 and amplifier 406 are depicted as separate elements in FIG. 4A, in some embodiments, circuitry 402 and amplifier 406 may be implemented as a unitary element, circuit, or component.

Frame 408 may be configured to provide a certain amount of vertical spacing or gap between a bottom side of the circuitry 404 and the top side of the PCB 410, the vertical spacing/gap sufficient for amplifier 406: (1) to be located on the underside of the circuitry 40, (2) without contacting the PCB 410, and (3) avoid being damaged when AIP module 400 is attached to the PCB 410. Frame 408, also referred to as a spacer structure, support structure, spacer, picture frame, and/or the like, serves to create a cavity or space for locating the amplifier 406 proximate to or as close as possible to the antenna 402 to minimize signal propagation distance between the antenna 402 and amplifier 406 (e.g., reduce RF transition loss). The RF transition loss between amplifier 406 and the antenna 402 is well below one decibel (dB) of the input power. Frame 408 may also be configured to locate the amplifier 406 proximate to the antenna 402 without adversely impacting the radiation shape or emissive performance associated with the antenna 402. Frame 408 may have an annular shape or substantially an annular shape.

AIP module 400, and in particular, frame 408, may physically and electrically couple to a top side or surface of the PCB 410. PCB 410, also referred to as a baseboard, board, substrate, carrier, panel, layer, stack, or the like, may comprise, for example, carrier 112 or the lay-up 180. In some embodiments, PCB 410 may comprise a transmitter panel, a receiver panel, or a portion thereof. When viewed from the top, PCB 410 may be circular in shape and have a diameter in the range of 20-40 inches. Alternatively, PCB 410 may have a square shape, a rectangular shape, or other shape. A plurality of the AIP modules 400 may be arranged on the PCB 410 in a particular pattern, such as illustrated in FIG. 1C or 1D.

In some embodiments, the AIP module 400 may have a width or diameter A in the range of 5 to 12 millimeter (mm), and a height or thickness B in the range of 0.5 to 3 mm. AIP module 400 may have a circular or square shape when viewed from the top, as will be described in detail below, and thus, may have a depth similar to that of the width/diameter A.

As an example, AIP module 400 configured as a transmitter (TX) AIP module may have the following dimensions: overall width/diameter A of approximately 7 mm, overall height/thickness B of approximately 3 mm, antenna 402 height or thickness C of approximately 2.2 mm, circuitry 404 height or thickness D of approximately 0.46 mm, a height or thickness E of approximately 2.66 mm, frame 408 height or thickness F of approximately 0.4-0.5 mm, amplifier 406 height or thickness G of approximately 0.25 mm, and a gap or free space H between the amplifier 406 and PCB 410 of approximately 0.15-0.2 mm.

Antenna 402 may be associated with a particular operating frequency. In some embodiments, the diameter/width A of the antenna 402 may relate to the operating frequency of the antenna 402.

Figure 4B:
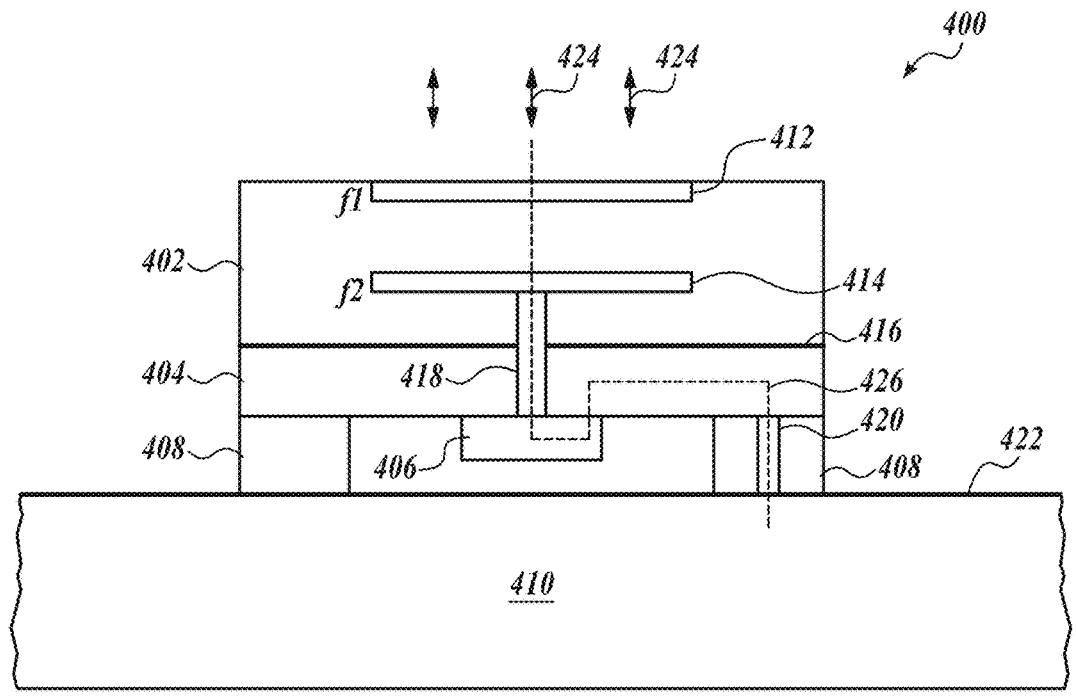
FIG. 4B depicts a more detailed cross-sectional side view of the AIP module of FIG. 4A according to some embodiments of the present disclosure.

FIG. 4B depicts a more detailed cross-sectional side view of the AIP module 400 of FIG. 4A according to some embodiments of the present disclosure. In some embodiments, antenna 402 may include top and bottom plates 412, 414 which may comprise conductive or metallic flat plates. Top and bottom plates 412, 414 may be overlaid over each other and separated by a dielectric material (not shown). Top and bottom plates 412, 414 may be different sizes from each other (e.g., bottom plate 414 may have a large diameter or width than top plate 412).

Top plate 412 may be located at or close to a top side of the AIP module 400 and furthest from the PCB 410, a bottom plate 414 disposed between the top plate 412 and circuitry 404, and a ground plane/layer 416 disposed between the bottom plate 414 and circuitry 404. Major planes of the top and bottom plates 412, 414 may be oriented parallel to each other, and their centers may be collinear (or substantially collinear) in a direction perpendicular to a major plane of the PCB 410.

Top and bottom plates 412, 414 may have no direct physical coupling with each other (e.g., a dielectric material may be disposed between top and bottom plates 412, 414) and may instead, exhibit radiative coupling to emit radiation 424 (if configured as a transmitter AIP module) or receive radiation 424 (if configured as a receiver AIP module) on a top side of the AIP module 400 (e.g., opposite the side of the AIP module 400 that physically attaches to the PCB 410). The radiation emitting or receiving side may also be referred to as a radiating side or antenna side of the AIP module 400. Top and bottom plates 412, 414 may also be referred to as top and bottom radiating elements or antennas, respectively.

Top plate 412 may be configured to radiate at a frequency f1 and bottom plate 414 may be configured to radiate at a frequency f2 different from frequency f1. Ground plane/layer 416 and/or ground plane/layer 422 at the PCB 410 may facilitate emission of radiation in a direction away from the top side of the antenna 402 (also referred to as uni-directional radiation or beam direction) as opposed to toward the PCB 410, for instance, and/or generation of radiation 424 having certain radiation characteristics (e.g., full bandwidth of desired frequencies, certain beam shape, certain beam direction, etc.).

A RF transition via 418 may electrically couple the bottom plate 414 to amplifier 406, and the amplifier 406, in turn, may electrically couple to PCB 410. A signal pathway length associated with RF transition via 418 may thus be short (e.g., approximately 0.5 mm or less) and RF transition loss associated with supplying signals to or receiving signals from the antenna 402 may be reduced or minimized.

Other types of antennas are also contemplated for antenna 402. In some embodiments, the height/thickness C of antenna 402 may depend upon the type of antenna comprising antenna 402.

Frame 408 includes a RF via 420 configured to electrically couple the PCB 410 to the AIP module 400. In some embodiments, RF via 420 may extend through the height/thickness of frame 408, and electrically couple with circuitry 404 at one end and PCB 410 at the opposite end. RF via 420 receives RF signals from the PCB 410, such as RF signals from a beamformer to be transmitted as radiation 424, or transmits RF signals to the PCB 410, such as RF signals associated with the radiation 424 received by the antenna 402.

In some embodiments, if AIP module 400 is configured on a transmitter panel, a signal pathway 426 within AIP module 400 may comprise receiving RF signals from PCB 410 at RF via 420, the RF signals propagating to circuitry 404 and then to amplifier 406, the amplifier 406 actively processing the RF signals (e.g., power amplifying the RF signals) into processed RF signals, providing the processed RF signals through the RF transition 418 to antenna 402, the antenna 402 generating radiation 424 in accordance with the processed RF signals, and lastly, radiation 424 emitted from the top side of the AIP module 400. Conversely, if AIP module 400 is configured on a receiver panel, signal pathway 426 within AIP module 400 may be the reverse of the description above. Namely, radiation 424 detected by the antenna 402 is converted into RF signals and sent to amplifier 406 via RF transition 418, the amplifier 406 then actively processing the received RF signals (e.g., applying low noise amplification) into processed RF signals, propagating the processed RF signals to circuitry 404 and RF via 420, and lastly, the processed RF signals may exit RF via 420 to PCB 410.

In some embodiments, antenna 402, circuitry 404, and amplifier 406 may collectively be referred to as an AIP. The AIP along with the frame 408 may together be referred to as the AIP module 400.

In some embodiments, each of antenna 402, circuitry 404, amplifier 406, and frame 408 may be separately fabricated and then assembled together to form the AIP module 400. Alternatively, antenna 402 and circuitry 404 may be fabricated together; circuitry 404 and amplifier 406 may be fabricated together; antenna 405, circuitry 404, and amplifier 406 may be fabricated together, or the like and then assembled together with the remaining components of the AIP module 400. In some embodiments, a plurality of AIPs may be fabricated on a single wafer, diced or cut into individual AIPs, individual AIPs tested for quality control, and then attach a frame to each AIP of the plurality of AIPs that satisfy quality requirements to form a respective plurality of AIP modules 400.

Such modular approach to fabricating, testing, and/or locating a plurality of antenna elements and associated components/circuitry of an antenna lattice reduces manufacturing cost, weight, and/or the like. A plurality of antenna structures of an antenna lattice need not be fabricated together on a single board configured in the desired arrangement (e.g., space taper, interspersed, etc.) and then tested, in which individual antenna structures deemed defective are electrically isolated from the antenna lattice and not used. To account for manufacturing variances, a certain number of defective antenna structures, or the like, more than a desired number of antenna structures may need to be fabricated on the single board, which adds to the overall cost and weight. Alternatively, locating the antenna elements as well as the associated components/circuitry of the antenna lattice on top of a board avoids having to locate antenna elements directly on top of a board layer and the remaining components/circuitry of the antenna lattice within the board layer and/or require additional layers in order to satisfy antenna radiative requirements (e.g., certain distance between antenna radiative element and ground plane). The board layer or additional layers may be a special layer that is more expensive than other layers comprising the panel, or the height/thickness of such layer(s) may be (significantly) greater than that of the other layers comprising the panel, contributing to overall weight and size of the panel.

Figure 5A:
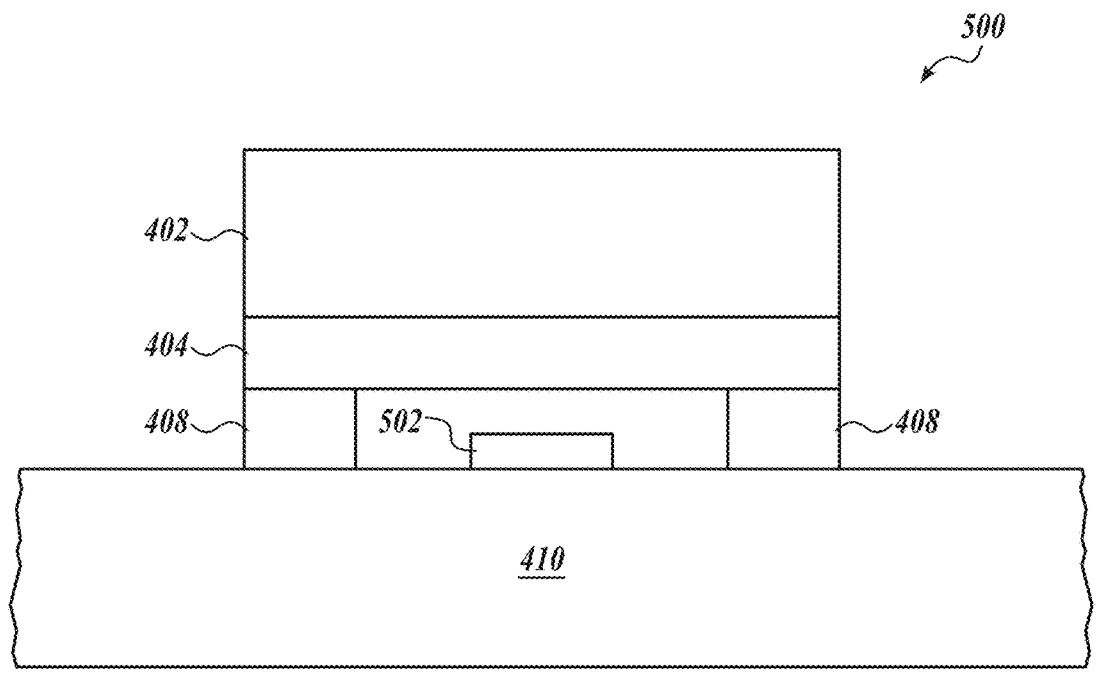
FIGS. 5A-5E depict block diagrams of cross-sectional side views of example AIP modules in accordance with alternative embodiments of the present disclosure.

FIGS. 5A-5E depict block diagrams of cross-sectional side views of example AIP modules in accordance with alternative embodiments of the present disclosure. Each of AIP modules 500, 510, 520, 530, 540 may comprise an alternative implementation of the AIP module 400. In FIG. 5A, AIP module 500 may be similar to AIP module 400 except amplifier 502 of AIP module 500 may be attached to the top of PCB 410, rather than physically connecting to the underside of circuitry 404, as is shown for amplifier 406 of AIP module 400. Otherwise, amplifier 502 may be similar to amplifier 406. In still other embodiments, as described above for AIP module 400, circuitry 404 may be included with amplifier 502.

Figure 5B:
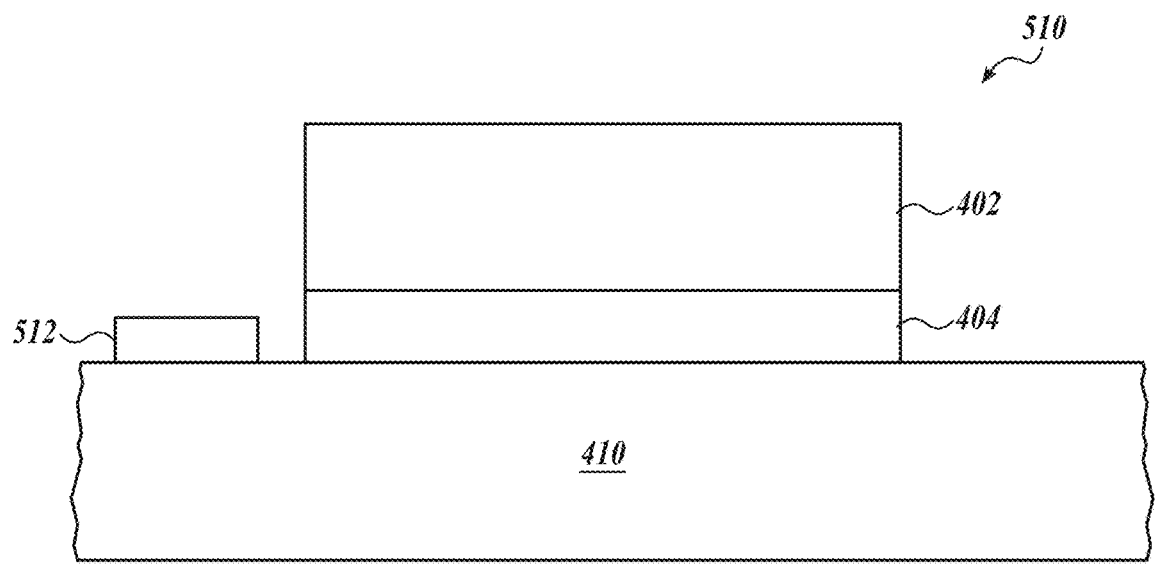

FIG. 5B illustrates AIP module 510 that may be similar to AIP module 400 except AIP module 510 omits frame 408. For AIP module 510, circuitry 404 may be disposed between antenna 402 and PCB 410. Circuitry 404 may physically couple to the top of PCB 410. Amplifier 512 may also physically couple to the top of PCB 410, rather than on the underside of circuitry 404, as is the case with amplifier 406 for AIP module 400. With antenna 402/circuitry 404 and amplifier 512 located next to each other on PCB 410, the overall width of AIP module 510 may be greater than that of dimension A of AIP module 400.

Figure 5C:
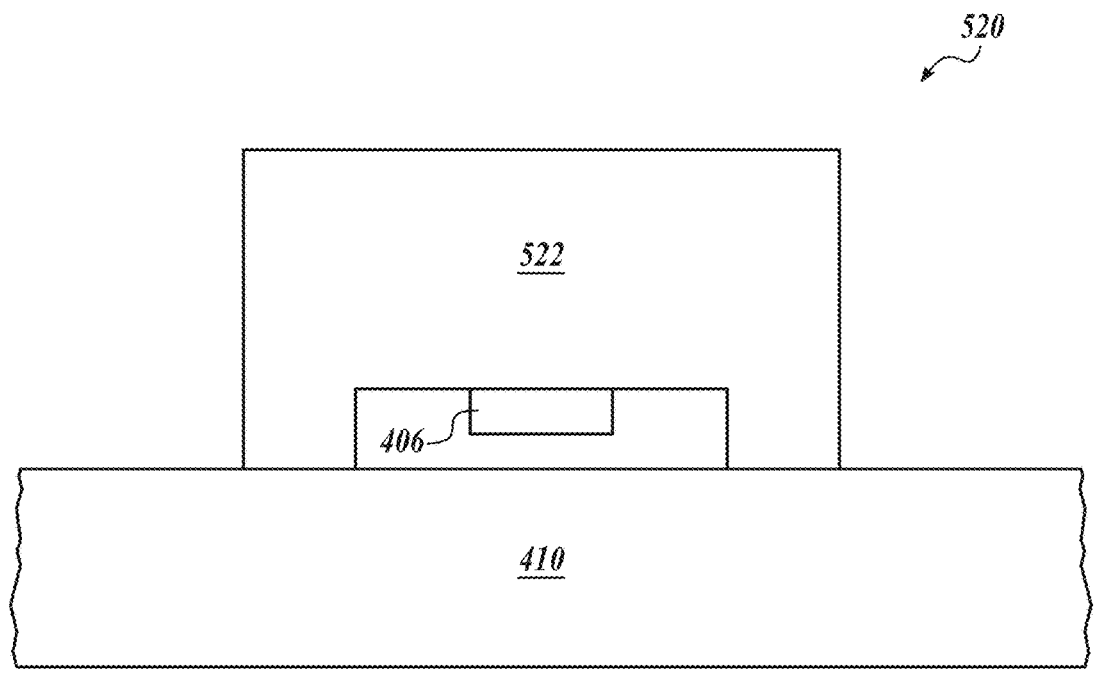
Figure 5D:
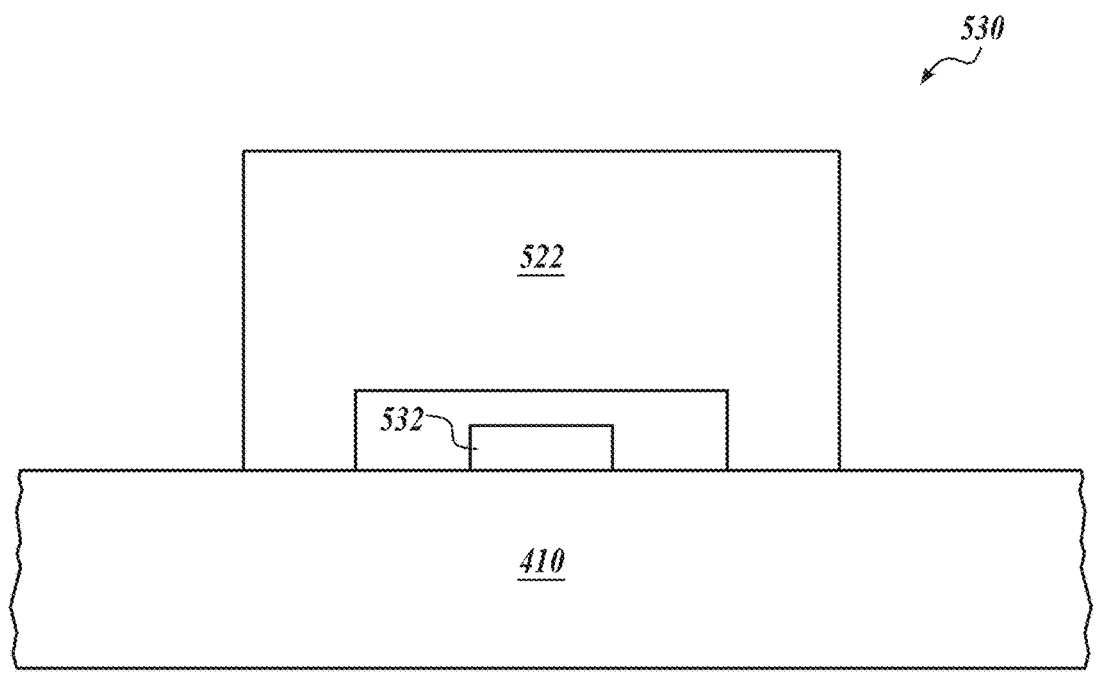

FIG. 5C illustrates an AIP module 520 that is a more integrated or unitary version of AIP module 400. Rather than fabricating the frame 408 separate from antenna 402/circuitry 404 and then attaching to each other, frame 408 and antenna 402/circuitry 404 may be formed as a unitary structure 522. Antenna 402 and circuitry 404 included in unitary structure 522 may or may not be integrally formed together. Amplifier 406 may subsequently attach to the underside of such unitary structure 522, and the resulting structure physically and electrically coupling to the top of the PCB 410. FIG. 5D illustrates an AIP module 530 similar to AIP module 520 except the amplifier may attach to the top of PCB 410 (shown as amplifier 532). AIP module 530 may also considered to be a more integrated or unitary version of AIP module 500.

Figure 5E:
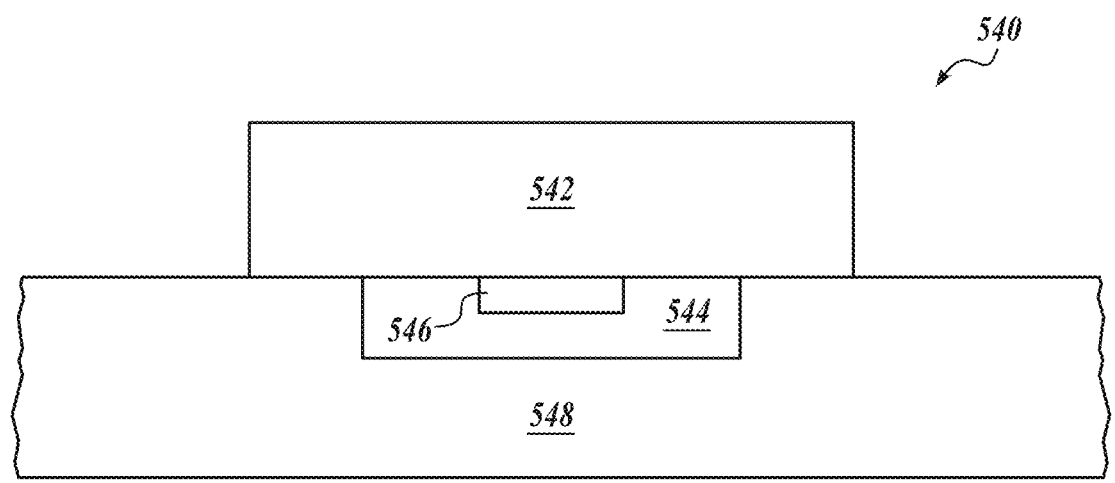

FIG. 5E illustrates an AIP module 540 configured to be positioned over a trench or cavity 544 formed at a top side of a PCB 548. AIP module 540 may comprise an antenna/circuitry 542 and an amplifier 546 disposed below the antenna/circuitry 542, the amplifier 546 located within the space formed by trench/cavity 544. AIP module 540 may exclude a frame such as frame 408. Antenna/circuitry 542 may or may not be integrally formed together (e.g., may be similar to antenna 402 and circuitry 404, or antenna and circuitry may comprise a unitary component).

It is contemplated that one or more of the antenna, circuitry, amplifier, or frame of AIP modules 400, 500, 510, 520, 530, 540 may comprise a plurality of layers, include lamination layer(s), ground layer(s)/plane, and/or other structures.

Figure 6A:
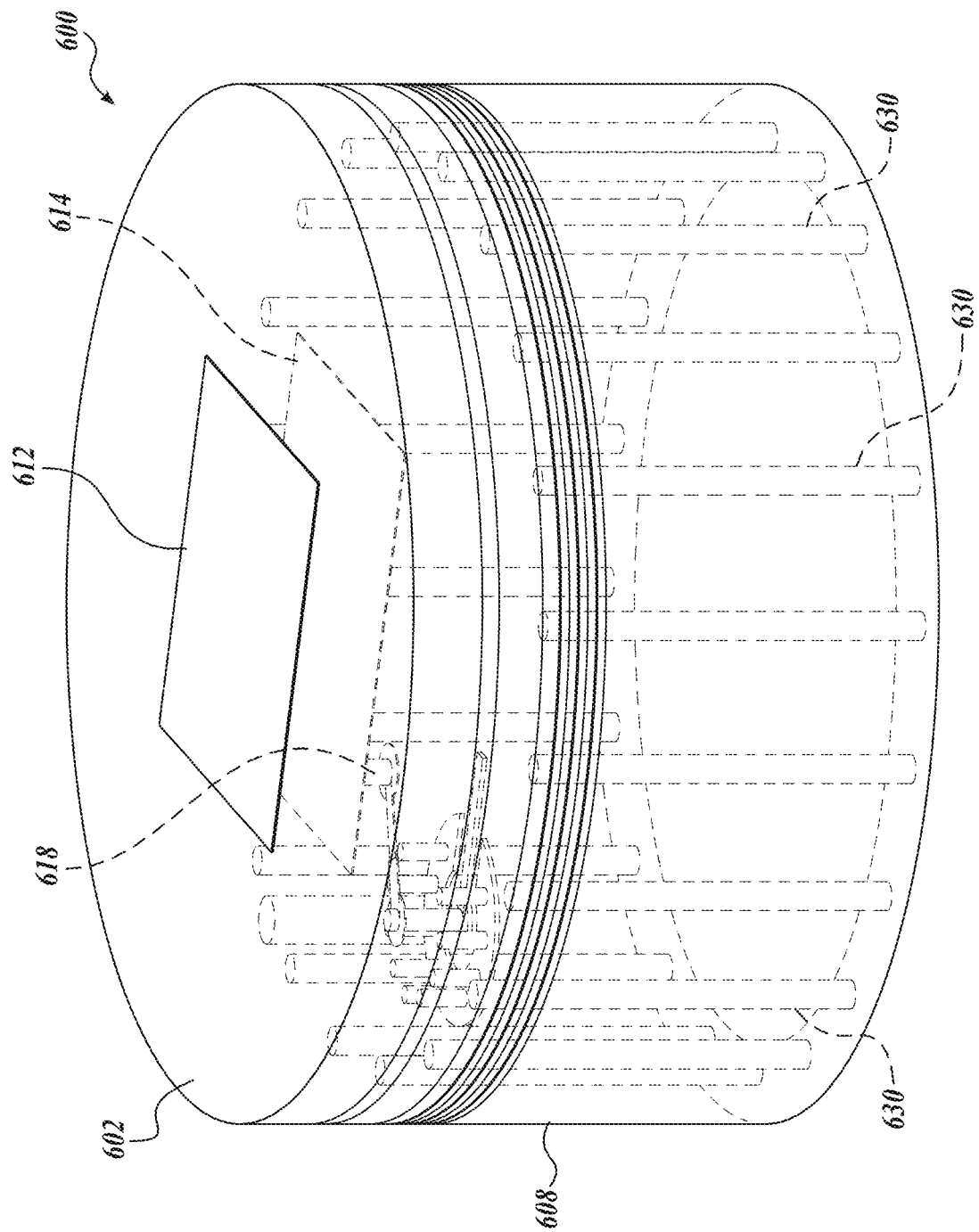
FIGS. 6A-6B depict additional views of the AIP module of FIG. 4A configured as a receiver or receiving AIP module according to some embodiments of the present disclosure.
Figure 6B:
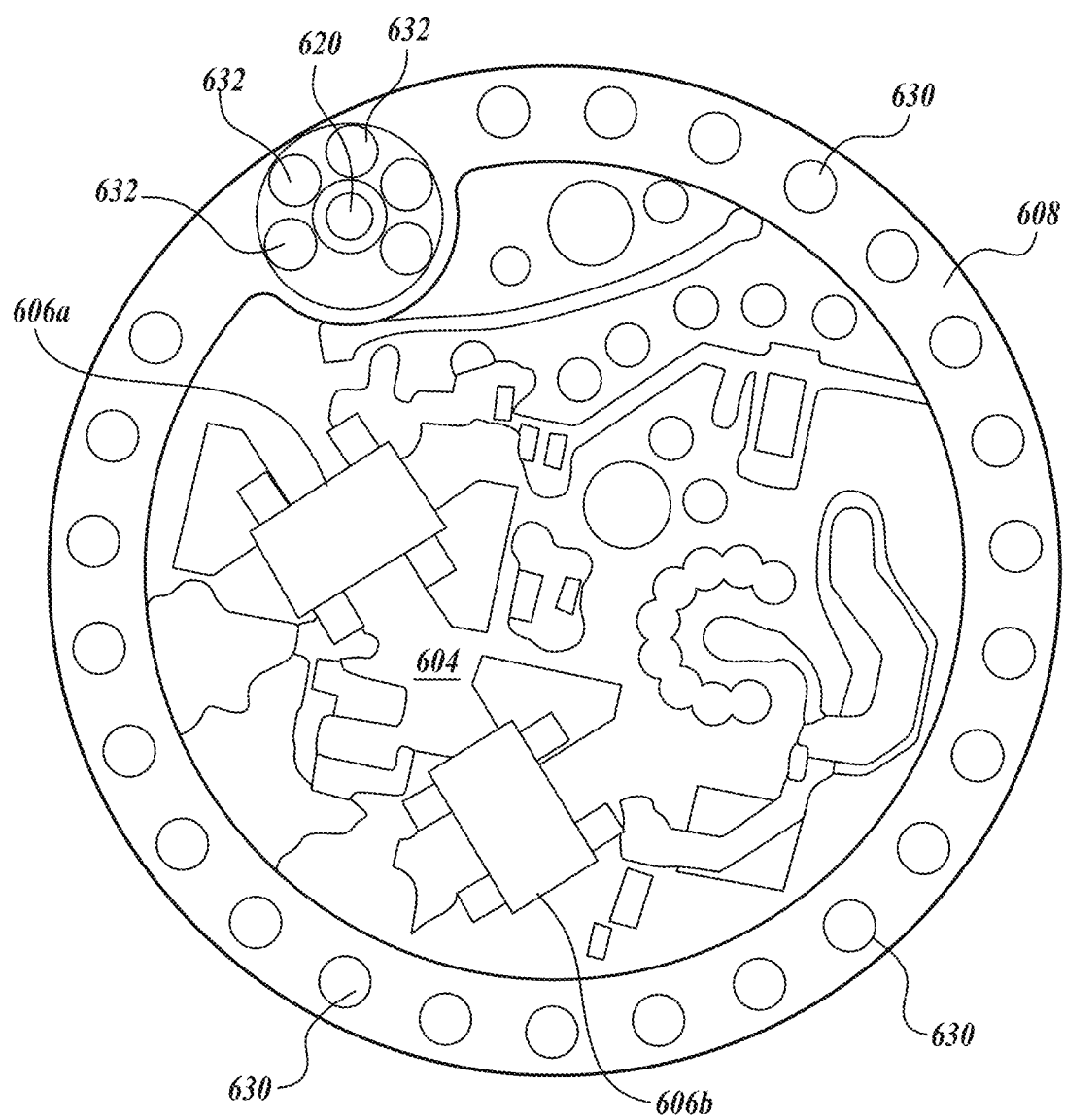

FIGS. 6A-6B depict additional views of AIP module 400 configured as a receiver or receiving AIP module 600 (e.g., included in a receiver panel) according to some embodiments of the present disclosure. FIG. 6A depicts a perspective view of AIP module 600 and FIG. 6B depicts a bottom view of AIP module 600, according to embodiments of the present disclosure. Like reference numbers are used in FIGS. 6A-6B as used in FIGS. 4A-4B except in the 600 series.

Top and bottom plates 612, 614 may comprise an antenna 602. RF transition via 618 may electrically couple antenna 602 to circuitry 604 and/or amplifier 608.

Frame 608 may comprise a hollowed out cylinder or a ring/donut of a certain height or thickness. Embedded within frame 608 may be a RF via 620, a plurality of vias 630, and a plurality of vias 632. Each of the RF via 620, plurality of vias 630, and plurality of vias 632 may extend through the full height/thickness of the frame 608; one ends of the vias 620, 630, 632 coplanar with the top of the frame 608 and configured to electrically couple with appropriate structures; and the opposite ends of the vias 620, 630, 632 coplanar with a bottom/underside of the frame 608 and configured to electrical couple with appropriate structures. As shown in FIG. 6B, the plurality of vias 630 may be distributed substantially all throughout frame 608 (e.g., more than 180 degrees, more than 270 degrees, more than three quadrants of the frame 630) in a substantially circumferential arrangement within frame 608. Each via of the plurality of vias 630 may be located at a same radius from the center of the frame 608. RF via 620 may be located at a same radius from the center as any of the vias 630 or closer to the center than any of the vias 630. Plurality of vias 632 may be configured to encircle (or substantially encircle) or be in proximity to RF via 620.

Vias 620 and 630 may be configured to be electrical coupling lines (or associated with electrical connections) with chip package pins of the amplifier 606 (e.g., an LNA). In FIG. 6B, amplifier 606 is implemented as two amplifier chips 606a, 606b. The combined circuitry of amplifier chips 606a, 606b plus one or more traces located in the same layer as the amplifier chips 606a, 606b may form a two-stage amplifier. Amplifier chips 606a, 606b may comprise LNAs.

For example, without limitation, various particular ones of the plurality of vias 630 may be associated with particular ground, digital, clock, power in ($V_{DD}$), redundant power in ($V_{DD1}$), data, floating, and/or other pins of the amplifier 606. Others of the plurality of vias 630 may facilitate reducing signal leakage or coupling, as will be discussed in detail below. RF via 620 may be associated with carrying (RF) signals into or out of the AIP module 600 from or to PCB 410. RF via 620 may also electrical couple to the output RF pin of the amplifier 606. Vias 632 may be configured to provide RF shielding or electrical isolation for RF via 620. Each of the vias 620, 630, 632 may have a diameter in the range of 0.25 to 0.6 mm.

In some embodiments, AIP module 600 (and AIP module 400 in general) may have an overall round or circular shape when viewed from the top or bottom (as shown in FIG. 6B). AIP module 600 may thus have an overall cylindrical shape.

Such shape facilitates ease of AIP module positioning within a plurality of AIP modules. For instance, after an AIP module is initially placed on PCB 410, the AIP module may be rotated about a centerline axis perpendicular to a major plane of the PCB 410 in order to align, for example, RF via 620 of frame 608 to corresponding electrical connection location in PCB 410, or to orient the AIP module to emit or receive radiation at a preferred angle. The AIP module may be rotated by any degree without bumping into adjacent structure(s), since a circular/round shape has no edges, protrusions, or change in contour with respect to different sides. A plurality of AIP modules may be positioned/oriented to form a desired antenna aperture in accordance with a sequential rotation scheme or design, in which each AIP module of the plurality of AIP modules may be at a particular rotation or orientation. In alternative embodiments, AIP module 600 (and AIP module 400 in general) may have a square, rectangular, or other shape when viewed from the top or bottom.

Figure 7A:
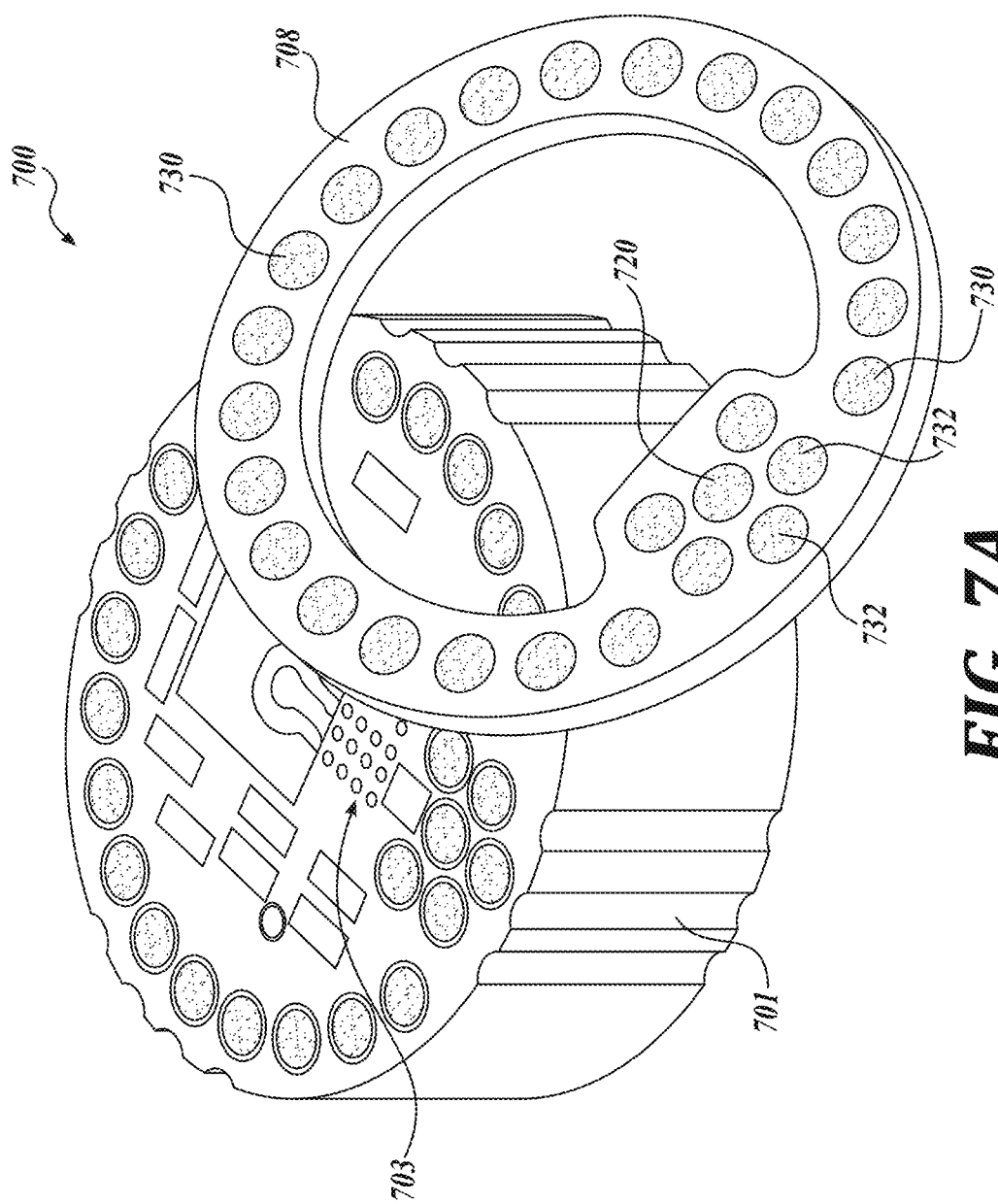
FIGS. 7A-7C depict additional views of AIP module of FIG. 4A configured as a transmitter or transmitting AIP module according to some embodiments of the present disclosure.
Figure 7B:
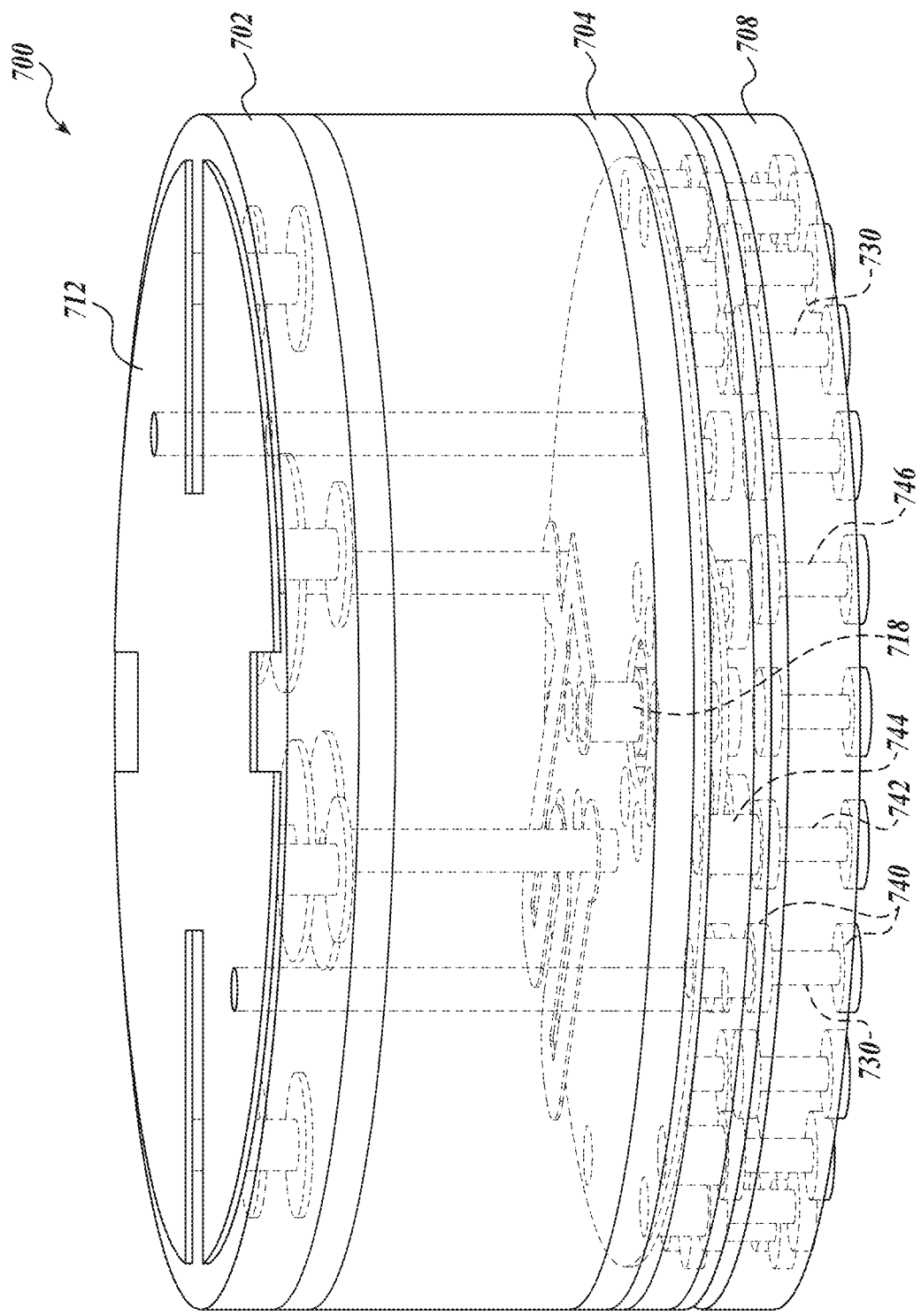
Figure 7C:
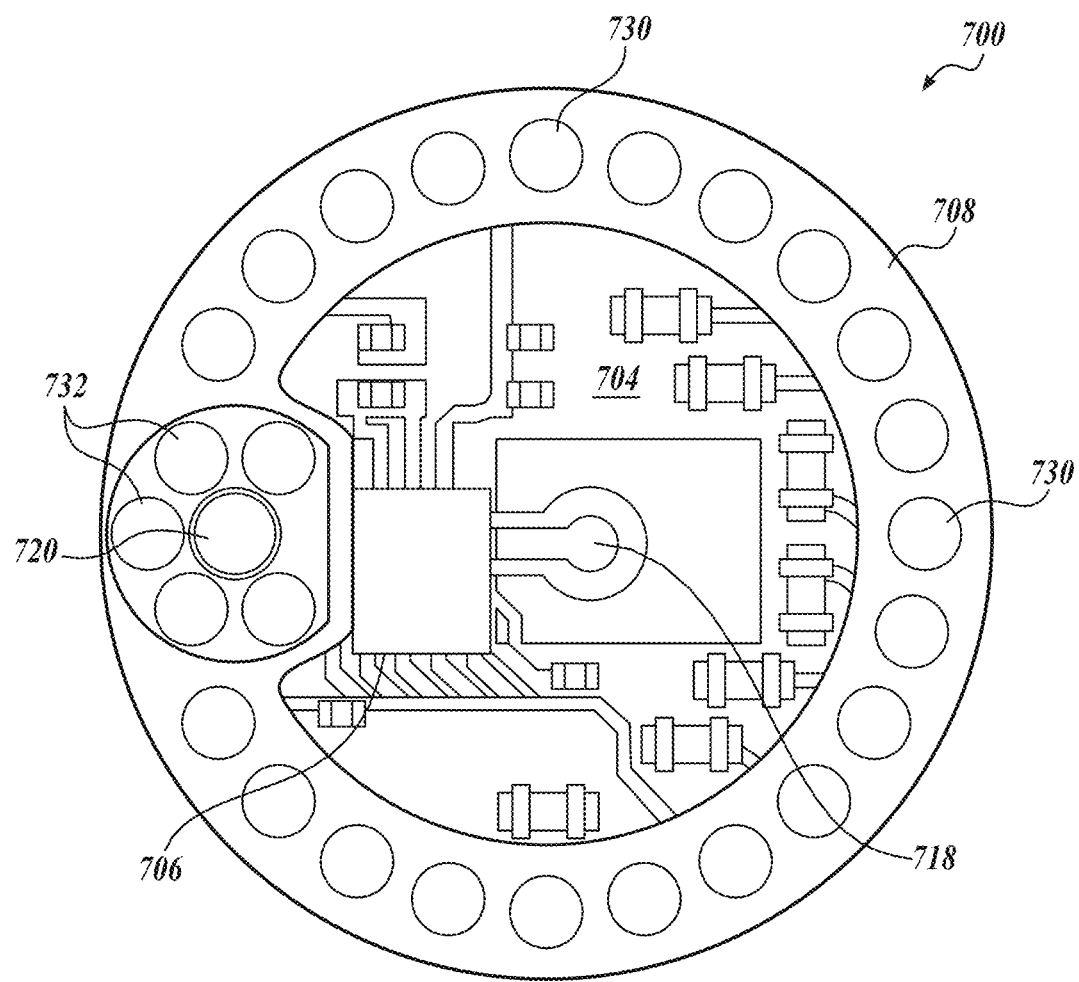

FIGS. 7A-7C depict additional views of AIP module 400 configured as a transmitter or transmitting AIP module 700 (e.g., included in a transmitter panel) according to some embodiments of the present disclosure. FIGS. 7A-7B depict perspective views of AIP module 700 and FIG. 7C depicts a bottom view of AIP module 700, according to embodiments of the present disclosure. Like reference numbers are used in FIGS. 7A-7C as used in FIGS. 4A-4B and 6A-6B except in the 700 series.

FIG. 7A shows AIP module 700 prior to attachment of frame 708 to the underside of AIP 701 (e.g., antenna and circuitry). As shown, AIP 701 resembles a circular disk or hockey puck. Amplifier 706 (e.g., PA) may attach to location 703 on the underside of AIP 701. Similar to the description above for AIP module 600, frame 708 of AIP module 700 may include a plurality of vias 730, a plurality of vias 732, and a RF via 720, each of which extend the height/thickness of frame 708. The plurality of vias 730 may be configured to provide electrical shielding functionalities to the AIP module 700, and the plurality of vias 732 may be configured to provide electrical shielding/isolation to RF via 720.

Vias 720, 730, and 732 may be similar to respective vias 620, 630, and 632 except the electrical coupling lines may be with chip package pins of the amplifier 706 (e.g., a PA) instead of amplifier 606.

RF transition vias 418, 618, 718 may also be referred to as feed vias, feedlines, or the like. RF vias 420, 620, 720 may also be referred to as RF input/output vias, AIP-panel transition vias, AIP-panel interface vias, or the like.

In some embodiments, one or more dimensions of AIP module 600 configured for receiver panels may differ from dimensions of AIP module 700 configured for transmitter panels. For instance, the width/diameter of AIP module 600 may be 12 mm, the height/thickness of AIP module 600 may be 2.2 mm, and the height/thickness of frame 608 may be 4 mm, while the width/diameter of AIP module 700 may be 7 mm, the height/thickness of AIP module 700 may be 3 mm, and the height/thickness of frame 708 may be 0.5 mm.

In some embodiments, the type, arrangement, and/or shape of antenna 702 or portions thereof configured for use in a transmitter panel may be the same or differ from antenna 602 configured for use in a receiver panel. For instance, plate 712 included in antenna 702 differs in shape from top plate 612 of antenna 602. Plate 712 is illustrated as a circular plate that further includes a plurality of slots. Top plate 612 is illustrated as a square or rectangular shaped plate without any cutouts. As will be described in detail below, antenna 602 and/or 702 may further include one or more cutouts or other contours.

AIP Module Vias

Figure 8:
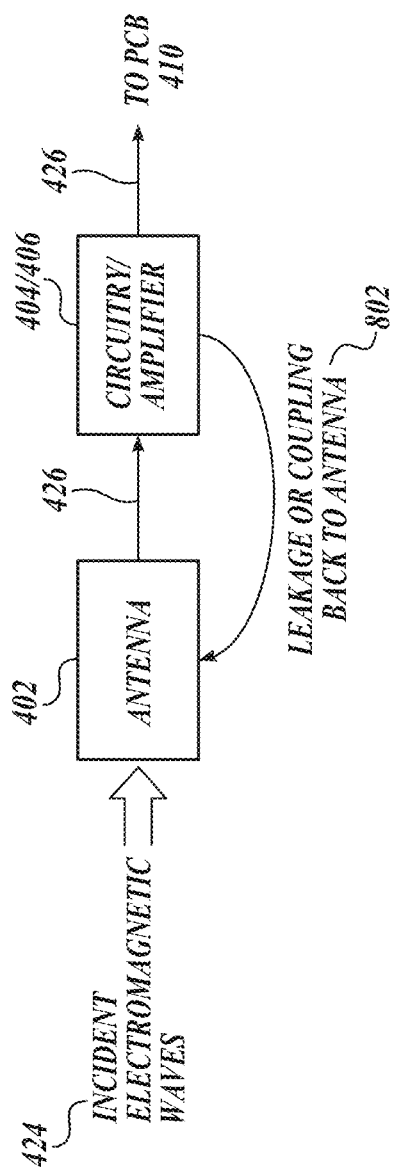
FIG. 8 depicts a block diagram showing a signal leakage or coupling loop associated with an AIP module according to some embodiments of the present disclosure.

Returning to FIG. 4B, in some embodiments, circuitry 404/amplifier 406 of AIP module 400 may be configured to provide a gain in the range of approximately 25 dB to incident electromagnetic waves received by the antenna 402 (e.g., radiation 424). In some cases, in addition to such received signal propagating along the signal pathway 426 from antenna 402 to PCB 410, signal leakage or coupling 802 may also occur from circuitry 404/amplifier 406 back to antenna 402, as illustrated in FIG. 8. Signal leakage or coupling 802 may cause a closed loop to be created comprising an infinite cycle of amplification. Sufficient amplification, in turn, may result in generation of undesirable oscillation for AIP module 400.

In some embodiments, one or more shielding vias may be included in AIP module 400 to reduce, minimize, block, eliminate, or otherwise address the signal leakage or coupling 802. The one or more shielding vias may be configured to cause the coupling 802 to be less than the amount of gain provided by the circuitry 404/amplifier 406.

The one or more shielding vias may be included in frame 408 of AIP module 400. In the context of a receiving AIP module, frame 608 of receiving AIP module 600 may include the one or more shielding vias, in which the one or more shielding vias may comprise one or more vias of the plurality of vias 630 (see FIGS. 6A-6B). In some embodiments, a first subset of the plurality of vias 630 may comprise electrical connections to amplifier 406 and/or circuitry 404 while a second subset of the plurality of vias 630 (the non-first subset or remaining vias of the plurality of vias 630) may comprise the one or more shielding vias. Vias of the first and second subsets may be interspersed with each other within the frame 608 and not segregated together according to functionality within frame 608.

Figure 9:
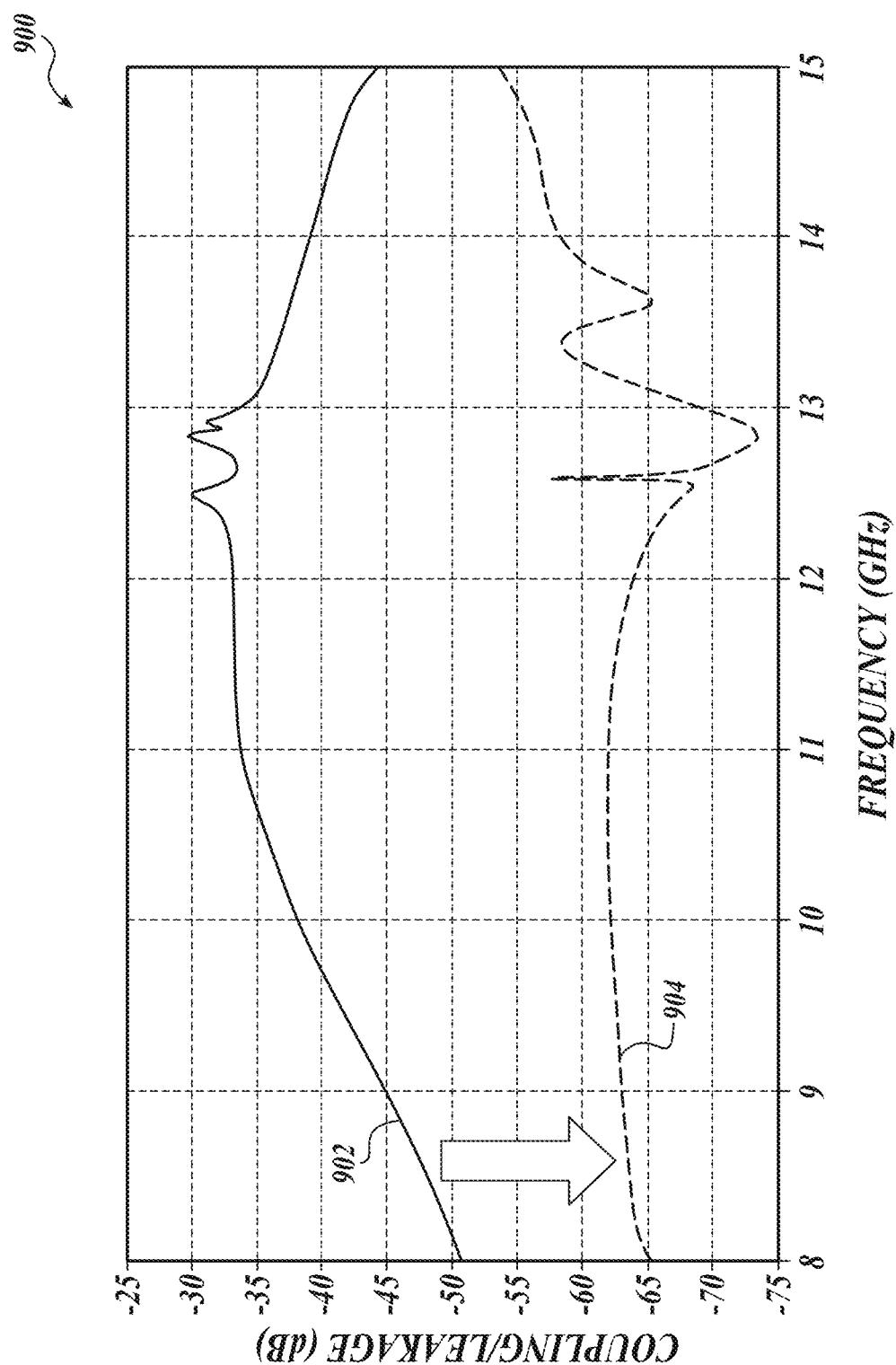
FIG. 9 depicts a graph illustrating simulation results obtained with an embodiment of a receiving AIP module according to some embodiments of the present disclosure.

FIG. 9 depicts a graph 900 illustrating simulation results obtained with an embodiment of a receiving AIP module according to some embodiments of the present disclosure. Graph 900 illustrates the decrease in coupling level (e.g., coupling 802) which may be achieved with the inclusion of the one or more shielding vias in the frame of the receiving AIP module. In graph 900, the horizontal axis represents frequency in GHz and the vertical axis represents coupling level 802 in dB, which is also referred to as S21 in a two port network. Line 902 shows the coupling coefficient $S_{12}$ as a function of frequency for an AIP module without shielding vias. Line 904 shows the coupling coefficient $S_{12}$ as a function of frequency for an AIP module with shielding vias included in the frame, in which both ends of the shielding vias are grounded. At all frequencies between 8 to 15 GHz, line 904 is at a lower coupling level compared to line 902. For some frequencies, such as at approximately 12.5 GHz, the amount of coupling for an AIP module with shielding vias may be approximately 30 dB less than an AIP module without shielding vias. Such reductions in coupling level permit avoidance of unwanted oscillations.

Figure 10:
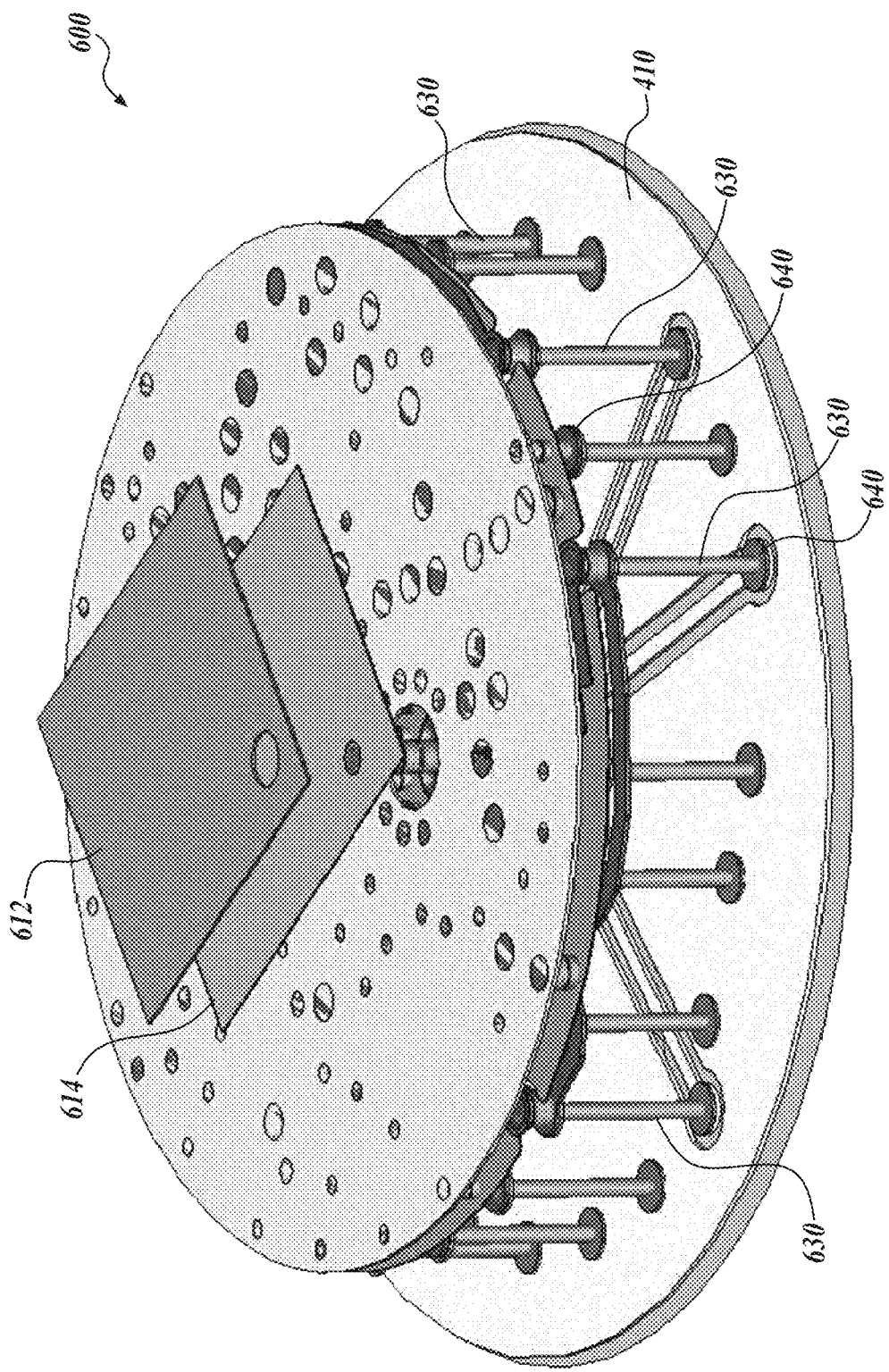
FIG. 10 depicts a perspective view of an AIP module with one or more outer structures and intermediating layers removed to ease illustration of internal structures according to some embodiments of the present disclosure.

FIG. 10 depicts a perspective view of AIP module 600 with one or more outer structures and intermediating layers removed to ease illustration of internal structures according to some embodiments of the present disclosure. For example, the outer structure of the frame 608 is removed to expose the plurality of vias 630 located within. Each via of the plurality of vias 630 may include conductive pads 640 at both ends. The plurality of vias 630 may also be referred to as legs, as they resemble legs of a table as shown in FIG. 10.

At least the second subset of vias of the plurality of vias 630 (those vias not associated with electrical connections to amplifier 606 and/or circuitry 604) may also be referred to as a shielding vias, de-coupling vias, RF shielding vias, RF circuit shielding vias, guardian vias, open vias, and the like. In some embodiments, the greater the number of vias in the second subset, the greater the reduction of coupling 802 in the AIP module. As the number of vias in the second subset increases, the closer the vias collectively approach a continuous electrical shield. The number of vias in the second subset configured in an AIP module may depend upon available space not occupied by vias of the first subset (those vias associated with electrical connections to amplifier and/or circuitry), a minimal separation distance between adjacent vias to prevent physical coupling therebetween, and/or manufacturing constraints.

The lengths of vias 620, 630, and 632 may be oriented perpendicular to the major plane of the PCB 410. Vias mentioned in the present disclosure including, without limitation, vias 618, 620, 630, 632, and the like, may comprise conductive or metallic vias.

The discussion above of shielding vias is also applicable to transmitter AIP modules, such as AIP module 700. As shown in FIG. 7B, each via of the plurality of vias 730 of AIP module 700 may include conductive pads 740 at both ends. Moreover, via 742 is an example of a via of the first subset, in which a via 744 located directly above and electrically coupled to via 742, in combination, establishes an electrical pathway to amplifier 706 and/or circuitry 704. Via 746 is an example of a via of the second subset. Notice that there is no via similar to via 744 in association with via 746. Both vias 742 and 746 may be similarly designed and fabricated, even though the vias serve different functions from each other.

In some embodiments, each via of the second subset may be electrically grounded at both ends while only selective vias of the first subset may be electrically grounded at one or both ends depending on circuit layout of the circuitry/amplifier. Moreover, the length of the plurality of vias included in the frame and, by extension, the height or thickness of the frame may be configured to facilitate generation of a desired radiation pattern or profile. In some embodiments, the vias included in the frame may extend the full height/thickness of the frame. Thus, the length of the vias may equal the height/thickness of the frame (e.g., see FIGS. 6A and 7B). Via length or frame height/thickness may in the range of 0.5 to 4 mm, for example.

One or more particular desired radiation characteristics may be the basis for selection of the via length within the frame. Such radiation characteristics may comprise, without limitation: minimum directivity, maximum directivity, worst case (or worst peak) SLL, best case or (best peak) SLL, maximum axial ratio (AR), minimum AR, half power beam width (HPBW), worst radiation efficiency, worst total efficiency, and/or the like.

Figure 11A:
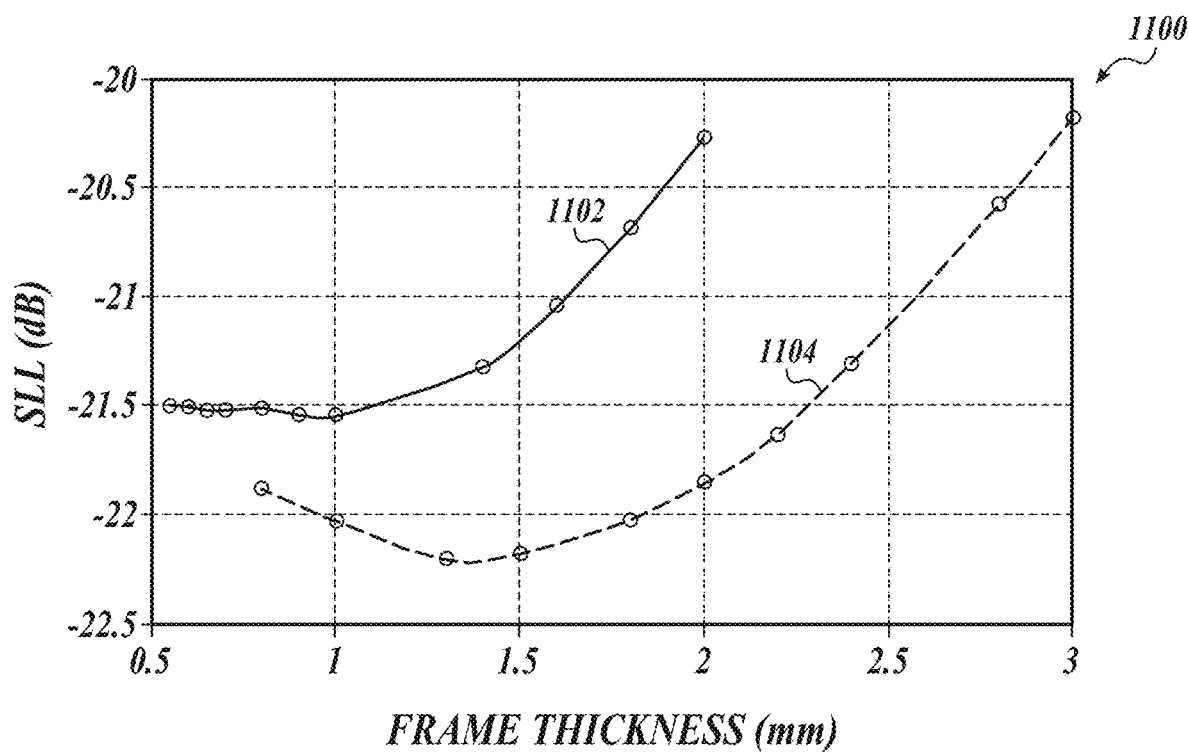
FIGS. 11A-11B depict graphs showing simulation results of side lobe level (SLL) as a function of frame thickness according to some embodiments of the present disclosure.

For example, FIG. 11A depicts a graph 1100 showing simulation examples of the worst case side lobe level (SLL)—vertical axis—as a function of the frame thickness—horizontal axis—and presence/absence of vias in the frame for a plurality of AIP modules configured in a space taper arrangement. Line 1102 shows the worst case SLL values for AIP modules with no vias included in the frames (also referred to as the "no legs" configuration). Line 1104 shows the worst case SLL values for AIP modules with the vias of the first subset in the frames (e.g., minimum number of vias required for circuitry/amplifier) (also referred to as the "frame legs" configuration). For all values of the frame thickness (and the frame via length), worst case SLL is less with the inclusion of at least a few vias in the frame (see line 1104) compared to in the absence of vias in the frame (see line 1102). At a frame thickness of approximately 1.5 mm and with inclusion of vias in the frame, the lowest SLL may be achieved (see lowest point of line 1104).

Figure 11B:
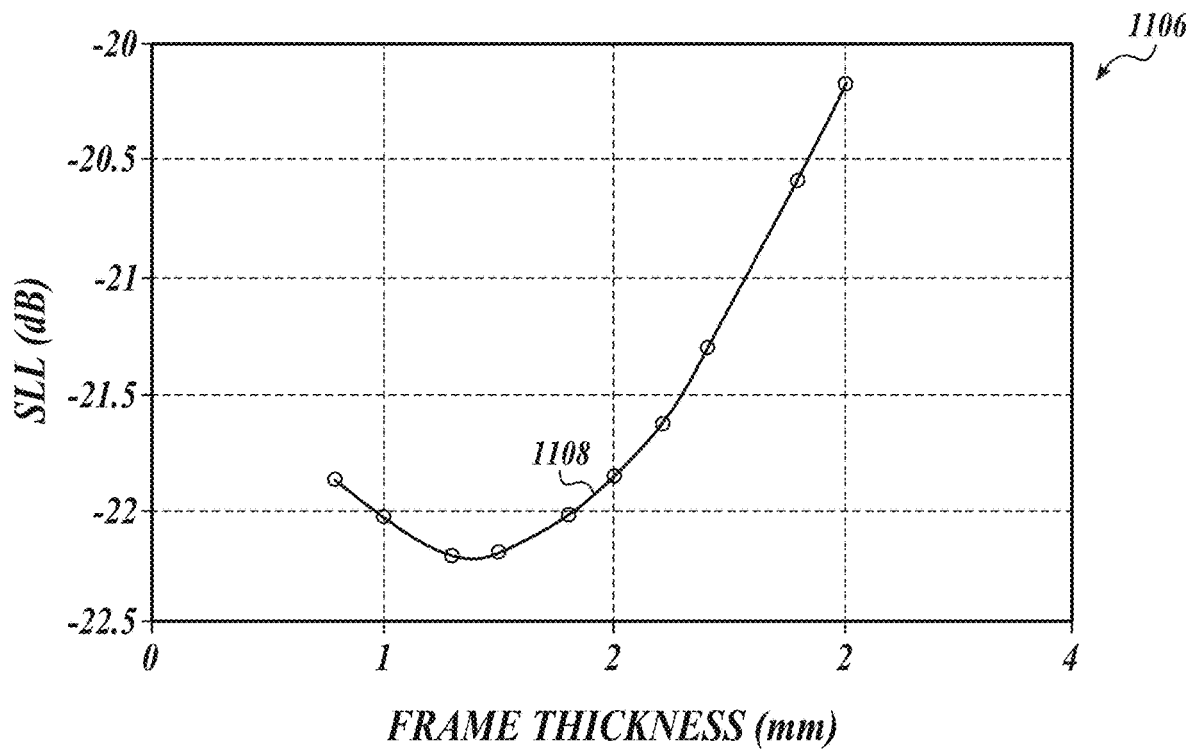

In another example, FIG. 11B depicts a graph 1106 showing simulation results of an array of ten AIP modules including vias of the first subset in the frames (e.g., AIP modules similar to those associated with line 1104 of FIG. 11A). Horizontal axis represents the worst case (or worst peak) SLL values and the vertical axis represents the frame thickness. Line 1108 shows that at approximately 1.5 mm frame thickness, the lowest SLL may be achieved. Thus, vias within the frame may be designed to be approximately 1.5 mm in length.

Thus, not only may a frame of the AIP module be configured to provide space proximate to and on the underside of the antenna to locate RF circuitry (e.g., the amplifier), the frame may be further configured to include vias in excess of the vias required for RF circuitry (e.g., circuitry/amplifier) to aid in antenna performance. The vias may be distributed throughout the frame (e.g., evenly spaced apart vias that are located substantially circumferential of the frame). The lengths of the vias (e.g., one or more of vias 620, 630, or 632; one or more of vias 720, 730, 732) may also be selected to facilitate one or more particular antenna performance characteristics (e.g., to achieve certain radiation pattern or characteristics). Floating or grounded ends of the vias, such as vias 730, 732, may also facilitate one or more particular antenna performance characteristics.

As the antenna size changes and/or the antenna distance from the baseboard (e.g., PCB 410) varies, the major axis associated with the radiation pattern emitted from the antenna may have a tendency to tilt or be off-angle (angle theta) from the propagation direction of the antenna. In some embodiments, such tilt may be reduced, controlled, prevented, or manipulated by the configuration of vias as illustrated for frames 608, 708 and as discussed above. In alternative embodiments, such tilt may be addressed by selective placement of vias within the frame relative to a symmetry line/plane associated with the AIP module. FIGS. 12A-12B depict a partial cut away side view and a partial cut away bottom view, respectively, of an AIP module 1200 in accordance with some embodiments of the present disclosure.

Symmetry line/plane 1201 may comprise an imaginary line or plane which may be drawn down the center or middle of AIP module 1200 to define left and right hemispheres of the AIP module 1200. With respect to a Cartesian coordinate system defined in FIGS. 12A-12B, symmetry line/plane 1201 may comprise a y-z plane of the Cartesian coordinate system. RF transition via 1218 may be located on a first side (e.g., left side) defined by the symmetry line/plane 1201, while a plurality of vias 1230 and a plurality of vias 1232 included in the frame may be located on a second side (e.g., right side) defined by the symmetry line/plane 1201. The second side may comprise the side opposite the first side. Plurality of vias 1230 may comprise the vias of the first and second subsets, the vias 1230 arranged in a semi-circle and located closest to the outer perimeter of the frame. Plurality of vias 1232 may comprise vias associated with electrically shielding a RF via (not shown) between the AIP module 1200 and PCB/baseboard.

In contrast to the plurality of vias 630, 730 distributed more than 180 degrees of the frames in respective AIP modules 600, 700 and on both sides of an analogous symmetry line/plane, vias 1230 may be absent from the side of the AIP module 1200 in which the RF transition via 1218 may be located. Vias 1232 and RF transition via 1218 may also avoid being co-located on the same side of the symmetry line/plane 1201.

AIP Module Antennas

In some embodiments, antennas in AIP modules may be configured to have improved performance over antennas of similar dimensions, sizes, or types and/or comparable performance to antennas having larger dimensions or sizes. Such performance improvements may be achieved through implementation of selective capacitive loading in the antennas. As will be discussed in detail below, a first type of capacitive loading may have the effect of increasing the effective antenna (physical) length so that the antenna may be smaller or miniaturized than an antenna absent the first type of capacitive loading. The first type of capacitive loading may also be referred to as an (antenna) miniaturization technique or first type of capacitive loading technique.

A second type of capacitive loading may have the effect of improving antenna matching. The second type of capacitive loading may also be referred to as an antenna matching technique or second type of capacitive loading technique. In some embodiments, an antenna included in an AIP module may include implementation of one or both of the first and second types of capacitive loading techniques. In some embodiments, either of the first and second types of capacitive loading techniques may be implemented in an antenna one or more times.

Figure 13A:
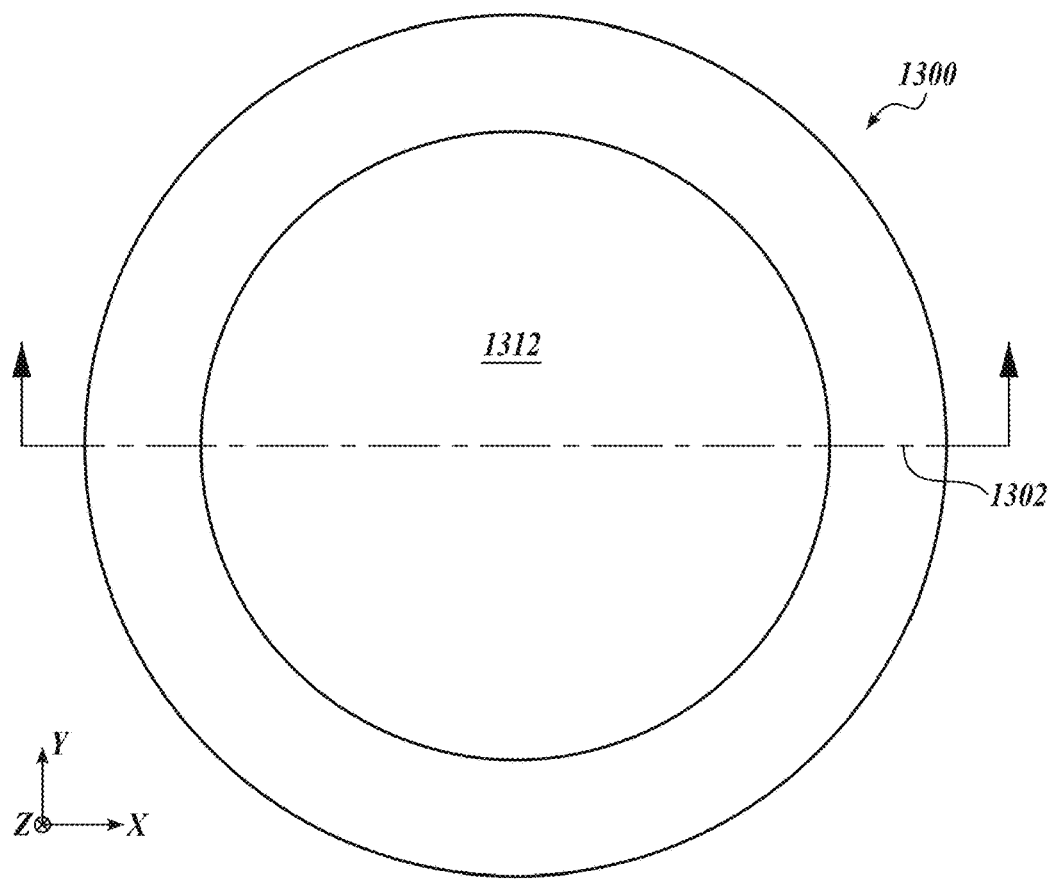
FIGS. 13A-13B depict top and cross-sectional side views, respectively, of an antenna according to some embodiments of the present disclosure.
Figure 13B:
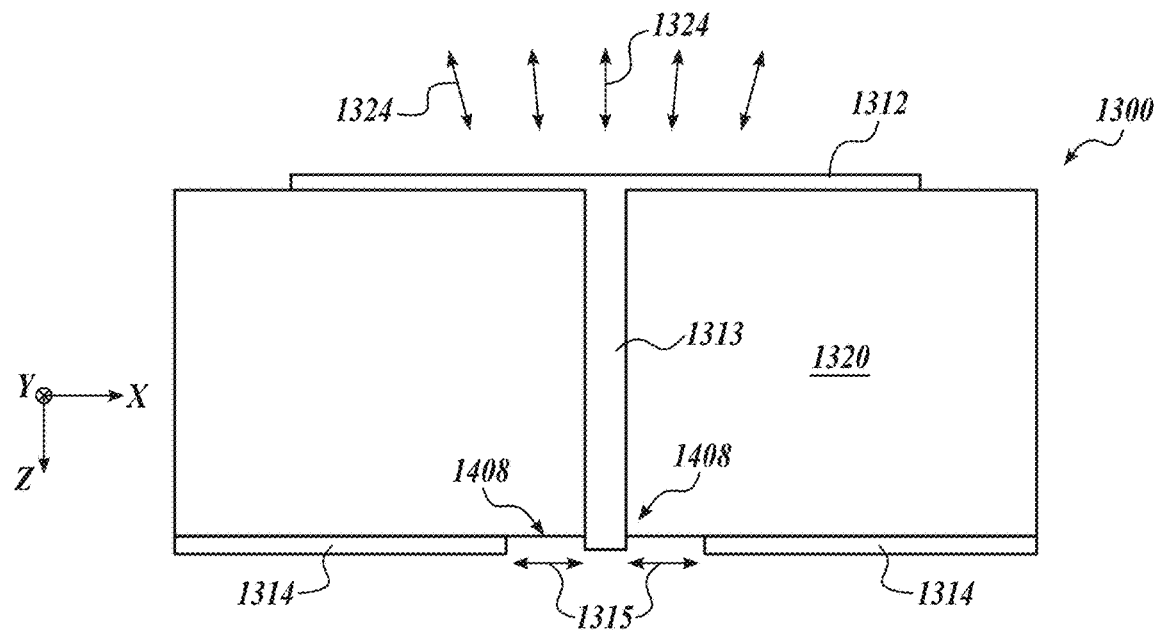

FIGS. 13A-13B depict top and cross-sectional side views, respectively, of an antenna 1300 according to some embodiments of the present disclosure. FIG. 13B illustrates the side view viewed along line 1302 denoted in FIG. 13A. Antenna 1300 may comprise an antenna element or the antenna portion of an AIP module. Alternatively, antenna 1300 may be implemented on a baseboard without inclusion in an AIP module.

In some embodiments, antenna 1300 may comprise a circular patch antenna. The top side of antenna 1300 may be configured to receive and/or transmit radiation 1324. Antenna 1300 may include a top plate 1312, a probe feed 1313, and a bottom plate 1314. Top and bottom plates 1312, 1314 may comprise conductive or metallic flat plates overlaid over each other, oriented parallel to each other along a z-direction of a Cartesian coordinate system, and separated by a distance that is the height/thickness of the antenna 1300. Bottom plate 1314 may comprise a ground plane. A dielectric material 1320 may occupy the space between top and bottom plates 1312, 1314.

Probe feed 1313 may be oriented perpendicular to top and bottom plates 1312, 1314. One end of probe feed 1313 may be configured to physically and electrically couple with the underside of top plate 1312. The opposite end of probe feed 1313 may be configured to be coplanar with the major plane of bottom plate 1314, but not in physical contact with bottom plate 1314. Bottom plate 1314 may include a cutout 1408 that is configured to be the input/output port 1315 of the antenna 1300. The opposite end of probe feed 1313 may align with cutout 1408 of bottom plate 1314, and may be configured to electrically couple with a feedline (not shown)

which may insert into (or be proximate to) the input/output port 1315. In some embodiments, probe feed 1313 may comprise a via.

FIGS. 14A-14D depict cross-sectional side views of antennas 1400, 1420, 1440, 1460 similar to antenna 1300 except configured with one or more additional capacitive loadings according to some embodiments of the present disclosure. In FIG. 14A, probe feed 1413 of antenna 1400 may include a pair of plates 1402, 1404 located closer to plate 1312 than plate 1314. Plates 1402 and 1404 may be separated from each other by a certain distance. Major planes of plates 1402, 1404, 1312, and 1314 may be parallel with each other (e.g., major planes of plates 1402, 1404 are in the x-y plane). The diameter or width of each of plates 1402, 1404 may be smaller than the diameter/width of plate 1312. The shape of plates 1402, 1404 may be the same or different from plate 1312. For example, if plate 1312 has circular shape, plates 1402, 1404 may also be circular in shape. As another example, plate 1312 may have square shape while plates 1402, 1404 may have circular shape. The rest of probe feed 1413 may comprise a continuous column along the z-direction similar to probe feed 1313. In some embodiments, plates 1402, 1404 may form a second type of capacitive loading 1406 (e.g., antenna matching).

Cutout 1408 may form a circular or other shaped void or space in plate 1314. One end of probe feed 1413 may extend into or be proximate to the void or space formed by cutout 1408, and may further be centered with respect to cutout 1408. Each side of the probe feed 1313 and edge of cutout 1408 may form a second type of capacitive loading such as second type of capacitive loadings 1412, 1414.

In FIG. 14B, plate 1422 of antenna 1420 may be configured to include one or more cutouts, slots, notches, grooves, or other contour such as cutouts 1426, 1428. Each of the cutouts 1424, 1426 may be associated with a first type of capacitive loadings 1428, 1430 (e.g., antenna miniaturization), respectively.

In FIG. 14C, first type of capacitive loadings 1448, 1454 are achieved by additional structures located below the top plate of antenna 1440. Namely, a plate 1442 similar to plate 1312 may include a plurality of plates 1444, 1450 positioned underneath and parallel to plate 1442. Plate 1442 may be separated from each of plates 1444, 1450 by spacers 1446, 1452 (e.g., vias) disposed between plate 1442 and respective plates 1444, 1450. Spacers 1446, 1452 may physically and electrically couple with plate 1442 and respective plates 1444, 1450. Plates 1444, 1450 may be associated with respective first type of capacitive loadings 1448, 1454.

Plates 1444, 1450 may comprise conductive or metallic flat plates. Each of plates 1444, 1450 may be smaller in diameter/width than plate 1442. In some embodiments, plates 1442, 1444, 1450 in combination may comprise a unitary structure. Although not shown, more than two plates may comprise the plurality of plates 1444, 1450. By extension, more than two spacers 1446, 1452 may be implemented.

In FIG. 14D, plate 1462 located at a top side of antenna 1420 may be configured to include one or more cutouts, slots, notches, grooves, or other contours such as cutouts 1464, 1468. Each of the cutouts 1464, 1468 may be associated with a first type of capacitive loading 1466, 1470, respectively. Sidewalls 1472, 1474 of the dielectric material between plates 1462, 1314 may be electrically connected to ground. Sidewalls 1472, 1474 may extend perpendicularly between and in contact with plates 1462, 1314.

Although more than one capacitive loading is shown implemented in each of antennas 1400, 1420, 1440, 1460, it is contemplated that only a single capacitive loading may be included in an antenna (such as antenna 1300) or different combinations of capacitive loadings than illustrated in FIGS. 14A-14D may be configured in an antenna.

Figure 15B:
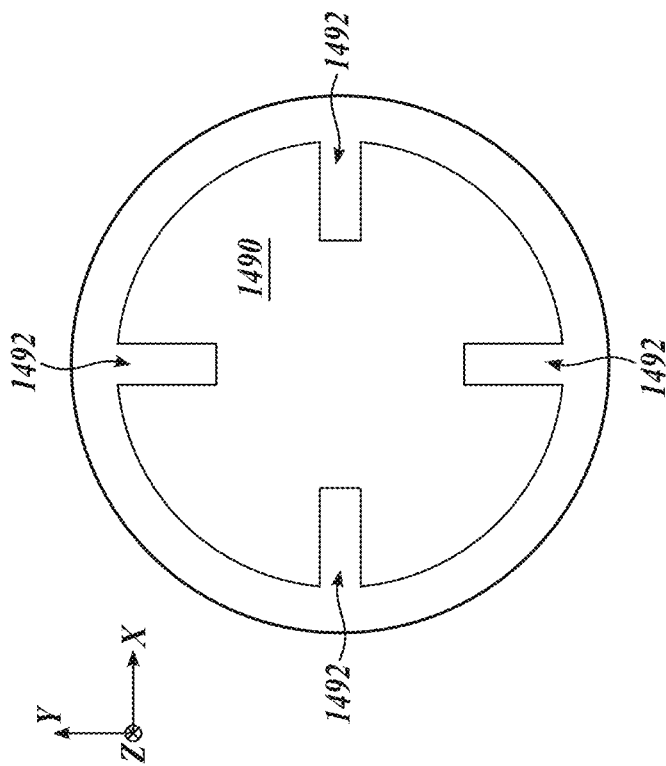
FIGS. 15A-15B depict top views of plates included in antennas according to some embodiments of the present disclosure.
Figure 15A:
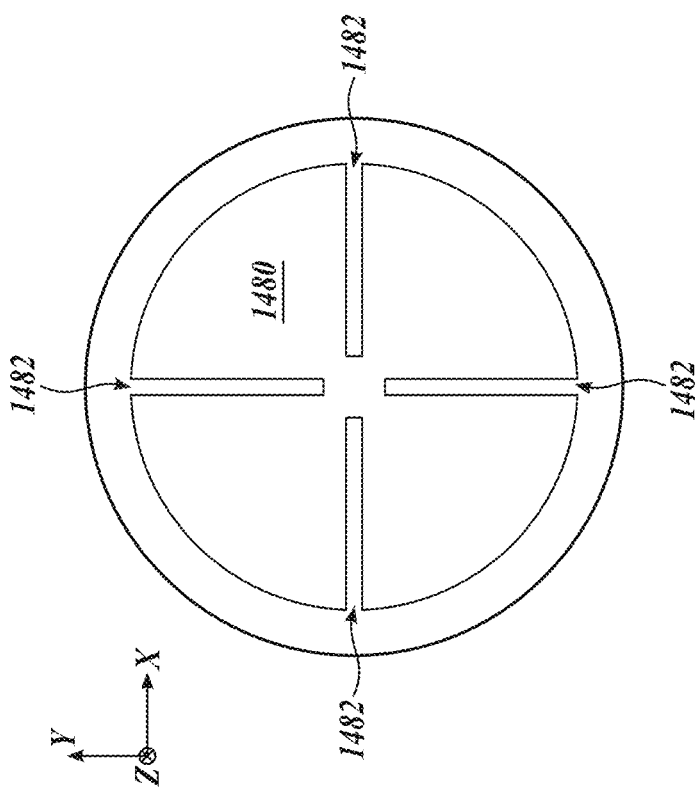

FIGS. 15A-15B depict top views of plates 1480, 1490 included in antennas according to some embodiments of the present disclosure. The particular contours of plates 1480, 1490 are configured to achieve tangential or horizontal extension (in the x-y plane) of the effective physical antenna length. Because the effective physical length of the antenna is increased without increasing the overall size of the antenna, antennas including plate 1480 or 1490 may be deemed miniaturized antennas or those including miniaturization techniques. Shapes of plates 1480, 1490, and in particular, cutouts included in the plates 1480, 1490, may be associated with the first type of capacitive loading.

Plate 1480 may be configured to include a plurality of cutouts 1482 (also referred to as slots, notches, grooves, or the like). Each cutout of the plurality of cutouts 1482 may extend from the edge of the plate 1480 in a radial direction toward the center of plate 1480 but terminate prior to reaching the center of plate 1480 (e.g., without intersecting at the center of plate 1480). In some embodiments, the plurality of cutouts 1482 may be distributed around the plate 1480 such as at each of the 0, 90, 180, and 270 degrees locations.

Plate 1490 may be configured to include a plurality of cutouts 1492 (also referred to as slots, notches, grooves, or the like). Each cutout of the plurality of cutouts 1492 may extend from the edge of the plate 1490 in a radial direction toward the center of plate 1490 but terminate prior to reaching the center of plate 1490 (e.g., without intersecting at the center of plate 1490). In some embodiments, the plurality of cutouts 1492 may be distributed around the plate 1490 such as at each of the 0, 90, 180, and 270 degrees locations. The plurality of cutouts 1492 may extend less toward the center of the plate than the plurality of cutouts 1482. Each cutout of the plurality of cutouts 1492 may also be wider in a direction perpendicular to the radial direction than the width of a cutout of the plurality of cutouts 1482.

The configuration of cutouts 1482 may provide a greater degree of miniaturization than cutouts 1492. However, in some embodiments, plate 1480 may be harder to manufacture than plate 1490. In some embodiments, an antenna including plate 1490 may also include one or more other capacitive loading techniques. Antenna including plate 1480 may be implemented with or without combining with another capacitive loading technique.

In some embodiments, plates 1480, 1490 may be, for instance, similar to plate 1462 included in antenna 1460 of FIG. 14D.

While the cutouts included in each of plates 1480, 1490 comprise techniques to increase the effective physical antenna length implemented in the x-y direction, plates 1444, 1450 included in plate 1442, as shown in FIG. 14C, may comprise a technique to increase the effective physical antenna length implemented in the z-direction. In other words, the shape of plate 1442 comprises a vertical extension (in the z-direction) of the effective physical antenna length. Thus, the antenna length may be increased by particular contours/structures implemented in the (major) plane of the antenna or perpendicular to the (major) plane of the antenna.

Figure 16A:
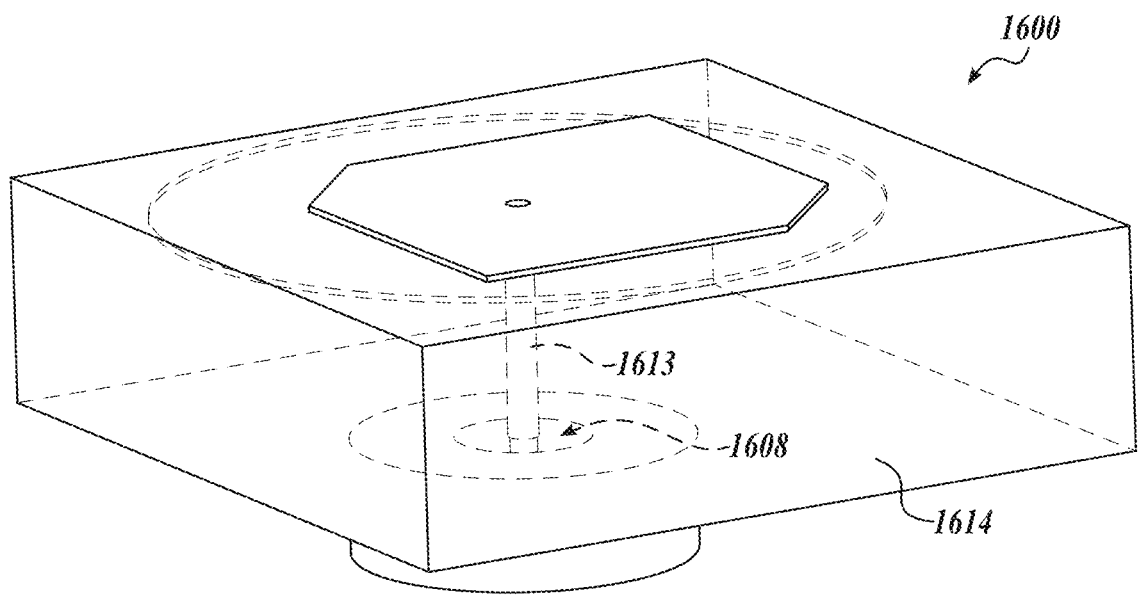
FIGS. 16A-20B depict example antennas including first and/or second types of capacitive loadings according to some embodiments of the present disclosure.
Figure 16B:
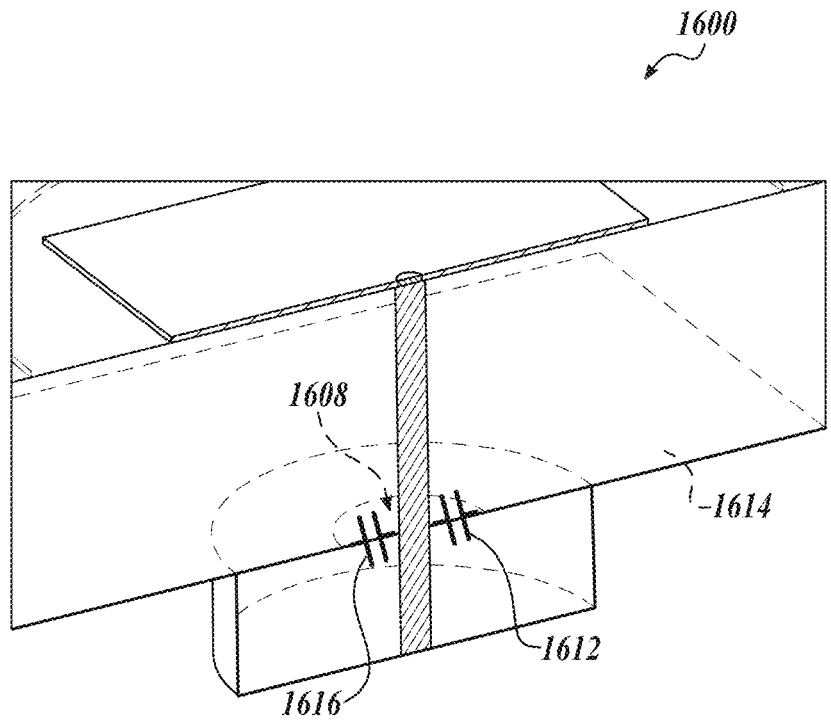

FIGS. 16A-20B depict example antennas including first and/or second types of capacitive loadings according to some embodiments of the present disclosure. FIGS. 16A-16B illustrate perspective views of an antenna 1600 including a plate 1614 similar to plate 1314 of FIGS. 13B and 14A-14D. As with plate 1314, plate 1614 may include a cutout 1608 through which a probe feed 1613 may extend through and which may form second type of capacitive loadings 1612, 1616. In some embodiments, cutout 1608 may comprise a circular shaped void or space in the plate 1614.

Figure 17A:
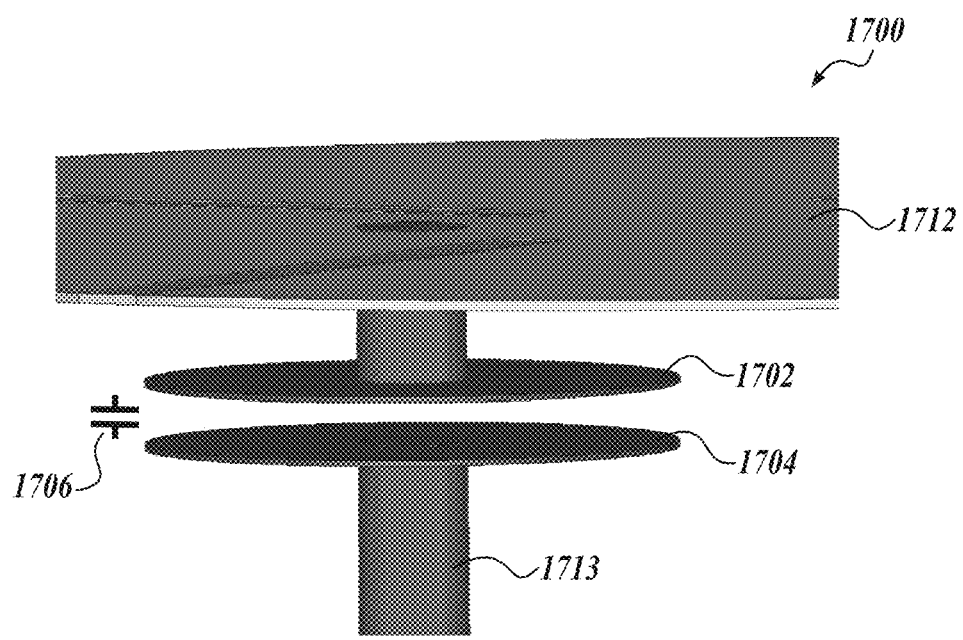
Figure 17B:
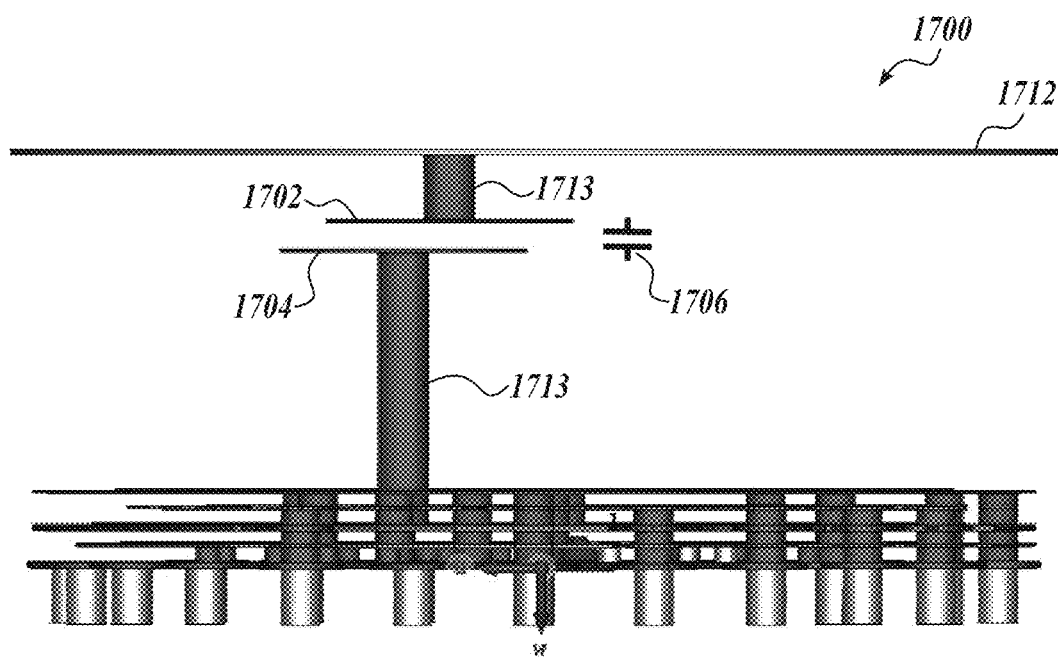

FIGS. 17A-17B illustrate an antenna 1700 including a probe feed 1413 provided below top plate 1712, probe feed 1413 including a pair of parallel plates 1702, 1704. Plates 1702, 1704 may form a second type of capacitive loading 1706. In some embodiments, plates 1702, 1704 may or may not be collinear with each other. For example, FIG. 17B illustrates plates 1702 and 1704 slightly offset from each other and an upper portion of probe feed 1713 non-collinear with the bottom portion of probe feed 1713. Alternatively, plates 1702, 1704 and all of probe feed 1713 may be collinear with each other. Probe feed 1713 is configured in two parts, the gap/space between the two parts of the probe feed 1713 coinciding with the separation gap/space between plates 1702, 1704.

Figure 18A:
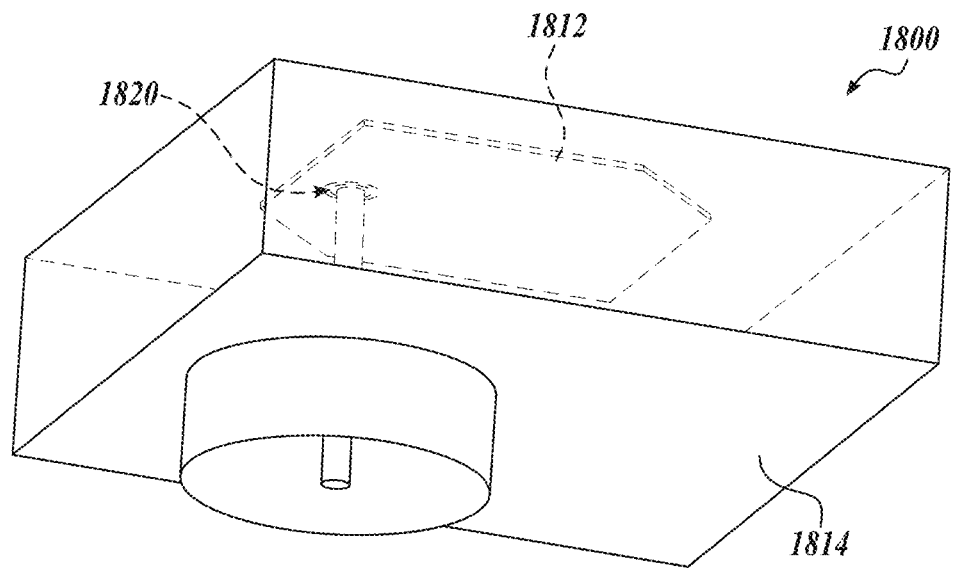
Figure 18B:
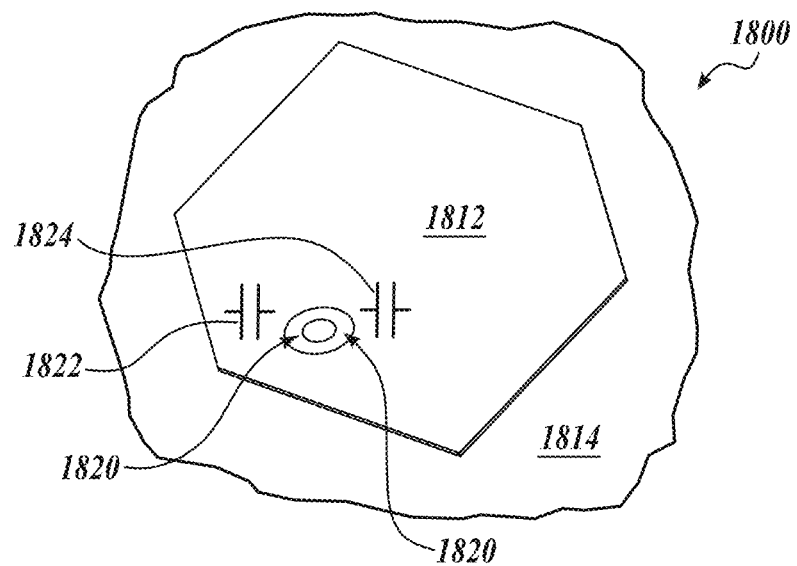

FIGS. 18A-18B illustrate an antenna 1800 including a plate 1812 similar to plate 1422 of FIG. 14B. As shown, plate 1812 may comprise a top plate and plate 1814 may comprise a bottom plate of the antenna 1800. Plate 1812 may include a cutout 1820 comprising a ring or donut shape, in which the center of the ring/donut comprises conductive/metallic material and the ring/donut comprises empty space. Similar to plate 1422, cutout 1820 may form first type of capacitive loadings 1822, 1844.

Figure 19A:
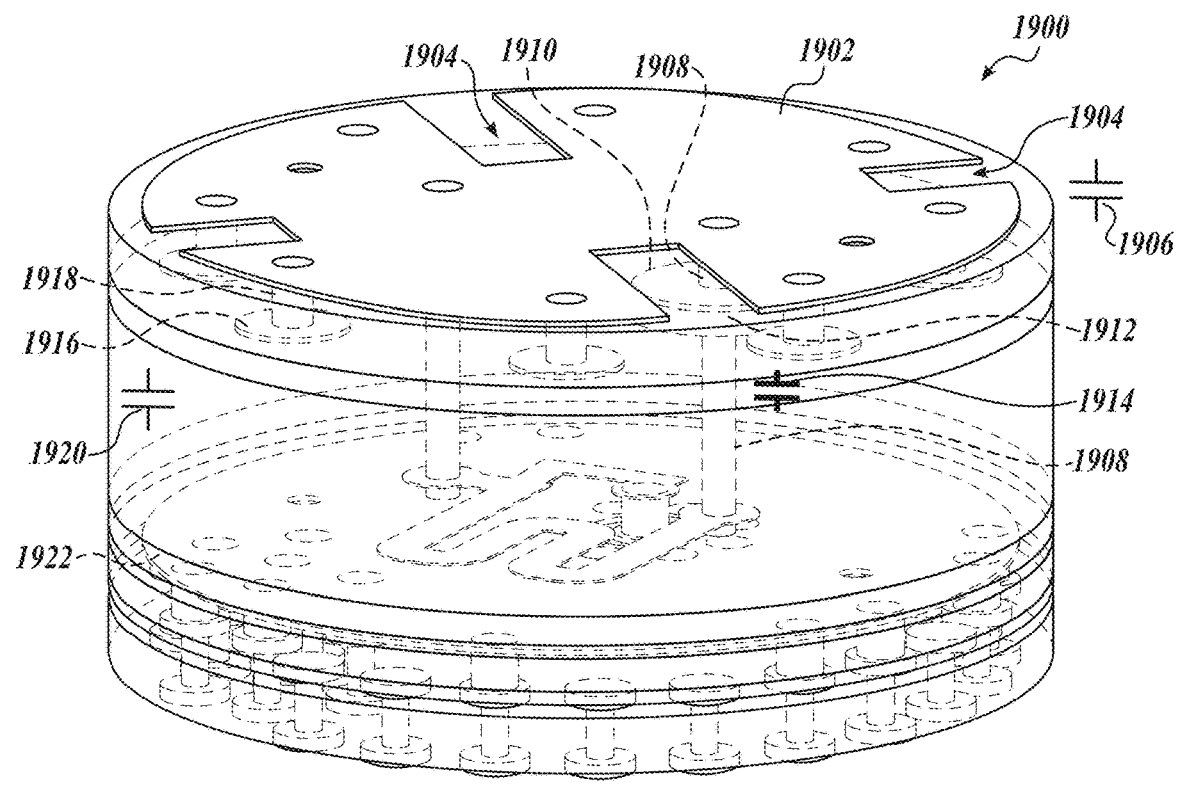
Figure 19B:
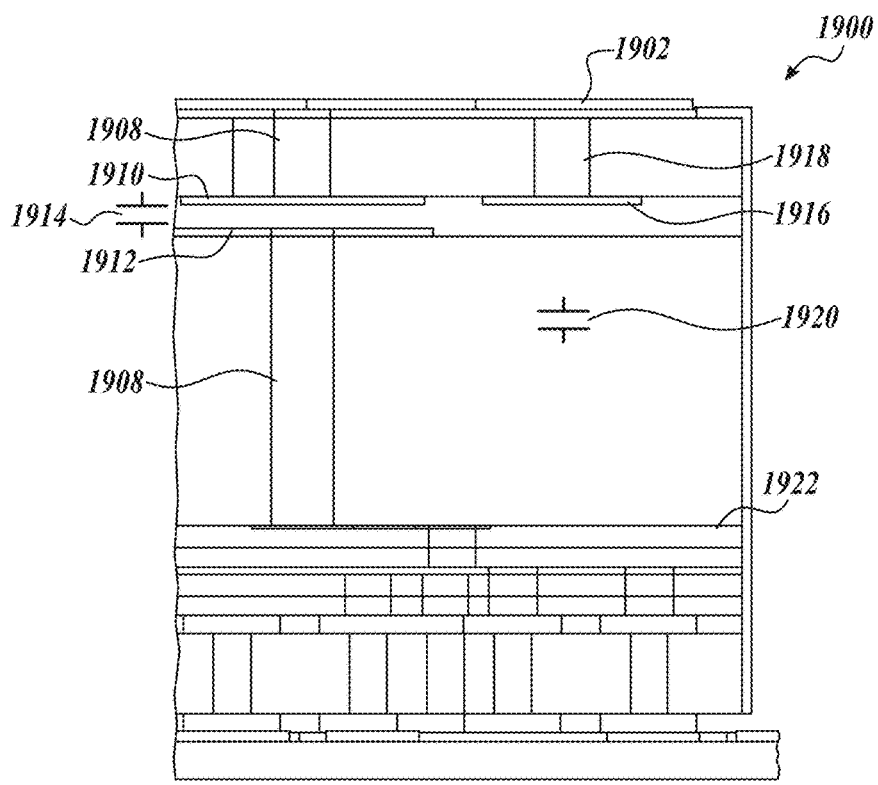

FIGS. 19A-19B illustrate an antenna 1900 including at least two different implementations of the first type of capacitive loading and at least one implementation of the second type of capacitive loading. A top plate 1902 may be configured to include a plurality of cutouts 1904. Plurality of cutouts 1904 may be similar to the plurality of cutouts 1492 in FIG. 15B and/or cutouts 1464, 1468 in FIG. 14D. Cutouts 1904 may be associated with a first type of capacitive loading 1906. Antenna 1900 may further include a probe feed 1908 extending between the top plate 1902 and bottom plate 1922. Probe feed 1908 may be configured to include a pair of parallel plates 1910, 1912 which are parallel to the top plate 1902. Plates 1910, 1912 may be associated with a second type of capacitive loading 1914. Plates 1910, 1912 may be similar to plates 1402, 1404 of FIG. 14A. One or more probe feeds with associated parallel plates may be included in antenna 1900. FIG. 19A shows at least two such probe feeds with associated parallel plates structures.

Antenna 1900 may additionally include one or more capacitive structures formed on the underside of the top plate 1902, along the vertical direction. A plate 1916 may be oriented parallel to top plate 1902 and separated from top plate 1902 by a spacer/via 1918. The capacitor formed by the combination of the (portion of) top plate 1902 and plate 1916 may be associated with a first type of capacitive loading 1920. Plate 1916 and spacer/via 1918 may be similar to respective plates 1444, 1450 and spacers 1446, 1452 of FIG. 14C. More than one such capacitive structure is shown included in antenna 1900 in FIG. 19A.

Antenna 1900 is an example of an antenna including both tangential/horizontal and vertical extensions of the antenna length.

Figure 20A:
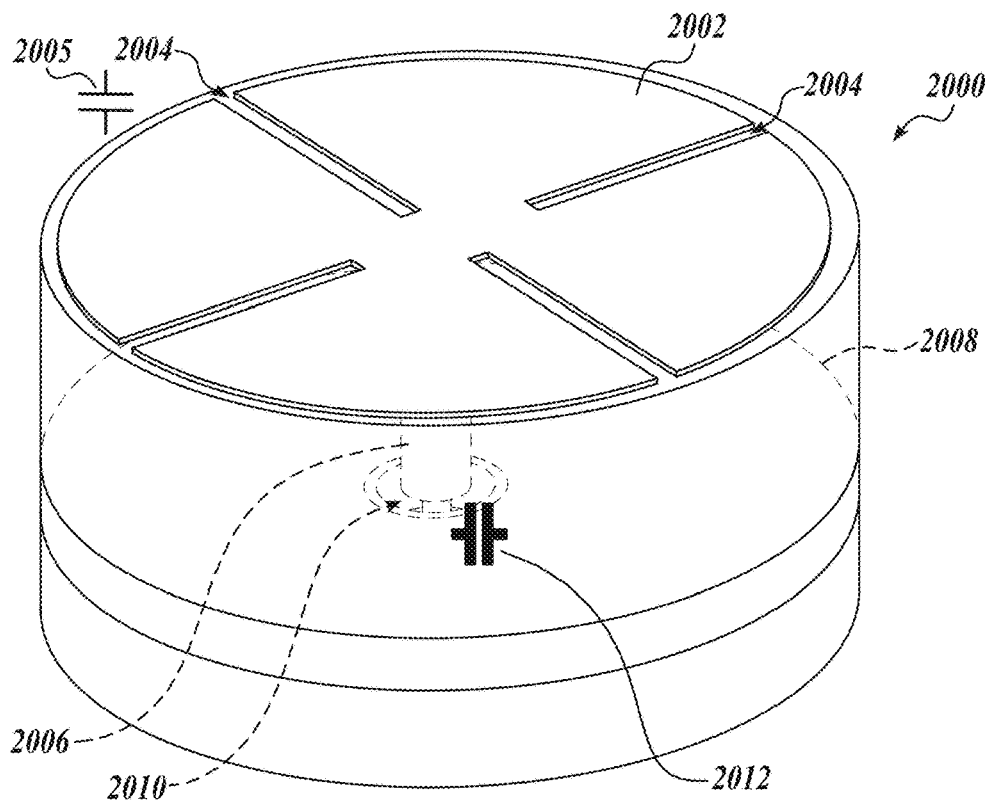
Figure 20B:
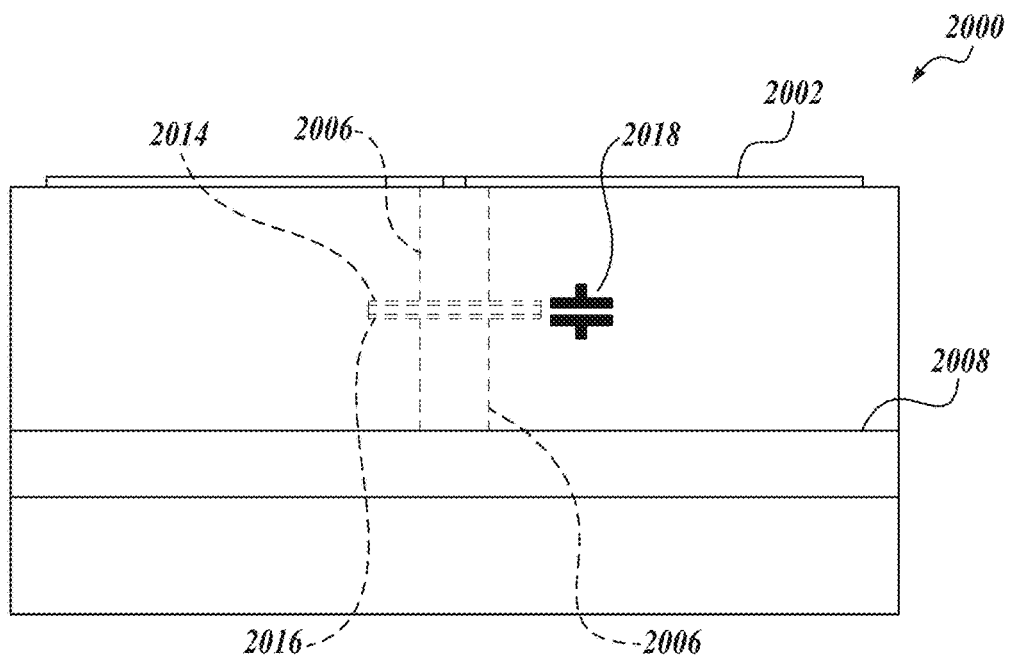

Antenna 2000, shown in FIGS. 20A-20B, includes a plurality of cutouts 2004 in a top plate 2002. The plurality of cutouts 2004 may be similar to the plurality of cutouts 1482 in FIG. 15A. A bottom plate 2008 of antenna 2000 may include a cutout 2010, which may form a second type of capacitive loading 2012. Cutout 2010 may be similar to cutout 1408 of FIGS. 13B and 14A-14D. Antenna 2000 may also include a probe feed 2006 disposed between top plate 2002 and bottom plate 2008. Probe feed 2006 may include parallel plates 2014, 2016 associated with formation of a second type of capacitive loading 2018. Probe feed 2006 with parallel plates 2014, 2016 may be similar to those shown in FIG. 14A.

Polarization

In some embodiments, physical asymmetry may be configured in at least the antenna element of an AIP module in order to achieve polarization, and in particular, circular polarization in the radiation emitted from or received by the AIP module. This may be referred to as polarization achieved at the AIP module level, as will be discussed below for FIGS. 21A-25D. (Circularly) polarized radiation may also be generated at the antenna lattice level by using certain groups or sets of AIP modules arranged to form an antenna lattice, as will be discussed below for FIGS. 26A-28. One or both of such polarization implementation techniques may be used to achieve and/or configure radiation including polarization.

Figure 21B:
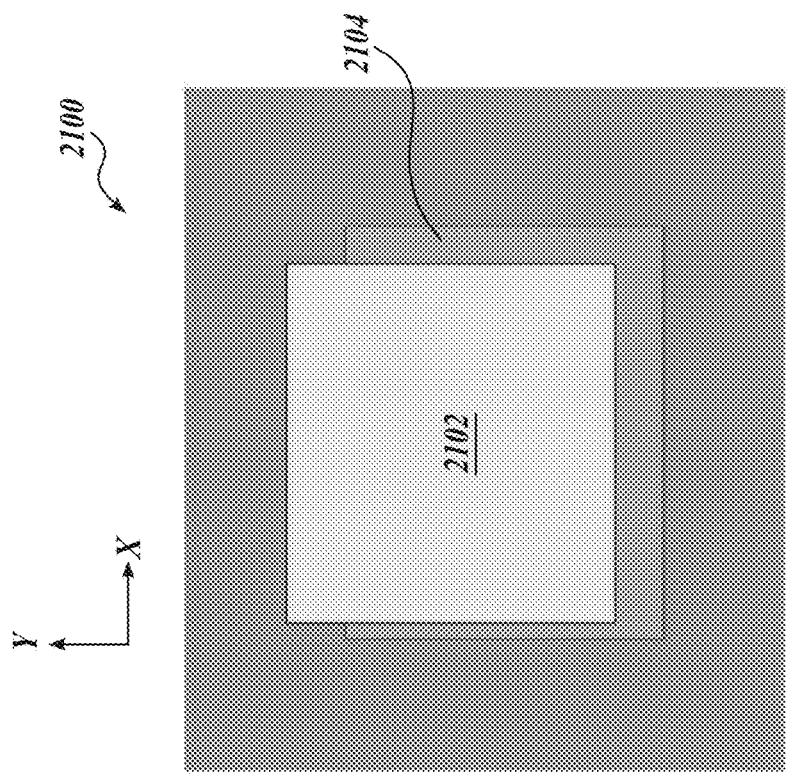
FIGS. 21A-21B depict a first implementation technique for an AIP module to generate circularly polarized radiation according to some embodiments of the present disclosure.
Figure 21A:
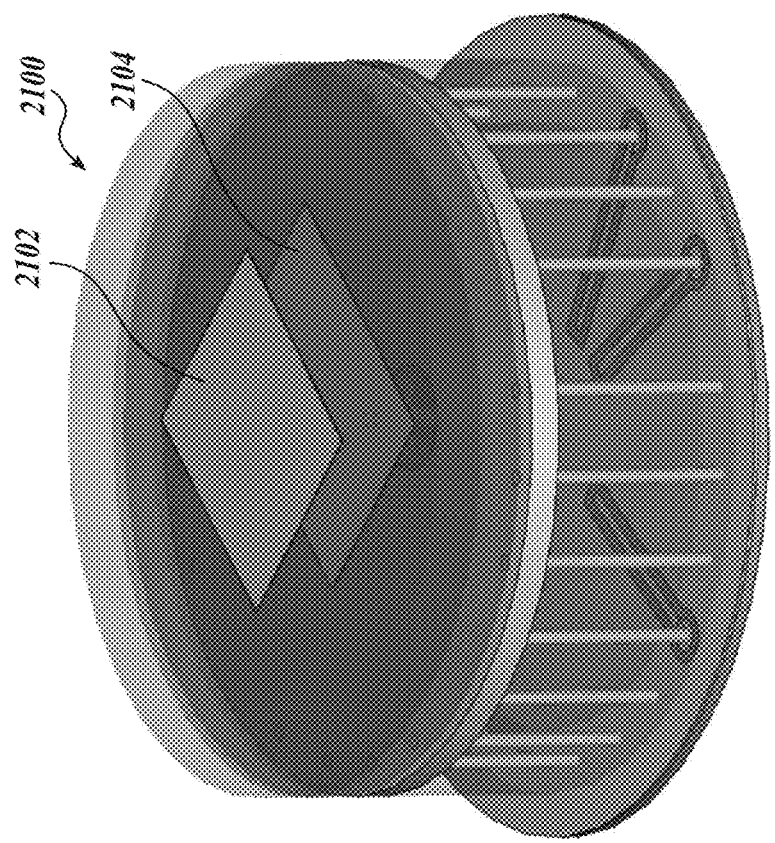

FIGS. 21A-21B depict a first implementation technique for an AIP module 2100 to generate circularly polarized radiation according to some embodiments of the present disclosure. FIG. 21A illustrates a perspective view of AIP module 2100 and FIG. 21B illustrates a top view of the AIP module 2100. AIP module 2100 may include top and bottom plates 2102, 2104 of an antenna included in the AIP module 2100. The width and/or length of the top plate 2102 may be configured to differ from the width and/or length of the bottom plate 2104. In other words, one or both of the x- and y-dimensions of the top and bottom plates 2102, 2104 may be different from each other. As shown in FIGS. 21A-21B, bottom plate 2104 is at least wider along the x-axis than top plate 2102.

While top and bottom plates 2102, 2104 may comprise rectangular patch plates, use of different x- and/or y-dimensions between plates of the antenna to cause circular polarization is also be applicable for other shapes such as, but not limited to, square patch, circular patch, elliptical patch, and/or the like. Moreover, bottom plate 2104 (e.g., the larger of the two plates) may alternatively be disposed above top plate 2102.

Figure 22B:
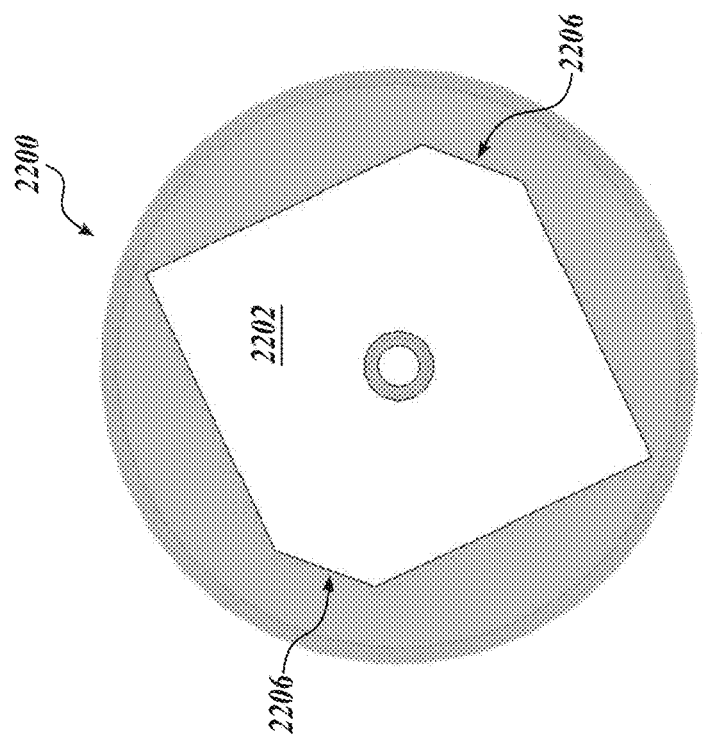
FIGS. 22A-22B depict a second implementation technique for an AIP module to generate circularly polarized radiation according to some embodiments of the present disclosure.
Figure 22A:
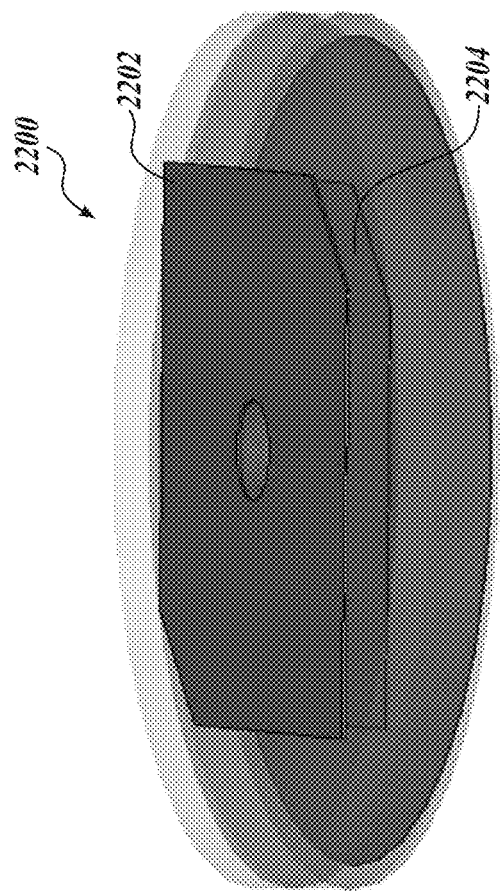

FIGS. 22A-22B depict a second implementation technique for an AIP module 2200 to generate circularly polarized radiation according to some embodiments of the present disclosure. FIG. 22A illustrates a perspective view of AIP module 2200 and FIG. 22B illustrates a top view of the AIP module 2200. AIP module 2200 may include top and bottom plates 2202, 2204 of an antenna included in the AIP module 2200. Top and bottom plates 2202, 2204 may comprise square patch antenna plates. Top plate 2202 may comprise a square shape with a pair of chamfered corners 2206 located at directly opposing corners of the square, as shown in FIG. 22B. Bottom plate 2204 may be similarly shaped. Such physical asymmetry among pairs of opposing corners may facilitate generation of asymmetric mode of radiation (e.g., radiation with 90 degree or substantially 90 degree phase difference between x- and y-direction radiation).

Figure 23B:
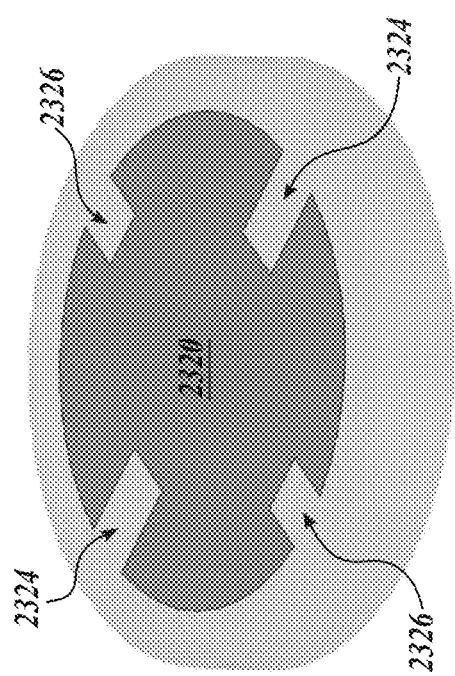
FIGS. 23A-23C depict a third implementation technique for an AIP module to generate circularly polarized radiation according to some embodiments of the present disclosure.
Figure 23C:
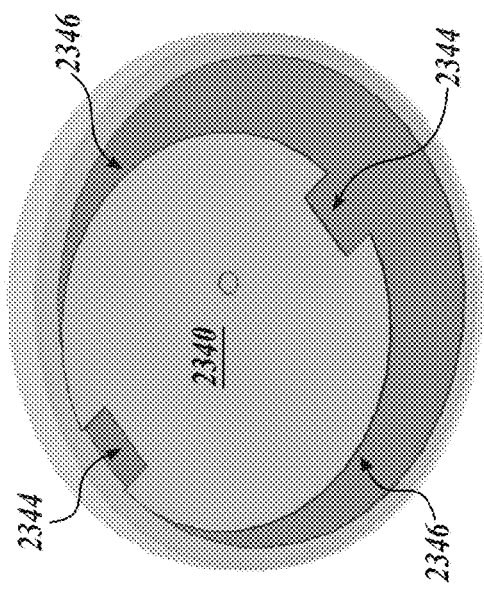
Figure 23A:
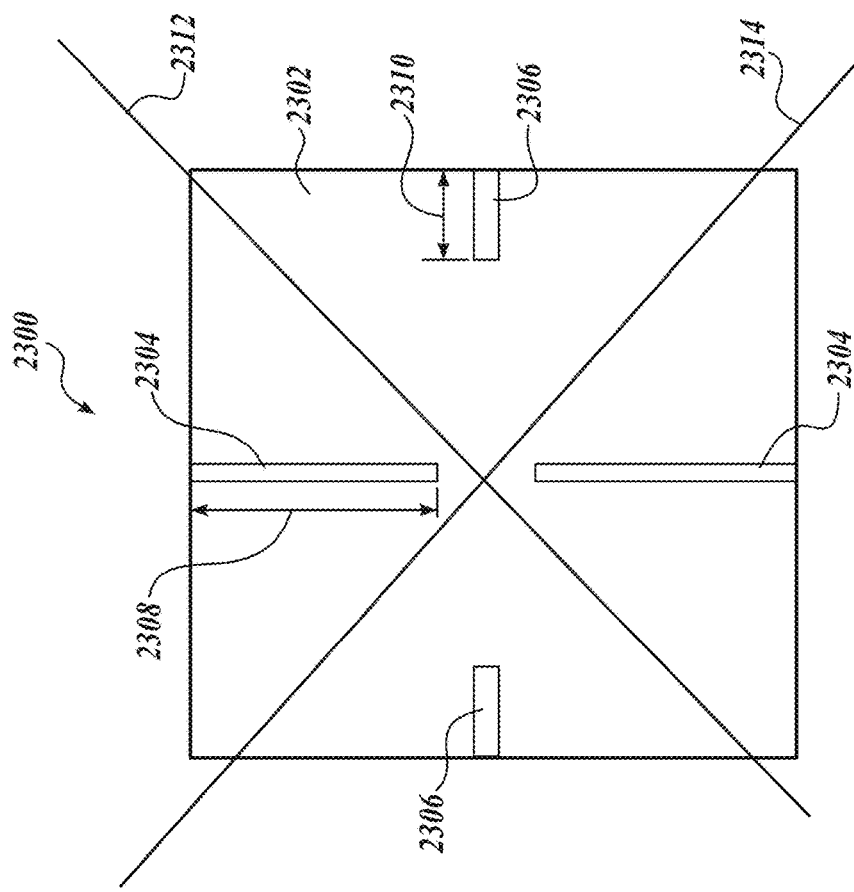

FIGS. 23A-23C depict a third implementation technique for an AIP module to generate circularly polarized radiation according to some embodiments of the present disclosure. In some embodiments, at least a top plate of a patch antenna element may be configured to include a first set of slots that are of a different length than a second set of slots. Slots may comprise cutouts or particularly shaped contours included in the antenna structure. In a top view of an AIP module 2300 illustrated in FIG. 23A, a top plate 2302 of the AIP module 2300 may be configured to include a first set of slots 2304 and a second set of slots 2306. Each of slots 2304, 2306 may extend from an edge of the top plate 2302 in a radial direction toward the center of the top plate 2302 without reaching the center. Slots 2304 may be located on opposing sides of top plate 2302. Slots 2306 may also be located on opposing sides of top plate 2302. Each of slots 2304, 2306 may thus be located in a different quadrant from each other or even distributed around the edge of the top plate 2302.

A slot length 2308 of each of slots 2304 may be equal to each other. A slot length 2310 of each of slots 2306 may be equal to each other. Slot length 2308 may be different (e.g., larger) than slot length 2310.

In alternative embodiments, slots 2304, 2306 may be located at corners of top plate 2302, such as along the opposing diagonal lines 2312, 2314 shown in FIG. 23A.

FIG. 23B depicts pairs of slots of different lengths from each other included in a circular patch antenna according to some embodiments of the present disclosure. A top plate 2320 may be configured to include a first set of slots 2324 and a second set of slots 2326. The location and lengths of first and second sets of slots 2324, 2326 may be similar to respective first and second sets of slots 2304, 2306. The width of one or more of slots 2324, 2326 may be the same or different from those of slots 2304, 2306.

FIG. 23C depicts another circular patch antenna including pairs of slots of different lengths from each other included in a circular patch antenna according to some embodiments of the present disclosure. A top plate 2340 may be configured to include a first set of slots 234, which may be similar to first set of slots 2304 or 2324. The absence of slots at locations 2346 of top plate 2340 may be considered to be a second set of slots having zero length. Thus, the antenna in FIG. 23C comprises an antenna including two sets of slots that of different lengths from each other, and circular polarization may be achieved.

FIGS. 24A-24E depict a fourth implementation technique for an AIP module to achieve circular polarization according to some embodiments of the present disclosure. Whereas the antenna of FIG. 22A or 23A, for example, includes antenna features associated with circular polarization configured in the x-y plane, the antennas of FIGS. 24A-24E include circular polarization associated feature(s) implemented vertically in the antennas (e.g., features along the z-axis).

FIGS. 24A-24B illustrate a circular patch antenna 2400 including a top plate 2402 configured to include a pair of ring shaped slots or cutouts 2402, 2406. Ring shaped slots/cutouts 2402, 2406 may be located near the edge of the top plate 2402 and also at directly opposing or opposite locations of the top plate 2402. Ring shaped slots/cutouts 2402, 2406 may be located along an imaginary line that may bisect the circular shape of the top plate 2402 in half. At the centers of the ring shaped slots or cutouts 2402, 2406 where top plate 2402 is present, respective vias 2408, 2410 may electrically couple with the top plate 2402. Vias 2408, 2410 may extend vertically between the top plate 2402 to a bottom plate of the antenna 2400. Vias 2408, 2410 may be distinct from a via 2412 configured to be a feedline for the antenna 2400 to an amplifier. Vias 2408, 2410 may also be referred to as vertical stubs.

FIGS. 24C-24D illustrate circular polarization associated features implemented vertically in a square patch antenna 2420. Similar to antenna 2400, antenna 2420 may include a pair of slots or cutouts 2425, 2426 located near the edge of the top plate 2422 and at directly opposing or opposite locations from each other. Slots/cutouts 2425, 2426 may comprise a square or rectilinear shape, for example. In some embodiments, slots/cutouts 2425, 2426 may comprise rectilinear shaped rings with centers intact. Located vertically from the top plate 2422 to a bottom plate 2424 and collinear with the slots/cutouts 2425, 2426 are a pair of vias 2427, 2428.

FIG. 24E illustrates another embodiment of vertical features included in an antenna to facilitate circular polarization. Plates 2436, 2438 and vias 2437, 2439 may be disposed between a top plate 2432 and a bottom plate 2434. Length of via 2437 may extend perpendicular between top plate 2432 and plate 2336. Length of via 2439 may extend perpendicular between top plate 2432 and plate 2438. The size of each of plates 2436, 2438 may be smaller than the size of top plate 2432.

Figure 25B:
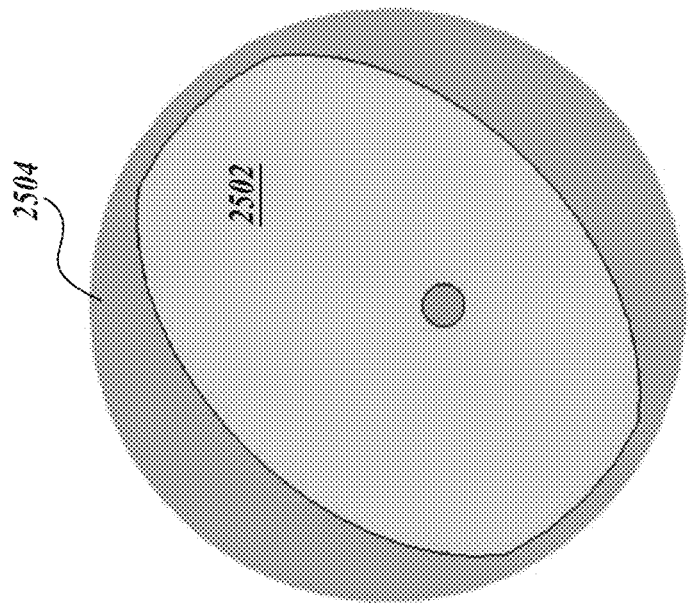
FIGS. 25A-25D depict a fifth implementation technique for an AIP module to achieve circular polarization according to some embodiments of the present disclosure.
Figure 25A:
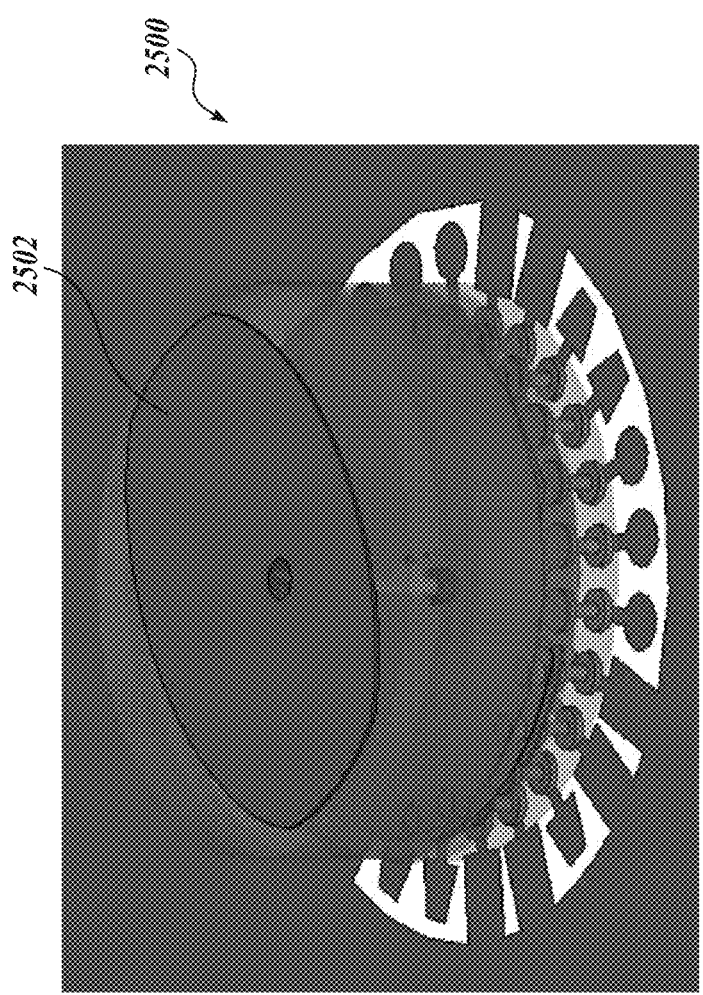

Antennas including circular polarization facilitating features, such as slots of different lengths or vertical features, may be square shaped, rectangular shaped, circular shaped, elliptical shaped, geometrically shaped, or the like. Examples of elliptically shaped patch antennas are shown in FIGS. 25A-25D according to some embodiments of the present disclosure. In FIGS. 25A-25B, an antenna 2500 includes a top plate 2502 that is elliptically shaped. A bottom plate 2504 may be a different shape from the top plate. As an example, bottom plate 2504 may be circular shaped. In some embodiments, the top plate 2502 may include a slot or cutout near the center of the elliptical shape.

Figure 25C:
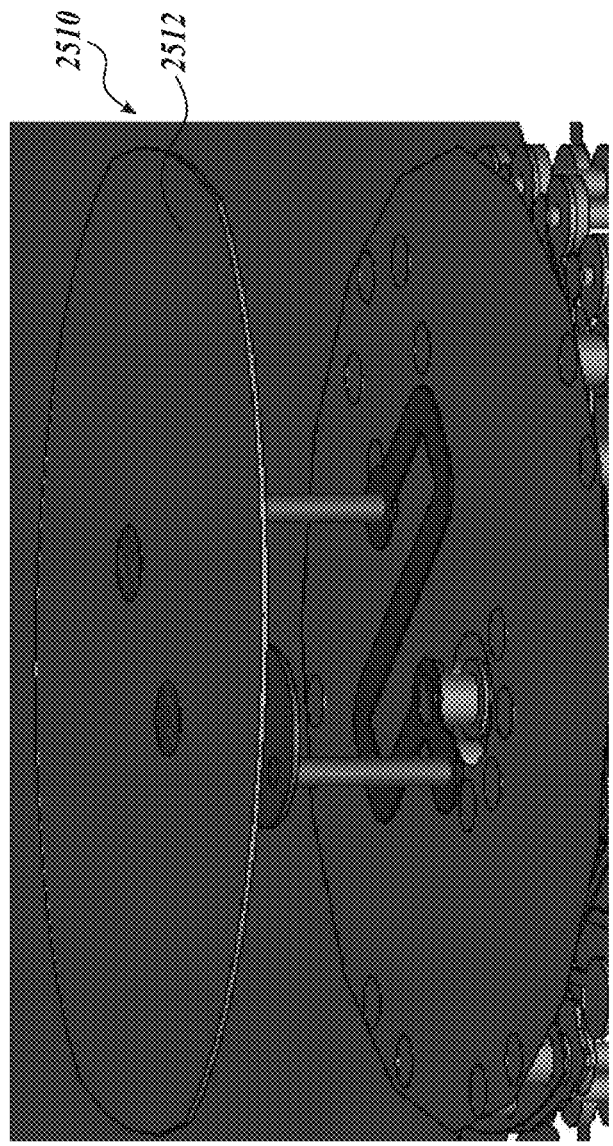
Figure 25D:
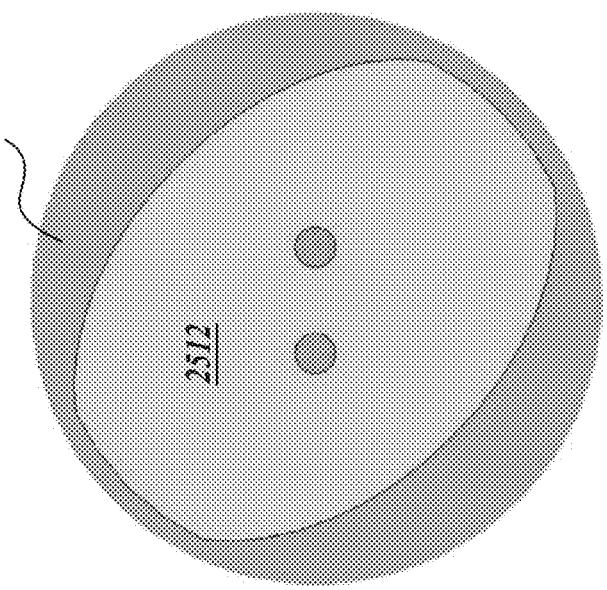

FIGS. 25C-25D depict an antenna 2510 including a top plate 2512 having an elliptical shape and a bottom plate 2514 having a shape different from the top plate 2512 (e.g., circular shape). Top plate 2512 may include a pair of slots or cutouts located on opposing sides of the center of the top plate 2512. In some embodiments, one or more of the slots or cutouts may be associated with one or more vertical structures (e.g., via) configured on the underside of the top plate 2512.

In some embodiments, one or more of the circular polarization associated/facilitating features described above may be included in a given antenna, antenna element, or AIP module. For example, an antenna, antenna element, or AIP module may include different dimensioned top and bottom plates in combination with pairs of slots of different lengths. As another example, an antenna, antenna element, or AIP module may include an elliptical shaped plate, vertical structures, and different dimensioned top and bottom plates.

With reference to FIGS. 26A-28, in accordance with embodiments of the present disclosure, antenna elements in an antenna lattice may be rotated relative to one another to improve the signal performance of the antenna aperture. There are two components of circular polarization: co-polarization and cross-polarization. Co-polarization is generally desired and cross-polarization is generally undesired. Physical rotation of antenna elements in an antenna lattice relative to one another can effectively cancel or reduce cross-polarization components to achieve high polarization purity and/or desired polarization characteristics. High polarization purity (or low cross polarization) of an antenna system improves signal strength and decreases leakage from the main beam B (see FIGS. 1A and 1B).

In some embodiments of the present disclosure, individual antenna elements 122$i$ may be rotated about a centerline (e.g., rotated about an axis of the antenna element that is perpendicular to the plane of the carrier 112) to realize high polarization purity when the antenna aperture 110 is receiving or emitting signals.

Figure 26A:
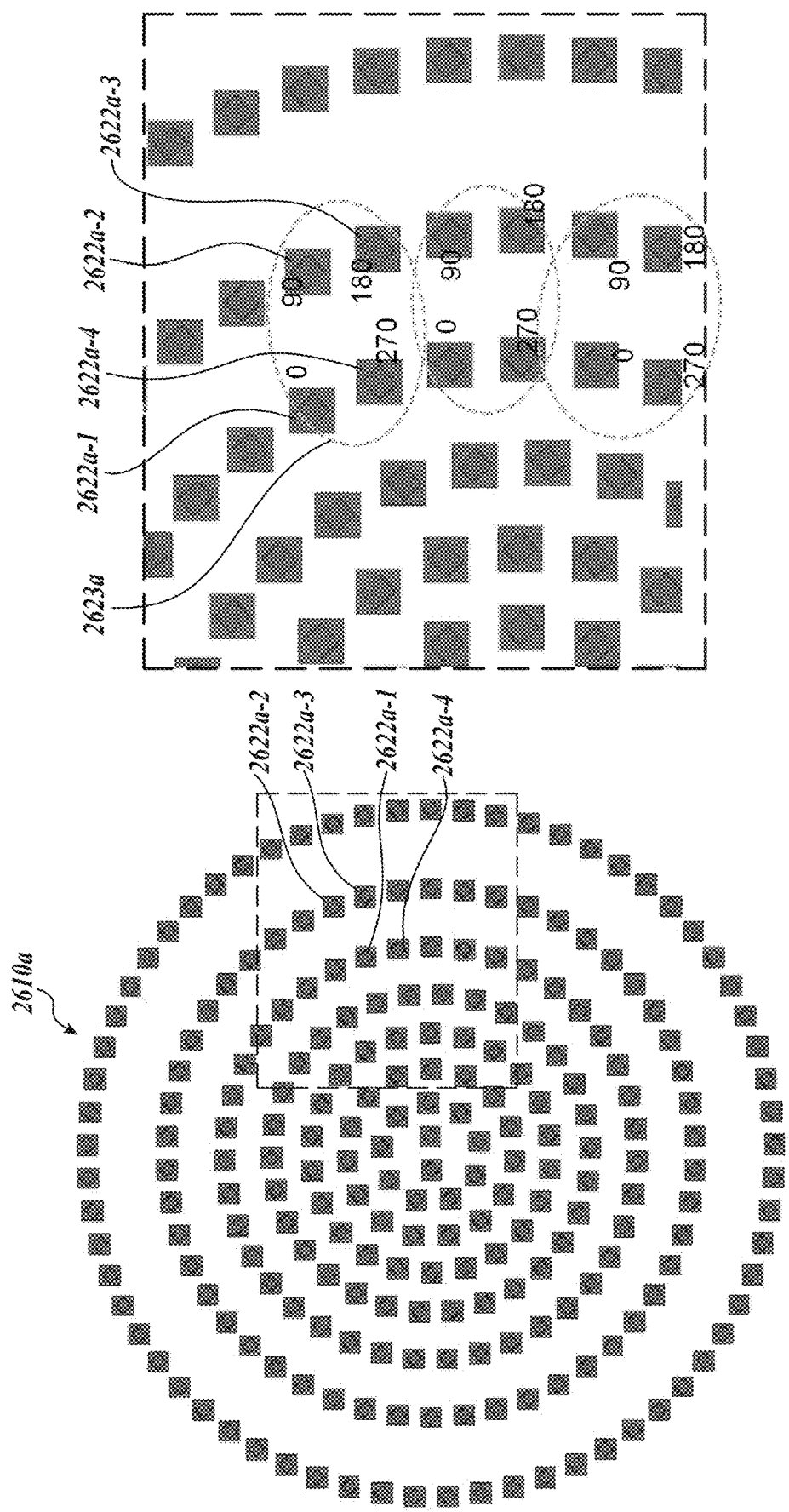

With reference to FIG. 26A, an antenna lattice 2610a of antenna elements 2622a having a space taper configuration is provided. The antenna elements 2622a of the antenna lattice 2610a are grouped into sequential rotational groupings 2623a of four antenna elements 2622a-1, 2622a-2, 2622a-3, and 2622a-4 with two of the elements in one ring of the space taper lattice and two of the elements in an adjacent ring of the space taper lattice, defining a rectangular-shaped grouping. The antenna elements 2622a-1, 2622a-2, 2622a-3, 2622a-4 are each physically rotated by 90 degrees relative to each other traveling in a circular pattern around the grouping.

In some embodiment, all the antenna elements in a grouping are structurally identical to each other. In some embodiments, not all the antenna lattice elements are in sequential rotational groupings.

In addition to physical rotation of the antenna elements, high polarization purity can be realized if the antenna elements are electrically excited by the same amount of electrical phase shift. For example, referring to FIG. 26A, adjacent antenna elements 2622a-1, 2622a-2, 2622a-3, 2622a-4 in each sequential rotational grouping 2623a may be electrically excited by 90 degrees electrical phase shift between each antenna element.

By providing such physical rotation and electrical phase shift, sequentially rotated antennas in a space tapered configuration can provide improved circularly polarized signals.

Other antenna lattices having other configurations besides a space tapered configuration, other sequential rotational groupings, and other physical rotation patterns of the antenna elements are within the scope of the present disclosure. Referring to FIG. 26B, a portion of a 2-D array of antenna elements 2622b is provided. The antenna elements 2622b of the antenna lattice 2610b are grouped into sequential rotational groupings 2623b of four antenna elements 2622b-1, 2622b-2, 2622b-3, and 2622b-4 defining a rectangular-shaped grouping. The antenna elements 2622b-1, 2622b-2, 2622b-3, and 2622b-4 are each physically rotated by 90 degrees relative to each other traveling in a circular pattern around the grouping. Likewise, adjacent antenna elements 2622a-1, 2622a-2, 2622a-3, 2622a-4 in the sequential rotational grouping 2623a may be electrically excited by 90 degrees electrical phase shift between each antenna element.

Referring to FIG. 26C, a portion of a 2-D offset array of antenna elements 2622c is provided. The antenna elements 2622c of the antenna lattice 2610c are grouped into sequential rotational groupings 2623c of three antenna elements 2622c-1, 2622c-2, and 2622c-3 defining a triangular-shaped grouping. The antenna elements 2622c-1, 2622c-2, and 2622c-3, are each physically rotated by 120 degrees relative to each other traveling in a circular pattern around the grouping. Likewise, adjacent antenna elements 2622c-1, 2622c-2, and 2622c-3 in the sequential rotational grouping 2623c may be electrically excited by 120 degrees electrical phase shift between each antenna element.

Referring to FIG. 26D, a portion of a 2-D array of antenna elements 2622d is provided. The antenna elements 2622d of the antenna lattice 2610d are grouped into sequential rotational groupings 2623d of nine antenna elements 2622d-1, 2622d-2, 2622d-3, 2622d-4, 2622d-5, 2622d-6, 2622d-7, 2622d-8, and 2622d-9. The antennas are each physically rotated by 40 degrees relative to each other traveling in a non-circular pattern though the grouping. Likewise, adjacent antenna elements in the sequential rotational grouping 2623d may be electrically excited by 40 degrees electrical phase shift between each antenna element.

Other sequential rotation schemes are within the scope of the present disclosure. For example, adjacent antenna elements may be polarized at 0°, 90°, 0°, and 90°.

In designing sequential rotational groupings in accordance with embodiments of the present disclosure, a tradeoff is considered between generation of high purity circularly polarized signals by using a greater number of antenna elements within a sequential rotational grouping and the signal degradation which may occur as a result of the grouping size (e.g., the planar area associated with the grouping) increasing as the number of antenna elements within the grouping increases. The number of antenna elements in a sequential rotational grouping is independent of the type of lattice arrangement, e.g., whether the lattice is a space tapered lattice or a 2-D array.

Figure 27A:
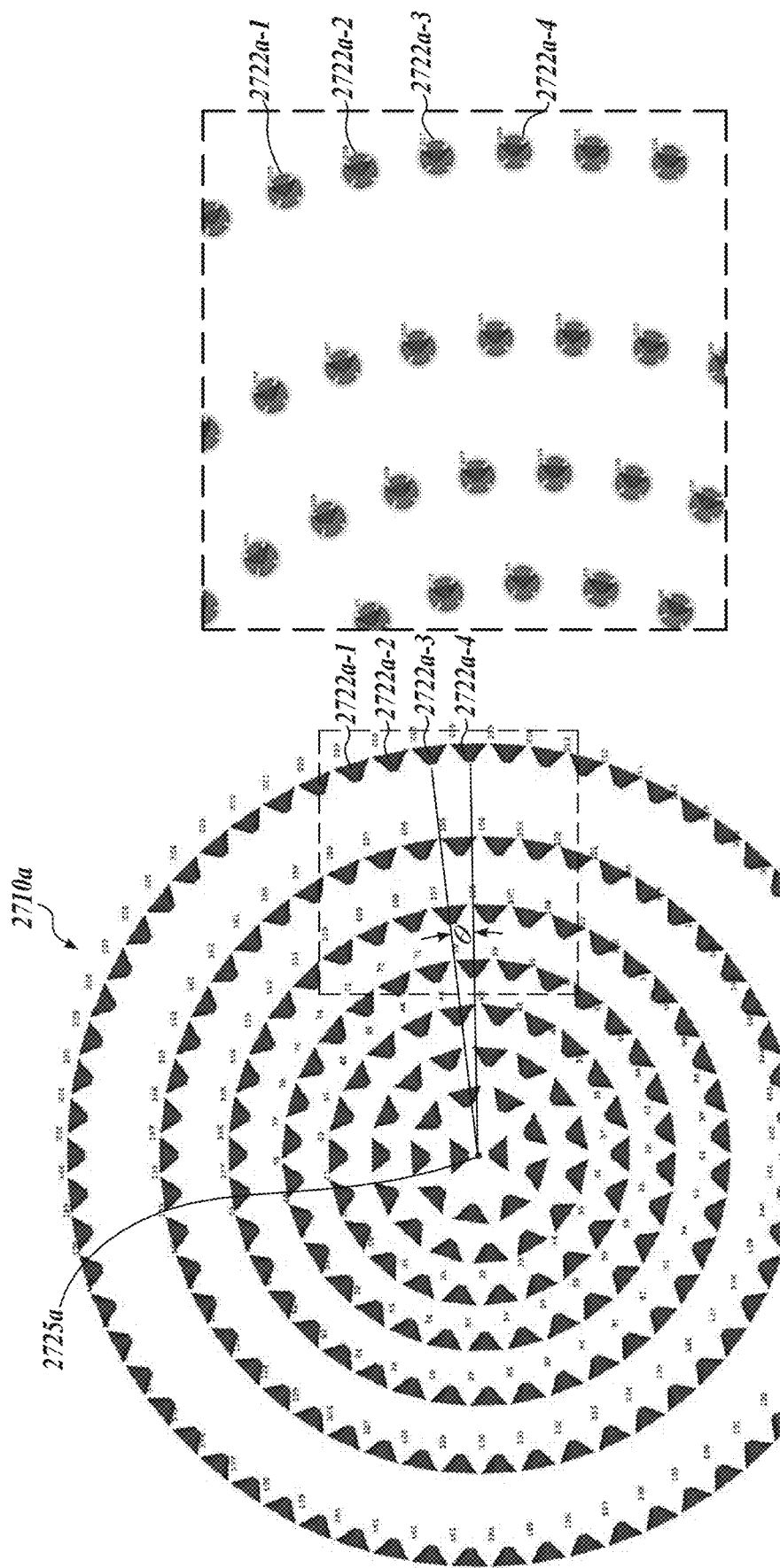
FIGS. 27A-27B are schematic layouts of an antenna lattice including antenna rotation schemes for polarization purity in accordance with other embodiments of the present disclosure.

With reference to FIG. 27A, another antenna lattice 2710a of antenna elements 2722a having a space taper configuration is provided. In the embodiment of FIG. 27A, the antenna elements 2722a of the antenna lattice 2710a are progressively rotated relative to each other for polarization purity. For example, antenna elements 2722a-1, 2722a-2, 2722a-3, and 2722a-4 are each physically rotated by the same degree of angular rotation e relative to each other traveling in a circular pattern around the center axis 1625a of the antenna lattice 2710a. In some embodiments, adjacent antenna elements in the progressive rotation may be electrically excited by e degrees electrical phase shift between each antenna element.

The arrows in the antenna elements 2722a-1, 2722a-2, 2722a-3, and 2722a-4 are used to show the direction of orientation of the antenna elements relative to each other. In the illustrated embodiment, all the arrows are pointing toward the center axis 2725 of the antenna lattice 2710a. However, other directions are also within the scope of the present disclosure so long as the antenna elements are progressively rotated relative to each other by the same degree of angular rotation e. The degree of angular rotation in a given ring is 360 degrees divided by the number of antenna elements in that ring. All rings will have progressive rotation, with the degree of angular rotation for each ring in accordance with the formula above. Inner rings have smaller number of antenna elements. Therefore, the degree of angular rotation is larger for inner rings compared to outer rings.

Figure 27B:
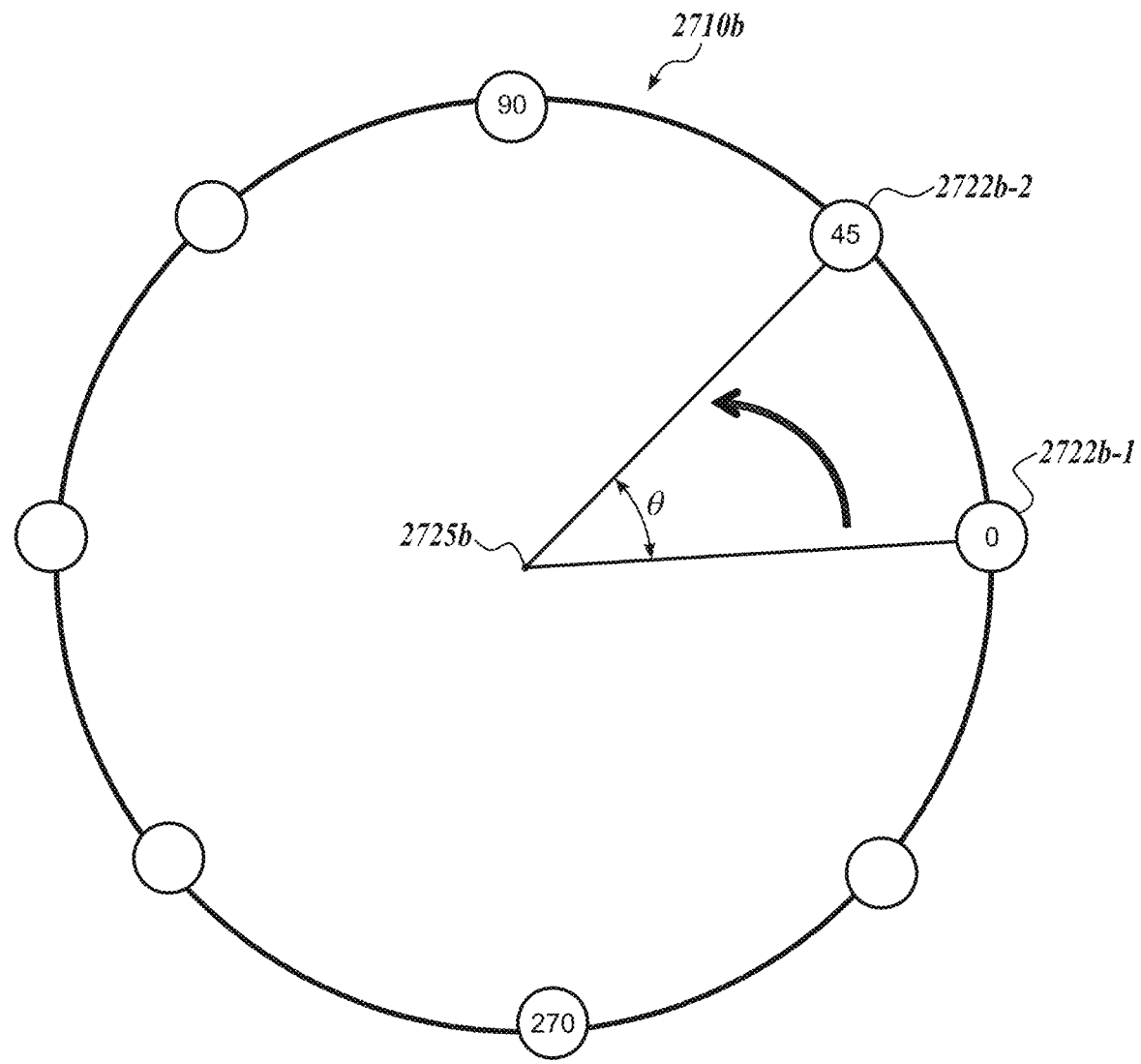

Referring to FIG. 27B, in a non-limiting example of progressive rotation for polarization purity, adjacent antenna elements 2722b-1 and 2722b-2 are rotated by a degree of angular rotation e, wherein e=45 degrees. In some embodiments, adjacent antenna elements in the progressive rotation may be electrically excited by e degrees electrical phase shift between each antenna element.

In the embodiments of FIGS. 27A and 27B, the antenna lattices 2710a and 2710b are arranged in circular patterns. However, the antenna lattices 2710a and 2710b need not be space tapered lattices.

Figure 28:
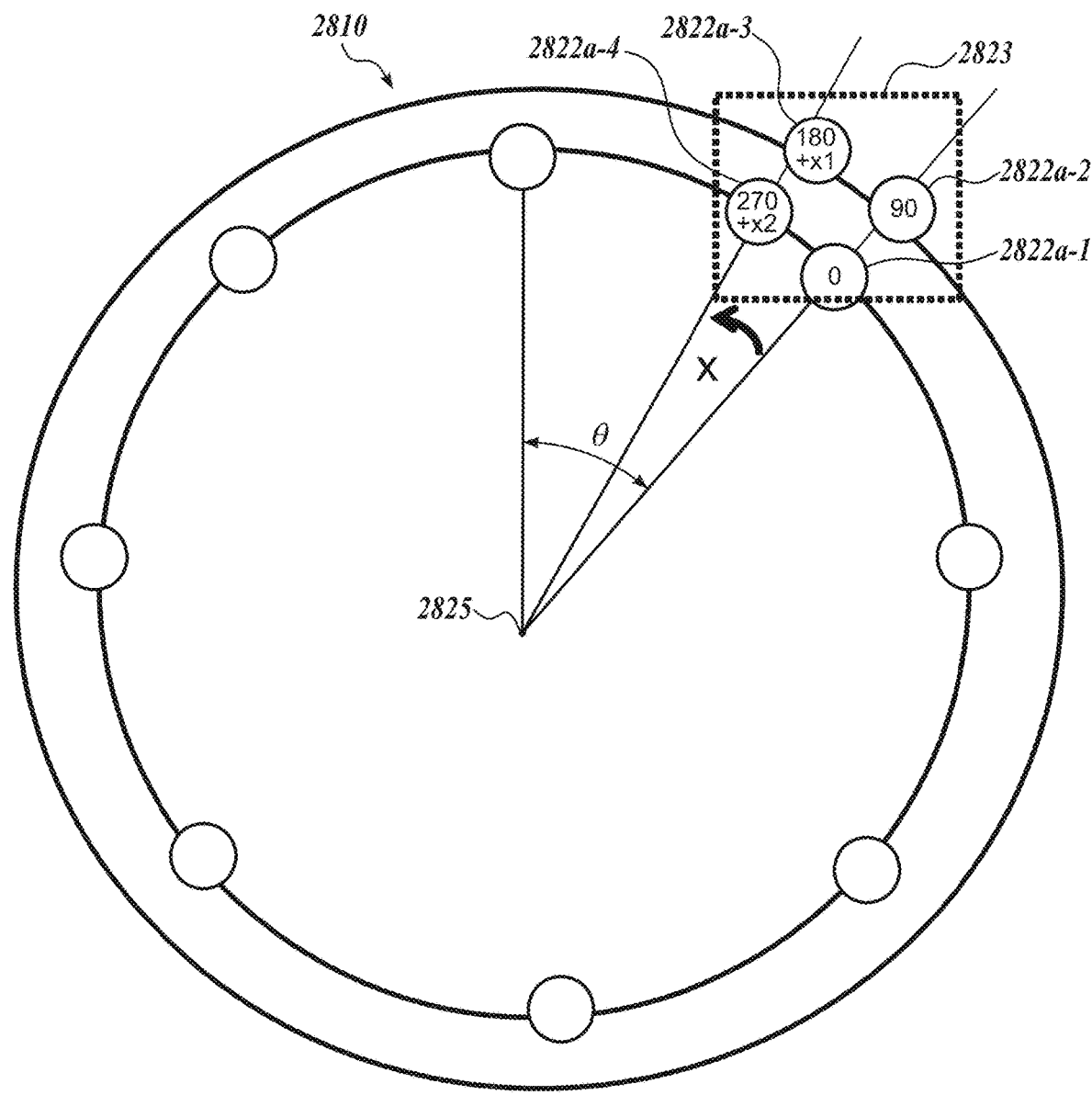
FIG. 28 is a schematic layout of an antenna lattice including an antenna rotation scheme for polarization purity in accordance with other embodiments of the present disclosure.

Referring to FIG. 28, an example of combination sequential and progressive rotation is provided. In the embodiment of FIG. 28, the antenna elements 2822 of the antenna lattice 2810 are grouped into sequential rotational groupings 2823 of four antenna elements 2822a-1, 2822a-2, 2822a-3, and 2822a-4 with two of the elements in an outer ring of the space taper lattice and two of the elements in an inner ring of the space taper lattice, defining a rectangular-shaped grouping. The antenna elements 2822a-1, 2822a-2, 2822a-3, and 2822a-4 are each physically rotated by 90 degrees relative to each other traveling in a circular pattern around the grouping, as per the sequential rotation scheme discussed above. Likewise, adjacent antenna elements 2822a-1, 2822a-2, 2822a 3, 2822a-4 in each sequential rotational grouping 2823 may be electrically excited by 90 degrees electrical phase shift between each antenna element.

In addition to sequential rotational groupings 2823, the groupings 2823 or antenna elements 2822 of the antenna lattice 2810 themselves are progressively rotated relative to each other for polarization purity. For example, other groupings adjacent grouping 2823 are each physically rotated by the same degree of angular rotation e relative to each other traveling in a circular pattern around the center axis 2825 of the antenna lattice 2810. Likewise, adjacent antenna elements in the progressive rotation may be electrically excited by e degrees electrical phase shift between each antenna element.

Antenna elements 2822a-1, 2822a-2, 2822a-3, 2822a-4 in each sequential rotational grouping 2823 may have rotational adjustment as a function of angular rotation offset x between adjacent antenna elements in a grouping. For example, the physical rotation of antenna elements 2822a-1, 2822a-2, 2822a-3, 2822a-4 would be 0, 90, 180, and 270 degrees, respectively, relative to each other based on sequential rotation scheme alone. With the addition of progressive rotation, antenna element 2822a-c is rotated a total of 180+x1 degrees rather than 180 degrees. The rotational adjustment of x1 degrees applies the progressive rotation between adjacent antenna elements within a given ring, in this case, between antenna elements 2822a-2 and 2822a-3. Likewise, antenna element 2822a-4 is rotated a total of 270+x2 degrees rather than 270 degrees. Values x1 and x2 are calculated based on the equation discussed above for progressive rotation.

Illustrative examples of the apparatuses, systems, and methods of various embodiments disclosed herein are provided below. An embodiment of the apparatus, system, or method may include any one or more, and any combination of, the examples described below.

Example 1 is an antenna module, which includes:
an antenna element having a first side and a second side opposite the first side, the first side comprising a radiating side of the antenna element;
a spacer structure disposed at the second side of the antenna element and configured to define a cavity, the spacer structure configured to be physically and electrically couplable with a printed circuit board (PCB) of a receiver or a transmitter; and
an amplifier located within the cavity.

Example 2 includes the subject matter of Example 1, and further comprising a first signal pathway configured to electrically couple the amplifier and the antenna element.

Example 3 includes the subject matter of any of Examples 1-2, and wherein the spacer structure includes a second signal pathway configured to electrically couple the amplifier and the PCB.

Example 4 includes the subject matter of any of Examples 1-3, and wherein one or both of at least a portion of the first or second signal pathways comprises a via.

Example 5 includes the subject matter of any of Examples 1-4, and wherein the spacer structure is configured to be physically coupled to a surface of the PCB, and wherein a first distance between the antenna element and the amplifier is smaller than a second distance between the antenna element and the surface of the PCB.

Example 6 includes the subject matter of any of Examples 1-5, and wherein the amplifier physically couples with the PCB.

Example 7 includes the subject matter of any of Examples 1-6, and wherein the cavity is defined by the spacer structure and the PCB.

Example 8 includes the subject matter of any of Examples 1-7, and wherein a side of the spacer structure furthest from the antenna element couples with the PCB.

Example 9 includes the subject matter of any of Examples 1-8, and wherein at least a portion of the spacer structure comprises a substantially annular shape defining the cavity and having a particular thickness.

Example 10 includes the subject matter of any of Examples 1-9, and wherein the thickness defines a height of the cavity.

Example 11 includes the subject matter of any of Examples 1-10, and wherein the substantially annular shaped portion of the spacer structure is configured for being physically coupled to the PCB.

Example 12 includes the subject matter of any of Examples 1-11, and wherein the amplifier comprises a power amplifier (PA) or a low noise amplifier (LNA).

Example 13 includes the subject matter of any of Examples 1-12, and wherein the antenna element comprises a dipole antenna, a patch antenna, a slot antenna, a microstrip antenna, or a uni-directional antenna.

Example 14 includes the subject matter of any of Examples 1-13, and further comprising a layer disposed between the antenna element and the amplifier.

Example 15 includes the subject matter of any of Examples 1-14, and wherein the layer has a third side adjacent to the second side of the antenna element and a fourth side opposite to the third side, and wherein the amplifier physically couples with the fourth side of the layer.

Example 16 includes the subject matter of any of Examples 1-15, and wherein the layer comprises one or more layers including one or more electronic components, radio frequency (RF) circuitry, electronic circuitry, passive electrical elements, or electrical conductive traces.

Example 17 includes the subject matter of any of Examples 1-16, and further comprising a via that extends through the layer and electrically couples the antenna element with the amplifier.

Example 18 includes the subject matter of any of Examples 1-17, and wherein a radio frequency (RF) transition loss between the antenna element and the amplifier is less than one decibel (dB) of an input power.

Example 19 is an apparatus, which includes:
a support structure having a first side and a second side opposite the first side, wherein the second side of the support structure is configured for being physically and electrically coupled with a printed circuit board (PCB) of a receiver or a transmitter, and wherein the first side of the support structure is configured to be spaced from the PCB by a first distance when the support structure is physically and electrically coupled to the PCB; and
an antenna element having a first side and a second side opposite the first side, wherein the first side comprises a radiating side of the antenna element, wherein the second side of the antenna element is disposed closer to the support structure than the first side of the antenna element, and wherein the second side of the antenna element is configured to be spaced from the surface of the PCB by a second distance when the support structure is physically and electrically coupled to the PCB.

Example 20 includes the subject matter of Example 19, and wherein the second distance is greater than or equal to the first distance.

Example 21 includes the subject matter of any of Examples 19-20, and wherein the support structure defines a space between the first side of the support structure and the surface of the PCB for locating one or more other components of the receiver or transmitter.

Example 22 includes the subject matter of any of Examples 19-21, and further comprising an amplifier and wherein the support structure defines a space between the first side of the support structure and the surface of the PCB for locating the amplifier electrically coupled to the antenna element.

Example 23 includes the subject matter of any of Examples 19-22, and further comprising a circuitry layer disposed between the antenna element and the support structure.

Example 24 includes the subject matter of any of Examples 19-23, and further comprising an amplifier physically coupled with the circuitry layer.

Example 25 includes the subject matter of any of Examples 19-24, and wherein electrical coupling between the amplifier and the PCB is defined within the circuitry layer and the support structure.

Example 26 includes the subject matter of any of Examples 19-25, and wherein the support structure includes a signal pathway internal to the support structure to electrically couple the amplifier to the PCB.

Example 27 includes the subject matter of any of Examples 19-26, and further comprising an amplifier and wherein the support structure is configured to electrically couple the amplifier to the PCB.

Example 28 is an antenna module, which includes:

an antenna element having a first side and a second side opposite the first side, the first side comprising a radiating side of the antenna element;

an amplifier disposed closer to the second side than the first side of the antenna element; and a spacer structure disposed closer to the second side than the first side of the antenna element, wherein the antenna module is selectively couplable or decouplable from a surface of a printed circuit board (PCB) of a receiver or a transmitter.

Example 29 includes the subject matter of Example 28, and wherein the spacer structure and the surface of the PCB define a space and the amplifier is located within the space.

Example 30 includes the subject matter of any of Examples 28-29, and further comprising a first signal pathway configured to electrically couple the amplifier and the antenna element.

Example 31 includes the subject matter of any of Examples 28-30, and wherein a radio frequency (RF) transition loss associated with the first signal pathway is less than one decibel (dB) of an input power.

Example 32 includes the subject matter of any of Examples 28-31, and wherein the first signal pathway between the antenna element and the amplifier is 0.5 millimeter (mm) or less.

Example 33 includes the subject matter of any of Examples 28-32, and wherein the spacer structure includes a second signal pathway configured to electrically couple the amplifier and the PCB.

Example 34 includes the subject matter of any of Examples 28-33, and further comprising a layer disposed between the antenna element and the amplifier.

Example 35 includes the subject matter of any of Examples 28-34, and wherein the layer has a third side adjacent to the second side of the antenna element and a fourth side opposite to the third side, and wherein the amplifier physically couples with the fourth side of the layer.

Example 36 includes the subject matter of any of Examples 28-35, and wherein the layer comprises one or more layers including one or more electronic components, radio frequency (RF) circuitry, electronic circuitry, passive electrical elements, or electrical conductive traces.

Example 37 includes the subject matter of any of Examples 28-36, and further comprising a via that extends through the layer and electrically couples the antenna element with the amplifier.

Example 38 includes the subject matter of any of Examples 28-37, and further comprising a second signal pathway between the amplifier and the PCB, wherein at least a first portion of the second signal pathway is included in the layer and a second portion of the second signal pathway is included in the spacer structure.

Example 39 includes the subject matter of any of Examples 28-38, and wherein the spacer structure includes a first via configured to electrically couple the amplifier with the PCB and a plurality of second vias.

Example 40 includes the subject matter of any of Examples 28-39, and wherein a first subset of the plurality of second vias electrically couple with respective chip pins of the amplifier.

Example 41 includes the subject matter of any of Examples 28-40, and wherein a second subset of the plurality of second vias is configured to reduce signal leakage or coupling to the antenna element.

Example 42 includes the subject matter of any of Examples 28-41, and wherein the second subset of the plurality of second vias is configured to extend through the spacer structure and is grounded at both ends of each via of the second subset.

Example 43 includes the subject matter of any of Examples 28-42, and wherein the plurality of second vias is distributed throughout near a perimeter of the spacer structure.

Example 44 includes the subject matter of any of Examples 28-43, and wherein the spacer structure further includes a plurality of third vias proximate to the first via and configured to electrically shield the first via.

Example 45 includes the subject matter of any of Examples 28-44, and wherein the plurality of second vias substantially encircle the first via.

Example 46 includes the subject matter of any of Examples 28-45, and wherein at least a portion of the spacer structure comprises substantially an annular shape having a particular thickness.

Example 47 includes the subject matter of any of Examples 28-46, and wherein the portion of the spacer structure that is the substantially annular shape is configured for being physically coupled to or decoupled from the PCB.

Example 48 is a method, which includes:

positioning an antenna module on a printed circuit board (PCB) of a receiver or a transmitter, wherein the antenna module includes an antenna element and a support structure configured to electrically couple with one or more other components of the receiver or transmitter; and physically and electrically coupling the antenna module with the PCB to form at least a portion of an antenna array of the receiver or transmitter.

Example 49 includes the subject matter of Example 48, and wherein physically and electrically coupling the antenna module to the PCB comprises physically and electrically coupling the support structure to the PCB.

Example 50 includes the subject matter of any of Examples 48-49, and wherein the antenna module further includes an amplifier and the amplifier is located within a space defined by the support structure and the PCB.

Example 51 includes the subject matter of any of Examples 48-50, and wherein positioning the antenna module on the PCB comprises arranging the antenna module at a particular location and orientation on the PCB in accordance with an antenna lattice configuration associated with the antenna array.

Example 52 includes the subject matter of any of Examples 48-51, and further comprising:

testing one or more operational characteristics of the antenna module physically and electrically coupled with the PCB; and determining whether the antenna module is defective based on testing the one or more operational characteristics of the antenna module.

Example 53 includes the subject matter of any of Examples 48-52, and further comprising:

if the antenna module is determined to be defective, then physically and electrically decoupling the antenna module from the PCB; and if the antenna module is determined not to be defective, then retaining the antenna module on the PCB.

Example 54 includes the subject matter of any of Examples 48-53, and wherein the antenna module comprises a first antenna module and further comprising:

positioning a second antenna module on the PCB at a different location from the first antenna module, wherein the second antenna module is the same as the first antenna module; and physically and electrically coupling the second antenna module with the PCB to form another portion of the antenna array of the receiver or transmitter.

Example 55 includes the subject matter of any of Examples 48-54, and wherein positioning the second antenna module on the PCB comprises orienting the second antenna module at a different physical rotation relative to the first antenna module.

Example 56 is an apparatus, which includes:

an antenna element having a first side and a second side opposite the first side, the first side configured to emit or receive radiation; and an amplifier electrically coupled to the antenna element, wherein a signal pathway length between the antenna element and the amplifier is 0.5 millimeter (mm) or less.

Example 57 includes the subject matter of Example 56, and wherein the antenna element and the amplifier are packaged together separate from other portions of a receiver or a transmitter, and wherein the apparatus is configured to be physically and electrically coupled with a printed circuit board (PCB) of the receiver or the transmitter.

Example 58 includes the subject matter of any of Examples 56-57, and further comprising a support structure packaged together with the antenna element and the amplifier, the support structure configured to be physically and electrically coupled with the PCB.

Example 59 includes the subject matter of any of Examples 56-58, and further comprising a support structure packaged together with the antenna element and the amplifier, the support structure including a via to electrically couple the amplifier with the PCB.

Example 60 includes the subject matter of any of Examples 56-59, and further comprising a support structure disposed at the second side of the antenna element, the support structure configured to define a space in which to locate the amplifier.

Example 61 includes the subject matter of any of Examples 56-60, and wherein a radio frequency (RF) transition loss between the antenna element and the amplifier is less than one decibel (dB) of an input power.

Example 62 includes the subject matter of any of Examples 56-61, and wherein a first distance between the antenna element and the amplifier is smaller than a second distance between the antenna element and a printed circuit board (PCB) of a receiver or a transmitter to which the apparatus is to physically and electrically couple.

Example 63 includes the subject matter of any of Examples 56-62, and wherein the antenna element includes a first conductive plate and a second conductive plate, the first conductive plate disposed closer to the first side than the second conductive plate, and wherein at least one of width or length of the first and second conductive plates is different from each other.

Example 64 includes the subject matter of any of Examples 56-63, and wherein the antenna element includes a first conductive plate and a second conductive plate, the first conductive plate disposed closer to the first side than the second conductive plate, and wherein the first conductive plate comprises a square shape with two opposing corners comprising chamfered corners.

Example 65 includes the subject matter of any of Examples 56-64, and wherein the antenna element includes a first conductive plate and a second conductive plate, the first conductive plate disposed closer to the first side than the second conductive plate, and wherein the first conductive plate includes a plurality of cutout slots, a first subset of the plurality of cutout slots identical to each other and a second subset of the plurality of cutout slots identical to each other.

Example 66 includes the subject matter of any of Examples 56-65, and wherein the plurality cutout slots comprise first, second, third, and fourth cutout slots located at respective first, second, third, and fourth quadrants of the first conductive plate.

Example 67 includes the subject matter of any of Examples 56-66, and wherein a first length of the first and third cutout slots is different from a second length of the third and fourth cutout slots.

Example 68 includes the subject matter of any of Examples 56-67, and wherein the antenna element includes a first conductive plate and a second conductive plate, the first conductive plate disposed closer to the first side than the second conductive plate, and the first and second conductive plates are parallel to each other, and further comprising first and second vias electrically coupled to the first conductive plate and disposed perpendicular between the first and second conductive plates, wherein the first and second vias are located at approximately opposing edges of the first conductive plate.

Example 69 includes the subject matter of any of Examples 56-68, and wherein the antenna element includes a first conductive plate and a second conductive plate, the first conductive plate disposed closer to the first side than the second conductive plate, and wherein the first conductive plate comprises a square shape, a rectangular shape, a circular shape, an elliptical shape, or a geometric shape.

Example 70 includes the subject matter of any of Examples 56-69, and wherein the antenna element includes a first conductive plate and a second conductive plate, the first conductive plate disposed closer to the first side than the second conductive plate, and wherein the first conductive plate includes one or more features or one or more structures extending perpendicular from a major plane of the first conductive plate toward the second conductive plate.

Example 71 includes the subject matter of any of Examples 56-70, and wherein the antenna element includes one or more structures associated with antenna matching, antenna miniaturization, or capacitive loading.

Example 72 includes the subject matter of any of Examples 56-71, and wherein the antenna element includes a first conductive plate, a second conductive plate, and a probe feed electrically coupled to an underside of the first conductive plate and disposed between the first and second conductive plates, wherein the probe feed includes third and fourth conductive plates, wherein the third and fourth conductive plates are parallel to each other and the first conductive plate, and wherein the third and fourth conductive plates have a gap between each other.

Example 73 includes the subject matter of any of Examples 56-72, and wherein the antenna element includes a first conductive plate, a second conductive plate, and a probe feed, wherein one end of the probe feed electrically couples to an underside of the first conductive plate and is disposed between the first and second conductive plates, and wherein the second conductive plate includes a circular shaped cutout at a location coincident or proximate to an opposite end of the probe feed.

Example 74 includes the subject matter of any of Examples 56-73, and wherein an increase in an effective physical antenna length of the antenna element is define in a major plane of a radiative plate of the antenna element.

Example 75 includes the subject matter of any of Examples 56-74, and wherein the increase in the effective physical antenna length of the antenna element is defined by the radiative plate comprising a conductive plate closest to the first side and having a plurality of slots that extends from an edge of the radiative plate in a radial direction toward a center of the radiative plate.

Example 76 includes the subject matter of any of Examples 56-75, and wherein the increase in the effective physical antenna length of the antenna element is defined by the antenna element further including a probe feed electrically coupled to an underside of the radiative plate and the radiative plate including a ring shaped cutout around the probe feed, and wherein the radiative plate comprises a conductive plate closest to the first side.

Example 77 includes the subject matter of any of Examples 56-76, and wherein an increase in an effective physical antenna length of the antenna element is defined in a direction perpendicular to a major plane of a radiative plate of the antenna element.

Example 78 includes the subject matter of any of Examples 56-77, and wherein the increase in the effective physical antenna length of the antenna element is defined by the antenna element further including a via and a conductive plate, the via disposed and electrically coupled between the radiative plate and the conductive plate.

Example 79 includes the subject matter of any of Examples 56-78, and wherein the antenna element comprises a dipole antenna, a patch antenna, a slot antenna, a micro-strip antenna, or a uni-directional antenna.

Example 80 is an antenna module, which includes:
an antenna element having a first side and a second side opposite the first side, the first side comprising a radiating side of the antenna element;
an amplifier electrically coupled to the antenna element; and
a spacer structure disposed at the second side of the antenna element, the spacer structure including a first portion that is to electrically couple the amplifier with a printed circuit board (PCB) of a receiver or a transmitter and a second portion configured to reduce signal leakage to the antenna element.

Example 81 includes the subject matter of Example 80, and wherein the spacer structure is further configured to define at least a portion of a cavity and the amplifier is located within the cavity.

Example 82 includes the subject matter of any of Examples 80-81, and further comprising a via configured to electrically couple the amplifier with the antenna element.

Example 83 includes the subject matter of any of Examples 80-82, and wherein a signal pathway length associated with the via is 0.5 millimeter (mm) or less.

Example 84 includes the subject matter of any of Examples 80-83, and wherein the first portion of the spacer structure comprises a via included inside the spacer structure.

Example 85 includes the subject matter of any of Examples 80-84, and comprising one or more layers disposed between the antenna element and the support structure, the one or more layers including circuitry that electrically couples the amplifier with the via.

Example 86 includes the subject matter of any of Examples 80-85, and wherein the circuitry comprises one or more of electronic components, radio frequency (RF) circuitry, electronic circuitry, passive electrical elements, or electrical conductive traces.

Example 87 includes the subject matter of any of Examples 80-86, and wherein the amplifier physically couples with the one or more layers.

Example 88 includes the subject matter of any of Examples 80-87, and wherein the spacer structure further includes a plurality of vias that electrically couple with respective chip pins of the amplifier.

Example 89 includes the subject matter of any of Examples 80-88, and wherein the second portion of the spacer structure comprises a plurality of vias included inside the spacer structure.

Example 90 includes the subject matter of any of Examples 80-89, and wherein the plurality of vias is configured to extend through the spacer structure and both ends of each via of the plurality of vias is grounded.

Example 91 includes the subject matter of any of Examples 80-90, and wherein the plurality of vias is distributed throughout near a perimeter of the spacer structure.

Example 92 includes the subject matter of any of Examples 80-91, and wherein the plurality of vias is located within approximately half of the spacer structure.

Example 93 includes the subject matter of any of Examples 80-92, and wherein the first portion comprises a first via and the plurality of vias comprises a plurality of second vias, and wherein the spacer structure further includes a plurality of third vias that are proximate to the first via and configured to provide electrical shielding to the first via.

Example 94 includes the subject matter of any of Examples 80-93, and wherein the plurality of third vias substantially encircle the first via.

Example 95 includes the subject matter of any of Examples 80-94, and wherein at least a portion of the spacer structure comprises substantially an annular shape having a particular thickness.

Example 96 includes the subject matter of any of Examples 80-95, and wherein the portion of the spacer structure that is the substantially annular shape is configured for being physically and electrically coupled to the PCB.

Example 97 includes the subject matter of any of Examples 80-96, and wherein the particular thickness is greater than a thickness of the amplifier.

Example 98 includes the subject matter of any of Examples 80-97, and wherein the antenna element comprises a dipole antenna, a patch antenna, a slot antenna, a micro-strip antenna, or a uni-directional antenna.

Example 99 includes the subject matter of any of Examples 80-98, and wherein a radio frequency (RF) transition loss associated with an electrical signal pathway between the antenna element and the amplifier is less than one decibel (dB) of an input power.

Example 100 is an apparatus, which includes:

an antenna element having a first side and a second side opposite the first side, the first side configured to emit or receive radiation, wherein the antenna element includes a first conductive plate and a second conductive plate, the first conductive plate disposed closer to the first side than the second conductive plate, and the first conductive plate different from the second conductive plate in one or both of shape or size;

an amplifier disposed at the second side of the antenna element; and a support structure disposed at the second side of the antenna element, wherein the support structure is to couple to a printed circuit board (PCB) of a receiver or a transmitter.

Example 101 includes the subject matter of Example 100, and wherein the antenna element and the amplifier are packaged together separate from other portions of the receiver or the transmitter, and wherein the support structure is configured to physically and electrically couple with the PCB.

Example 102 includes the subject matter of any of Examples 100-101, and wherein a signal pathway length between the antenna element and the amplifier is 0.5 millimeter (mm) or less.

Example 103 includes the subject matter of any of Examples 100-102, and wherein the support structure is configured to define a space and the amplifier is configured to be located within the space.

Example 104 includes the subject matter of any of Examples 100-103, and wherein a radio frequency (RF) transition loss between the antenna element and the amplifier is less than one decibel (dB) of an input power.

Example 105 includes the subject matter of any of Examples 100-104, and wherein a first distance between the antenna element and the amplifier is smaller than a second distance between the antenna element and the PCB.

Example 106 includes the subject matter of any of Examples 100-105, and wherein the antenna element comprises a dipole antenna, a patch antenna, a slot antenna, a micro-strip antenna, or a uni-directional antenna.

Example 107 includes the subject matter of any of Examples 100-106, and wherein at least one of width or length of the first and second conductive plates is different from each other.

Example 108 includes the subject matter of any of Examples 100-107, and wherein the first conductive plate comprises a square shape with two opposing corners comprising chamfered corners.

Example 109 includes the subject matter of any of Examples 100-108, and wherein the first conductive plate includes a plurality of cutout slots, a first subset of the plurality of cutout slots identical to each other and a second subset of the plurality of cutout slots identical to each other.

Example 110 includes the subject matter of any of Examples 100-109, and the plurality cutout slots comprise first, second, third, and fourth cutout slots located at respective first, second, third, and fourth quadrants of the first conductive plate.

Example 111 includes the subject matter of any of Examples 100-110, and wherein a first length of the first and third cutout slots is different from a second length of the third and fourth cutout slots.

Example 112 includes the subject matter of any of Examples 100-111, and wherein the first and second conductive plates are parallel to each other, and further comprising first and second vias electrically coupled to the first conductive plate and disposed perpendicular between the first and second conductive plates, wherein the first and second vias are located at approximately opposing edges of the first conductive plate.

Example 113 includes the subject matter of any of Examples 100-112, and wherein the first conductive plate comprises a square shape, a rectangular shape, a circular shape, an elliptical shape, or a geometric shape.

Example 114 includes the subject matter of any of Examples 100-113, and the first conductive plate includes one or more features or one or more structures extending perpendicular from a major plane of the first conductive plate toward the second conductive plate.

Example 115 includes the subject matter of any of Examples 100-114, and the antenna element includes one or more structures associated with antenna matching, antenna miniaturization, or capacitive loading.

Example 116 includes the subject matter of any of Examples 100-115, and wherein the antenna element further includes a probe feed electrically coupled to an underside of the first conductive plate and disposed between the first and second conductive plates, wherein the probe feed includes third and fourth conductive plates, wherein the third and fourth conductive plates are parallel to each other and the first conductive plate, and wherein the third and fourth conductive plates have a gap between each other.

Example 117 includes the subject matter of any of Examples 100-116, and wherein the antenna element further includes a probe feed, wherein one end of the probe feed electrically couples to an underside of the first conductive plate and is disposed between the first and second conductive plates, and wherein the second conductive plate includes a circular shaped cutout at a location coincident or proximate to an opposite end of the probe feed.

Example 118 includes the subject matter of any of Examples 100-117, and wherein an increase in an effective physical antenna length of the antenna element is defined in a major plane of the first conductive plate.

Example 119 includes the subject matter of any of Examples 100-118, and wherein the increase in the effective physical antenna length is defined by the first conductive plate including a plurality of slots that extends from an edge of the first conductive plate in a radial direction toward a center of the first conductive plate.

Example 120 includes the subject matter of any of Examples 100-119, and wherein the increase in the effective physical antenna length is defined by the antenna element further including a probe feed electrically coupled to an underside of the first conductive plate and the first conductive plate including a ring shaped cutout around the probe feed.

Example 121 includes the subject matter of any of Examples 100-120, and wherein an increase in an effective physical antenna length of the antenna element is defined in a direction perpendicular to a major plane of the first conductive plate.

Example 122 includes the subject matter of any of Examples 100-121, and wherein the increase in the effective physical antenna length is defined by the antenna element further including a via and a third conductive plate, the via disposed and electrically coupled between the first conductive plate and the third conductive plate.

Example 123 is a phased array antenna, which includes:
a plurality of antenna modules arranged in an antenna lattice configuration to form the phased array antenna, wherein at least some antenna modules of the plurality of antenna modules are physically rotated relative to other antenna modules of the plurality of antenna modules, and wherein an antenna module of the plurality of antenna modules includes an antenna element packaged together with an amplifier.

Example 124 includes the subject matter of Example 123, and wherein at least a portion of the antenna lattice configuration is a circular pattern defining a plurality of concentric circles of antenna modules.

Example 125 includes the subject matter of any of Examples 123-124, and wherein at least a portion of the antenna lattice configuration is a space tapered configuration.

Example 126 includes the subject matter of any of Examples 123-125, and wherein at least a portion of the antenna lattice configuration is a two-dimensional (2-D) array.

Example 127 includes the subject matter of any of Examples 123-126, and wherein a sub-set of the plurality of antenna modules in the antenna lattice configuration is grouped in a grouping, and wherein the antenna modules in the grouping are physically rotated relative to adjacent antenna modules in the grouping by a determined degree of rotation.

Example 128 includes the subject matter of any of Examples 123-127, and wherein the antenna modules in the grouping are electrically excited by an electrical phase shift equal to the respective determined degree of rotation.

Example 129 includes the subject matter of any of Examples 123-128, and wherein the grouping includes adjacent relationships between all of the antenna modules within a specific area, and wherein the determined degree of rotation between adjacent antenna modules is equal to 360 degrees divided by the number of antenna modules in the grouping.

Example 130 includes the subject matter of any of Examples 123-129, and wherein the grouping is a ring arrangement of antenna modules, and wherein the degree of rotation is equal to an angular distance between adjacent antenna modules in the ring arrangement.

Example 131 includes the subject matter of any of Examples 123-130, and wherein the grouping includes adjacent relationships between all of the antenna modules within a specific area, and wherein the determined degree of rotation between adjacent antenna modules is equal to 360 degrees divided by the number of antenna modules in the grouping, wherein the grouping is a ring arrangement of antenna modules with other groupings, and wherein the degree of rotation of the grouping is equal to an angular distance between adjacent groupings in the ring arrangement.

Example 132 includes the subject matter of any of Examples 123-131, and wherein the antenna module of the plurality of antenna modules further includes a support structure, the amplifier and the support structure disposed at a same side of the antenna element.

Example 133 is a method for arranging a plurality of antenna modules comprising a phased array antenna, which includes:
distributing the plurality of antenna modules in an antenna lattice configuration, an antenna module of the plurality of antenna modules including an antenna element, an amplifier, and a support structure;
orienting at least some antenna modules of the plurality of antenna modules distributed in the antenna lattice configuration to have a different physical angular orientation relative to other antenna modules of the plurality of antenna modules; and
connecting the plurality of antenna modules to a carrier.

Example 134 includes the subject matter of Example 133, and wherein distributing the plurality of antenna modules comprises distributing at least a portion of the plurality of antenna modules in a circular pattern defining a plurality of concentric circles of antenna modules.

Example 135 includes the subject matter of any of Examples 133-134, and wherein orienting at least some antenna modules comprises orienting a sub-set of the plurality of antenna modules in the antenna lattice configuration grouped as a grouping, wherein the antenna modules in the grouping are antenna modules adjacent to each other, and wherein the antenna modules in the grouping are physically rotated relative to adjacent antenna modules in the grouping by a determined degree of rotation.

Example 136 includes the subject matter of any of Examples 133-135, and further comprising applying signals to the antenna modules in the grouping, wherein the signals include an electrical phase shift associated with the respective determined degree of rotation.

Example 137 includes the subject matter of any of Examples 133-136, and wherein the determined degree of rotation comprises 360 degrees divided by the number of antenna modules in the grouping.

Example 138 includes the subject matter of any of Examples 133-137, and wherein the antenna modules in the grouping comprise antenna modules in at least two different circular patterns of a concentric circular arrangement of the antenna lattice configuration.

Example 139 includes the subject matter of any of Examples 133-138, and wherein the determined degree of rotation for at least some of the antenna modules in the grouping comprises 360 degrees divided by the number of antenna modules in the grouping plus 360 degrees divided by the number of antenna modules within a particular circular pattern in which the at least some of the antenna modules in the grouping are located.

Example 140 includes the subject matter of any of Examples 133-139, and wherein the antenna modules in the grouping comprises antenna modules in a particular circular pattern of a concentric circular arrangement of the antenna lattice configuration.

Example 141 includes the subject matter of any of Examples 133-140, and wherein connecting the plurality of antenna modules to the carrier comprises physically and electrically coupling each antenna module of the plurality of antenna modules to the carrier.

Example 142 includes the subject matter of any of Examples 133-141, and wherein connecting the plurality of antenna modules to the carrier comprises physically and electrically coupling the support structure of each antenna module of the plurality of antenna modules to the carrier.

Example 143 includes the subject matter of any of Examples 133-142, and wherein the carrier comprises one or more of a substrate, a baseboard, or a printed circuit board (PCB) of a receiver or a transmitter.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

The invention claimed is:

1. An antenna module comprising:
an antenna element having a first side and a second side opposite the first side, the first side comprising a radiating side of the antenna element;
a spacer structure disposed at the second side of the antenna element and configured to define a cavity, the spacer structure configured to be physically and electrically couplable with a printed circuit board (PCB) of a receiver or a transmitter;
an amplifier located within the cavity; and
a first signal pathway configured to electrically couple the amplifier and the antenna element, wherein the spacer structure includes a second signal pathway configured to electrically couple the amplifier and the PCB.

2. The antenna module of claim 1, wherein one or both of at least a portion of the first or second signal pathways comprises a via.

3. The antenna module of claim 1, wherein the spacer structure is configured to be physically coupled to a surface of the PCB, and wherein a first distance between the antenna element and the amplifier is smaller than a second distance between the antenna element and the surface of the PCB.

4. The antenna module of claim 1, wherein the cavity is defined by the spacer structure and the PCB.

5. The antenna module of claim 1, wherein a side of the spacer structure furthest from the antenna element couples with the PCB.

6. The antenna module of claim 1, wherein the amplifier comprises a power amplifier (PA) or a low noise amplifier (LNA).

7. The antenna module of claim 1, wherein the antenna element comprises a dipole antenna, a patch antenna, a slot antenna, a micro-strip antenna, or a uni-directional antenna.

8. The antenna module of claim 1, further comprising a layer disposed between the antenna element and the amplifier, and wherein the layer has a third side adjacent to the second side of the antenna element and a fourth side opposite to the third side, and wherein the amplifier physically couples with the fourth side of the layer.

9. The antenna module of claim 1, further comprising a layer disposed between the antenna element and the amplifier, and wherein the layer comprises one or more layers including one or more electronic components, radio frequency (RF) circuitry, electronic circuitry, passive electrical elements, or electrical conductive traces.

10. The antenna module of claim 1, further comprising a layer disposed between the antenna element and the amplifier, and further comprising a via that extends through the layer and electrically couples the antenna element with the amplifier.

11. The antenna module of claim 1, wherein a radio frequency (RF) transition loss between the antenna element and the amplifier is less than one decibel (dB) of an input power.

12. The antenna module of claim 1, wherein a signal pathway length of the first signal pathway is 0.5 millimeter (mm) or less.

13. An antenna module comprising:
an antenna element having a first side and a second side opposite the first side, the first side comprising a radiating side of the antenna element;
a spacer structure disposed at the second side of the antenna element and configured to define a cavity, the spacer structure configured to be physically and electrically couplable with a printed circuit board (PCB) of a receiver or a transmitter; and
an amplifier located within the cavity, wherein the amplifier physically couples with the PCB.

14. An antenna module comprising:
an antenna element having a first side and a second side opposite the first side, the first side comprising a radiating side of the antenna element;
a spacer structure disposed at the second side of the antenna element and configured to define a cavity, the spacer structure configured to be physically and electrically couplable with a printed circuit board (PCB) of a receiver or a transmitter, and wherein at least a portion of the spacer structure comprises a substantially annular shape defining the cavity and having a particular thickness; and
an amplifier located within the cavity.

15. The antenna module of claim 14, wherein the thickness defines a height of the cavity.

16. An apparatus comprising:
a support structure having a first side and a second side opposite the first side, wherein the second side of the support structure is configured for being physically and electrically coupled with a printed circuit board (PCB) of a receiver or a transmitter, and wherein the first side of the support structure is configured to be spaced from the PCB by a first distance when the support structure is physically and electrically coupled to the PCB;
an antenna element having a first side and a second side opposite the first side, wherein the first side comprises a radiating side of the antenna element, wherein the second side of the antenna element is disposed closer to the support structure than the first side of the antenna element, and wherein the second side of the antenna element is configured to be spaced from the surface of the PCB by a second distance when the support structure is physically and electrically coupled to the PCB;
a circuitry layer disposed between the antenna element and the support structure; and
an amplifier physically coupled with the circuitry layer, wherein electrical coupling between the amplifier and the PCB is defined within the circuitry layer and the support structure.

17. The apparatus of claim 16, wherein the second distance is greater than or equal to the first distance.

18. The apparatus of claim 16, wherein the support structure defines a space between the first side of the support structure and the surface of the PCB for locating one or more other components of the receiver or the transmitter.

19. The apparatus of claim 16, wherein the support structure defines a space between the first side of the support structure and the surface of the PCB for locating the amplifier electrically coupled to the antenna element.

20. An apparatus comprising:

a support structure having a first side and a second side opposite the first side, wherein the second side of the support structure is configured for being physically and electrically coupled with a printed circuit board (PCB) of a receiver or a transmitter, and wherein the first side of the support structure is configured to be spaced from the PCB by a first distance when the support structure is physically and electrically coupled to the PCB;

an antenna element having a first side and a second side opposite the first side, wherein the first side comprises a radiating side of the antenna element, wherein the second side of the antenna element is disposed closer to the support structure than the first side of the antenna element, and wherein the second side of the antenna element is configured to be spaced from the surface of the PCB by a second distance when the support structure is physically and electrically coupled to the PCB;

a circuitry layer disposed between the antenna element and the support structure; and an amplifier physically coupled with the circuitry layer, wherein the support structure includes a signal pathway internal to the support structure to electrically couple the amplifier to the PCB.

21. An antenna module comprising:

an antenna element having a first side and a second side opposite the first side, the first side comprising a radiating side of the antenna element;

an amplifier electrically coupled to the antenna element; and a spacer structure disposed at the second side of the antenna element, the spacer structure including a first portion that is to electrically couple the amplifier with a printed circuit board (PCB) of a receiver or a transmitter and a second portion configured to reduce signal leakage to the antenna element.

22. An apparatus comprising:

an antenna element having a first side and a second side opposite the first side, the first side configured to emit or receive radiation, wherein the antenna element includes a first conductive plate and a second conductive plate, the first conductive plate disposed closer to the first side than the second conductive plate, and the first conductive plate different from the second conductive plate in one or both of shape or size;

an amplifier disposed at the second side of the antenna element; and a support structure disposed at the second side of the antenna element, wherein the support structure is to couple to a printed circuit board (PCB) of a receiver or a transmitter.

* * * * *